US012525759B2

(12) United States Patent
Zuo

(10) Patent No.: US 12,525,759 B2
(45) Date of Patent: Jan. 13, 2026

(54) POWER ADAPTER

(71) Applicant: GUANGDONG OPPO MOBILE TELECOMMUNICATIONS CORP., LTD., Guangdong (CN)

(72) Inventor: Zhouquan Zuo, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 551 days.

(21) Appl. No.: 18/063,979

(22) Filed: Dec. 9, 2022

(65) Prior Publication Data

US 2023/0108383 A1  Apr. 6, 2023

Related U.S. Application Data

(63) Continuation of application No. PCT/CN2021/094148, filed on May 17, 2021.

(30) Foreign Application Priority Data

Jul. 2, 2020 (CN) .......................... 202010629011.1

(51) Int. Cl.
*H01R 31/06* (2006.01)
*H01R 13/502* (2006.01)
(Continued)

(52) U.S. Cl.
CPC ........... *H01R 31/06* (2013.01); *H01R 13/502* (2013.01); *H01R 13/701* (2013.01); *H01R 13/71* (2013.01); *H05K 7/1432* (2013.01); *H01R 31/065* (2013.01)

(58) Field of Classification Search
CPC .... H01R 31/06; H01R 13/502; H01R 13/701; H01R 13/71; H01R 31/065; H01R 13/60;
(Continued)

(56) References Cited

U.S. PATENT DOCUMENTS 9,831,622 B1 * 11/2017 Lin ..................... H01R 29/00
2002/0090848 A1 * 7/2002 Yu ..................... H01R 13/44
439/131
(Continued)

FOREIGN PATENT DOCUMENTS

CN     104393740 A    3/2015
CN     204391449 U    6/2015
(Continued)

OTHER PUBLICATIONS

Chinese First Office Action with English Translation for CN Application 202010629011.1, mailed Jun. 14, 2022. (22 pages).
(Continued)

*Primary Examiner* — Abdullah A Riyami
*Assistant Examiner* — Nader J Alhawamdeh
(74) *Attorney, Agent, or Firm* — Young Basile Hanlon & MacFarlane, P.C.

(57) ABSTRACT

A power adapter includes a housing, a holder, a moving part, and a prong. The housing defines an inner cavity and a through groove communicating with the inner cavity, and the holder is received in the inner cavity and provided with a boss fitting the through groove. The boss defines a receiving groove at a side away from the inner cavity. The moving part is movably connected to the holder and partially exposed to an outside of the housing. The prong is rotationally connected to the boss, and the prong is movable relative to the holder along with the moving part, so that the prong is flippable to extend out from or retract to the receiving groove.

19 Claims, 38 Drawing Sheets

(51) Int. Cl.
*H01R 13/70* (2006.01)
*H01R 13/71* (2006.01)
*H05K 7/14* (2006.01)

(58) Field of Classification Search
CPC .... H01R 13/04; H05K 7/1432; H05K 5/0247; H05K 5/0217
See application file for complete search history.

(56) References Cited

U.S. PATENT DOCUMENTS

| | | | | |
|---|---|---|---|---|
| 2007/0047182 | A1* | 3/2007 | Hassend | H01R 13/6675 361/600 |
| 2013/0288493 | A1 | 10/2013 | Shi et al. | |
| 2014/0080337 | A1* | 3/2014 | Lai | H01R 24/76 439/172 |
| 2014/0199871 | A1* | 7/2014 | Liu | H01R 31/065 439/312 |
| 2019/0207349 | A1* | 7/2019 | Yuan | H01R 13/631 |
| 2019/0288437 | A1 | 9/2019 | Hasan | |
| 2023/0108383 | A1* | 4/2023 | Zuo | H05K 5/0247 |

FOREIGN PATENT DOCUMENTS

| | | | |
|---|---|---|---|
| CN | 206098813 | U * | 4/2017 |
| CN | 206134996 | U | 4/2017 |
| CN | 207732480 | U | 8/2018 |
| CN | 208336648 | U | 1/2019 |
| CN | 107733247 | B | 12/2019 |
| CN | 210016034 | U * | 2/2020 |
| CN | 210074297 | U | 2/2020 |
| CN | 212571528 | U | 2/2021 |

OTHER PUBLICATIONS

International Search Report and Written Opinion with English Translation for PCT Application PCT/CN2021/094148 mailed Aug. 23, 2021. (22 pages).

Extended European search report issued in corresponding EP application No. 21832723.7 dated Oct. 4, 2023. (8 pages).

Chinese First Office Action with English translation issued in corresponding CN Application No. 202211566242.8 dated Jul. 24, 2025, 21 pages.

* cited by examiner

POWER ADAPTER

CROSS-REFERENCE TO RELATED APPLICATION(S)

This application is a continuation of International Application No. PCT/CN2021/094148, filed May 17, 2021, which claims priority to Chinese Patent Application No. 202010629011.1, filed Jul. 2, 2020, the entire disclosures of both of which are hereby incorporated by reference.

TECHNICAL FIELD

The present disclosure relates to the field of communication devices, and particularly to a power adapter.

BACKGROUND

At present, power adapters are provided with prongs that can be received, so that it is convenient to carry the power adapter. However, it is required for a user to touch the prongs to make the prongs extend out from or retract to the power adapter, i.e., pull the prongs out of a receiving groove of the power adapter, or press the prongs into the receiving groove of the power adapter, which is inconvenient to use the power adapter.

SUMMARY

Embodiments of the present disclosure provide a power adapter. The power adapter includes a housing, a holder, a moving part, and a prong. The housing defines an inner cavity and a through groove communicating with the inner cavity. The holder is received in the inner cavity and provided with a boss fitting the through groove. The boss defines a receiving groove at a side away from the inner cavity. The moving part is movably connected to the holder and partially exposed to an outside of the housing. The prong is rotationally connected to the boss. The prong is movable relative to the holder along with the moving part, so that the prong is flippable to extend out from or retract to the receiving groove.

Embodiments of the present disclosure provide a power adapter. The power adapter includes a holder, a button disposed on the holder, a prong flippably connected to the holder, and a driving assembly connecting the prong and the button. The button is slidable relative to the holder when the button is pressed, and the button is configured to release a driving torque of the driving assembly to the prong or restrict the driving torque of the driving assembly from being transmitted to the prong.

BRIEF DESCRIPTION OF DRAWINGS

In order to illustrate technical solutions in embodiments of the present disclosure more clearly, the following will give a brief introduction of accompanying drawings used in the embodiments. Apparently, the accompanying drawings described below merely illustrate some embodiments of the present disclosure. Those of ordinary skill in the art can further obtain other accompanying drawings based on the accompanying drawings without creative efforts.

DETAILED DESCRIPTION

Figure 1:
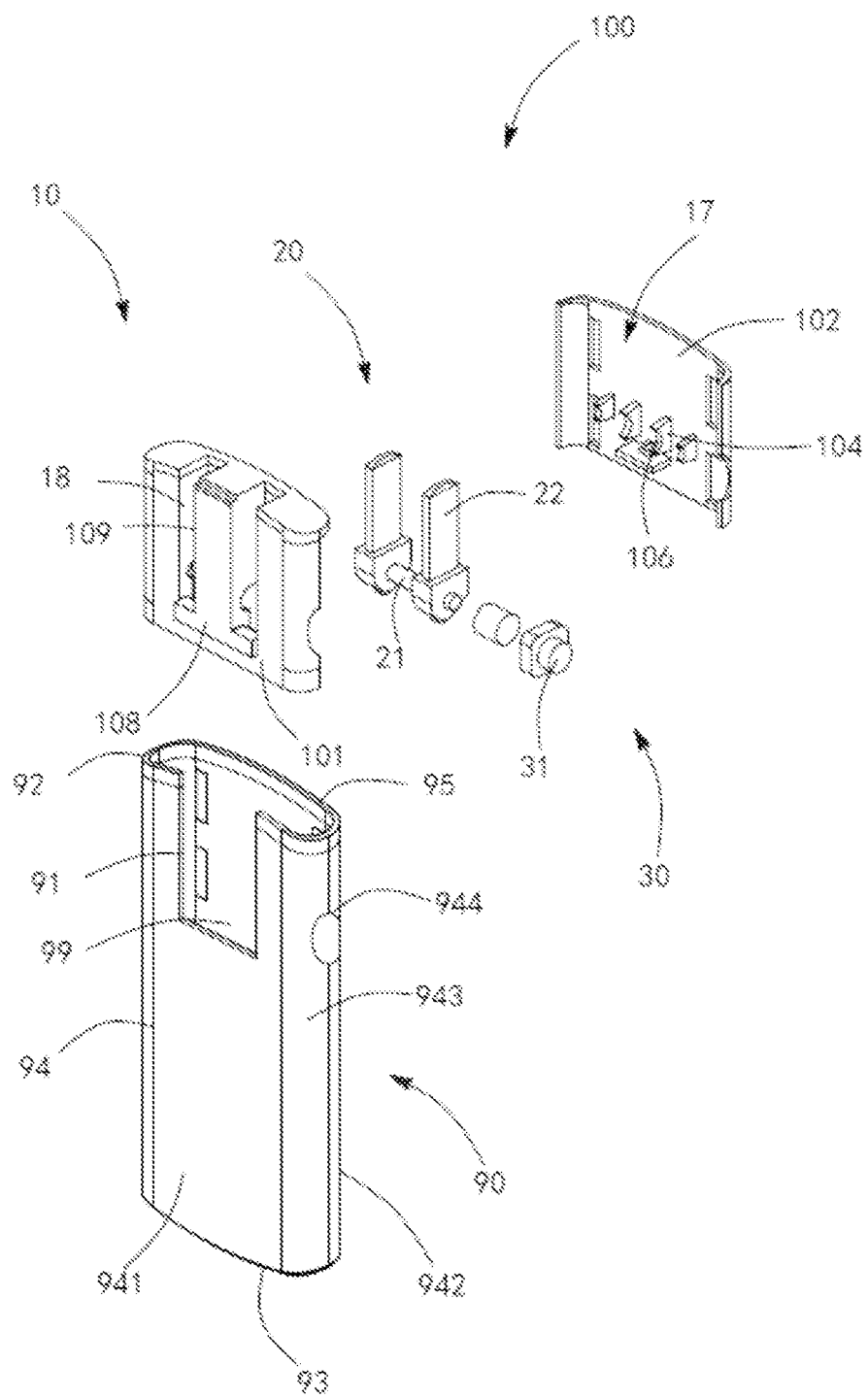
FIG. 1 is an exploded schematic view of a power adapter provided in embodiments of the present disclosure.

Technical solutions of embodiments of the present disclosure will be clearly and completely described below with reference to the accompanying drawings in the embodiments of the present disclosure.

A power adapter is provided in the embodiments. The power adapter includes a housing, a holder, a moving part, and a prong. The housing defines an inner cavity and a through groove communicating with the inner cavity, and the holder is received in the inner cavity and provided with a boss fitting the through groove. The boss defines a receiving groove at a side away from the inner cavity. The moving part is movably connected to the holder and partially exposed to an outside of the housing. The prong is rotationally connected to the boss, and the prong is movable relative to the holder along with the moving part, so that the prong is flippable to extend out from or retract to the receiving groove.

The receiving groove is implemented as two receiving grooves. The prong is provided with a rotating shaft and two pin posts fixed to the rotating shaft. The rotating shaft is rotationally connected to the holder and passes through the two receiving grooves. The two pin posts are flippable to extend out from or retract to the two receiving grooves, respectively.

The holder includes a first casing adjacent to the through groove and a second casing covered with the first casing. The boss is disposed at a side of the first casing away from the second casing. The rotating shaft is rotationally connected between the first casing and the second casing.

The first casing is provided with a bearing boss at a side of the first casing facing the second casing. The bearing boss corresponds to the receiving groove. The second casing is provided with a bearing protrusion at a side of the second casing facing the first casing. The bearing protrusion fits the bearing boss, and the rotating shaft is rotationally connected between the bearing boss and the bearing protrusion.

The power adapter further includes two prong elastic sheets. Each of the prong elastic sheets has an end correspondingly sandwiched between the bearing boss and the second casing, and the other end elastically abutting against an end of the pin post during flipping of the pin post relative to the holder.

The first casing further defines an elastic-sheet slot at a side of the first casing which is provided with the bearing boss. The prong elastic sheet is provided with a conductive leg snapped into the elastic-sheet slot. An end of the rotating shaft extends into the elastic-sheet slot and abuts against the conductive leg, so that the pin post and the conductive leg are kept in a conducting state via the rotating shaft.

The housing has two ends that are opposite to each other in a longitudinal direction of the housing and a peripheral portion between the two ends, and the through groove is defined on a position of the peripheral portion adjacent to one of the two ends.

The housing defines an insertion hole at an end of the housing adjacent to the through groove, the insertion hole communicates with the inner cavity and the through groove, the holder is inserted into the inner cavity through the insertion hole, and the boss fits the through groove and is limited by the through groove.

The abutting surface is flush with or exceeds an outer surface of the housing.

Extension of the prong is limited by a sidewall of the receiving groove, and retraction of the prong is limited by a bottom wall of the receiving groove.

The power adapter further includes a transmission part received in the inner cavity, where the transmission part is connected to the moving part and the prong to convert the motion torque of the moving part into a rotation torque and transmit the rotation torque to the prong, so that the prong is flippable relative to the housing.

The moving part is slidably connected to the holder, and the transmission part is configured to convert a linear sliding torque of the moving part into the rotation torque and transmit the rotation torque to the prong.

The moving part is provided with a sliding cover. The sliding cover covers the housing and is slidably arranged at a side of the housing away from the through groove, and the sliding cover penetrates the housing and is slidably connected to the holder.

The moving part is provided with a sliding button, and the sliding button is slidably connected to the holder and is slidably arranged at a side of the housing adjacent to the through groove.

The moving part is provided with a pressing cover, the pressing cover is slidably connected to the holder, and the pressing cover covers an end of the housing adjacent to the through groove and is pressable.

The transmission part is provided with a rack fixedly connected to the moving part, and a gear meshed with the rack and rotationally connected to the holder, and the gear is configured to transmit the rotation torque to the prong.

The transmission part is provided with multiple gears meshed in sequence, a gear at a head end is meshed with the rack, and a gear at a tail end is fixedly connected to the prong and is coaxially arranged with the rotating shaft of the prong.

The transmission part is provided with a push block and a rocker, where the push block is fixedly connected to the moving part, the rocker has an end rotationally and slidably fitting the push block, and an end of the rocker away from the push block is fixedly arranged with the rotating shaft of the prong to drive the prong to rotate.

The push block defines a rotating-shaft sliding groove, the rocker is provided with a slidable rotating shaft at an end of the rocker, and the slidable rotating shaft slidably and rotationally fits the rotating-shaft sliding groove.

The moving part is rotationally connected to the holder, and the transmission part is configured to transmit a rotation torque of the moving part to the prong, so that the prong is flippable relative to the holder.

The moving part is provided with a knob, the knob is rotationally connected to the holder, and the knob penetrates the housing and is located at a side of the housing adjacent to the through groove.

The transmission part is provided with multiple gears sequentially meshed, a gear at a head end is connected to the moving part to receive the rotation torque of the moving part, and a gear at a tail end is fixedly connected to the prong and is coaxially arranged with the rotating shaft of the prong.

The power adapter includes a first damping member disposed in the holder and a second damping member disposed on the prong, the transmission part, or the moving part, and the first damping member is configured to provide a damping force for hindering movement of the second damping member, so that flipping of the prong relative to the holder is hindered.

The first damping member is provided with multiple first convex teeth, each two adjacent first convex teeth define a damping recess therebetween, the second damping member is disposed on the rotating shaft of the prong, and the second damping member is provided with a second convex tooth capable of fitting against the damping recess.

An end of the first convex tooth or/and an end of the second convex tooth is in the shape of an arc curved surface.

The first damping member is provided with two elastic sheets opposite each other, the two elastic sheets define a clamping groove therebetween, the second damping member is disposed on the moving part, and the second damping member is provided with a projection to fit the clamping groove.

Each of the two elastic sheets is provided with a first arched portion, the first arched portions of the two elastic sheets define a clamping region therebetween, the projection is provided with two second arched portions respectively on two opposite sides of the projection, and the first damping member is configured to hinder movement of the second damping member when the second arched portions are moved to the clamping region.

The moving part is provided with a button, where the button penetrates the housing and is connected to the holder, the button is slidable relative to the holder when the button is pressed, and the prong is flippable to extend out from or retract to the receiving groove along with the button when the button is pressed.

The power adapter further includes a driving assembly connected to the button and the prong, where the button is configured to release a driving torque of the driving assembly to the prong when the button is in a pressed state, and to restrict the driving assembly from releasing the driving torque to the prong when the button is in a non-pressed state.

A power adapter is further provided in the embodiments. The power adapter includes a holder, a button arranged on the holder, a prong flippably connected to the holder, and a driving assembly connected to the prong and the button, where the button is slidable relative to the holder when the button is pressed, and the button is configured to release a driving force of the driving assembly to the prong or restrict the driving force of the driving assembly from being transmitted to the prong.

The driving assembly includes a limiting member and a driving member, the limiting member is connected to the prong and the driving member, the limiting member is unlocked from the button and configured to transmit a driving torque of the driving member to the prong when the button is in a pressed state, and the limiting member is locked with the button and configured to restrict the driving torque of the driving member from being transmitted to the prong when the button is in a non-pressed state.

The driving member is configured to release a rotation torque to the limiting member.

The limiting member is fixedly connected to the prong, and the limiting member is configured to receive the rotation torque of the driving member to drive the prong to rotate.

Rotation of the button is limited by the holder, so that rotation of the limiting member is limited when the limiting member is locked with the button.

The holder defines a button hole, the button hole defines a sliding guide slot on an inner peripheral sidewall of the button hole, and the button is provided with a sliding guide protrusion on an outer peripheral sidewall of the button, where the sliding guide protrusion slidably fits the sliding guide slot.

The limiting member is provided with a limiting protrusion on an outer peripheral sidewall at an end of the limiting member away from a transmission part, and the button defines an insertion hole at an end of the button adjacent to the limiting member, where the limiting member is slidably inserted into the insertion hole, the insertion hole is provided with a limiting slot on an inner peripheral sidewall of the insertion hole, and the limiting protrusion fits the limiting slot to limit rotation of the limiting member when the button is in the non-pressed state.

The driving member is provided with an elastic member, the elastic member is connected to the button and the limiting member, the elastic member is configured to store a rotation torque when the button is in the non-pressed state, and to release the rotation torque to the limiting member when the button is in the pressed state.

The elastic member is further configured to apply a sliding-reset torque to the button, so that the button is able to return to the non-pressed state after the button is pressed.

A power adapter is further provided in the embodiments. The power adapter includes a housing, a holder, a moving part, and a prong. The holder is received in the housing and defines a receiving groove for receiving the prong. The moving part is movably connected to the holder and partially exposed to an outside of the housing to receive a motion torque. The prong is rotationally connected to the holder, where the prong is movable relative to the holder along with the moving part, so that the prong is flippable to extend out from or retract to the receiving groove.

An electronic device assembly is further provided in the embodiments. The electronic device assembly includes the power adapter provided in the embodiments of the present disclosure. The electronic device assembly further includes an electronic device. The power adapter is electrically coupled with the electronic device and configured to charge the electronic device when the prong is plugged into a power socket.

The power adapter is provided with a charging end, and the charging end is configured for charging the electronic device in a wired or wireless manner.

Figure 2:
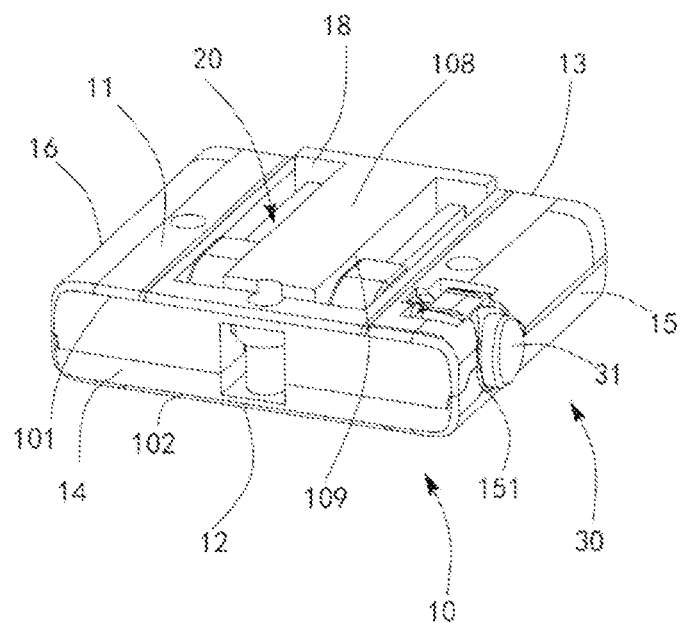
FIG. 2 is a partial schematic view of the power adapter illustrated in FIG. 1.
Figure 3:
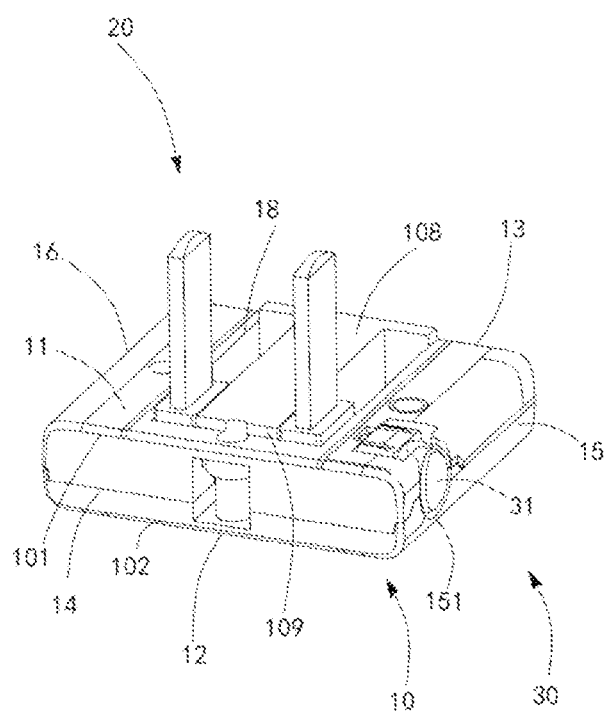
FIG. 3 is a partial schematic view illustrating another state of the power adapter illustrated in FIG. 1.

Referring to FIG. 1, FIG. 2, and FIG. 3, a power adapter 100 is provided in the present disclosure. The power adapter 100 includes a holder 10, a prong 20 rotationally connected to the holder 10, and a moving part 30 movably connected to the holder 10. The prong 20 is movable relative to the holder 10 along with the moving part 30, so that the prong 20 can be flipped to extend out from or retract to the holder 10. It can be understood that the prong 20 of the power adapter 100 can be inserted into a power socket, and thus the power adapter 100 can acquire electrical energy, thereby facilitating transfer of the electrical energy to an electronic device such as a mobile phone, a smart watch, a notebook computer, a tablet computer, or a smart headphone. The prong 20 of the power adapter 100 may be a prong of various standards such as Chinese standard, European standard, American standard, British standard, Australian standard, Japanese standard, or Korean standard.

The moving part 30 is disposed on the holder 10, and the prong 20 is rotationally connected to the holder 10, and thus when the moving part 30 is moved, the prong 20 can be flipped to extend out from or retracted to the holder 10 along with movement of the moving part 30, that is, the prong 20 can extend out from or retract to the holder 10 without being touched, and thus it is quick and easy, labor-saving, and safe to use the power adapter 100.

In the embodiments, the power adapter 100 further includes a housing 90. The holder 10 is fixed in the housing 90. The housing 90 is configured to stabilize and protect the holder 10 and increase the appearance performance of the power adapter 100. The housing 90 defines an inner cavity 99 and a through groove 91 communicating with the inner cavity 99. The prong 20 can be flipped to extend out from or retract to the housing 90 through the through groove 91. That is, the prong 20 is rotationally connected to the holder 10 at a position of the holder 10 directly facing the through groove 91. The moving part 30 penetrates the housing 90 and is movably connected to the holder 10. The moving part 30 is at least partially exposed to the outside of the housing 90, so that the moving part 30 can receive a user's manipulation force to move relative to the holder 10 and the housing 90.

The holder 10 is received in the inner cavity 99 and is provided with a boss 109 fitting the through groove 91. The boss 109 has an abutting surface 108 away from the inner cavity 99, and the boss 109 defines a receiving groove 18 on the abutting surface 108. When the prong 20 extends out from the holder 10 and the housing 90, an end of the prong 20 rotationally connected to the holder 10 is located in the receiving groove 18, and the other end of the prong 20 is located outside the receiving groove 18. When the prong 20 retracts to the housing 90 and the holder 10, the prong 20 is fully received in the receiving groove 18, so that the prong 20 is hidden and protected and the size of the power adapter 100 is reduced to facilitate portability. When the prong 20 extends out from the holder 10 and the housing 90, a portion of the prong 20 extending beyond the abutting surface 108 can be plugged into a power socket, and the abutting surface 108 abuts against the power socket to prevent the housing 90 from contacting the power socket. The housing 90 protects the holder 10. The housing 90 can also receive a circuit board electrically coupled with the prong 20, so that the power adapter 100 can receive and process current.

Optionally, the abutting surface 108 of the boss 109 is flush with a surface of the housing 90 to ensure that the appearance of the power adapter 100 is flat. A certain assembly step is allowed to exist between the abutting surface 108 and the surface of the housing 90. In order to ensure that the abutting surface 108, rather than the surface of the housing 90, always has priority to contact the power socket, the abutting surface 108 slightly exceeds the outer surface of the housing 90.

Optionally, the abutting surface 108 of the boss 109 exceeds the surface of the housing 90, that is, an end of the boss 109 exceeds the surface of the housing 90, so that when the prong 20 is plugged into the power socket, a certain gap always exists between the housing 90 and the power socket to ensure the safety of housing 90.

It can be understood that the power adapter 100 adopts the prong 20 that can be flipped to extend out from or retract to the power adapter 100. In order to ensure that the prong 20 can be flipped frequently, structural components rotationally connected to the prong 20 have relatively high requirements on fatigue resistance. The prong 20 needs to be plugged into the power socket for acquiring electric energy, so that the prong 20 is often faced with the situation of arc burning caused by a short circuit of a high-voltage circuit. Therefore, in order to ensure the safety of the power adapter 100, the structural components that carry the prong 20 have relatively high requirements on fireproofing and anti-burning. Obviously, in the embodiments of the present disclosure, the holder 10 carries the prong 20, and the holder 10 isolates the prong 20 from the housing 90. Compared with the housing 90, the holder 10 has better insulation protection performance, better abrasion and pressure resistance, and better fireproofing and anti-burning performance, thereby ensuring the safety of the power adapter 100 and increasing the service life of the power adapter 100. The prong 20 is rotationally connected to the holder 10, so that the housing 90 can be prevented from contacting the power socket, thereby avoiding scratches and damage to the housing 90, to ensure the appearance performance of the power adapter 100.

Specifically, the housing 90 has a first end 92, a second end 93 opposite the first end 92, and a peripheral portion 94 between the first end 92 and the second end 93. The through groove 91 is defined at a position of the peripheral portion 94 adjacent to the first end 92. The housing 90 defines an insertion hole 95 on the first end 92, where the insertion hole 95 communicates with the inner cavity 99 and the through groove 91. The holder 10 can be inserted into the inner cavity 99 through the insertion hole 95, and the boss 109 fits the through groove 91 and is limited by the through groove 91. It can be understood that an inner peripheral sidewall of the inner cavity 99 is in clearance fit with an outer peripheral sidewall of the holder 10, so that after the holder 10 is inserted into the inner cavity 99 through the insertion hole 95, the holder 10 can be stably located in the inner cavity 99. The through groove 91 has a resisting wall at an end of the through groove 91 away from the insertion hole 95, where the boss 109 is limited by the resisting wall, so that insertion of the holder 10 into the inner cavity 99 is limited to avoid excessive insertion of the holder 10 into the housing 90.

Optionally, the peripheral portion 94 has a front surface 941 and a rear surface 942 opposite the front surface 941, and a side surface 943 connected between the front surface 941 and the rear surface 942. The through groove 91 is defined on the front surface 941.

Figure 4:
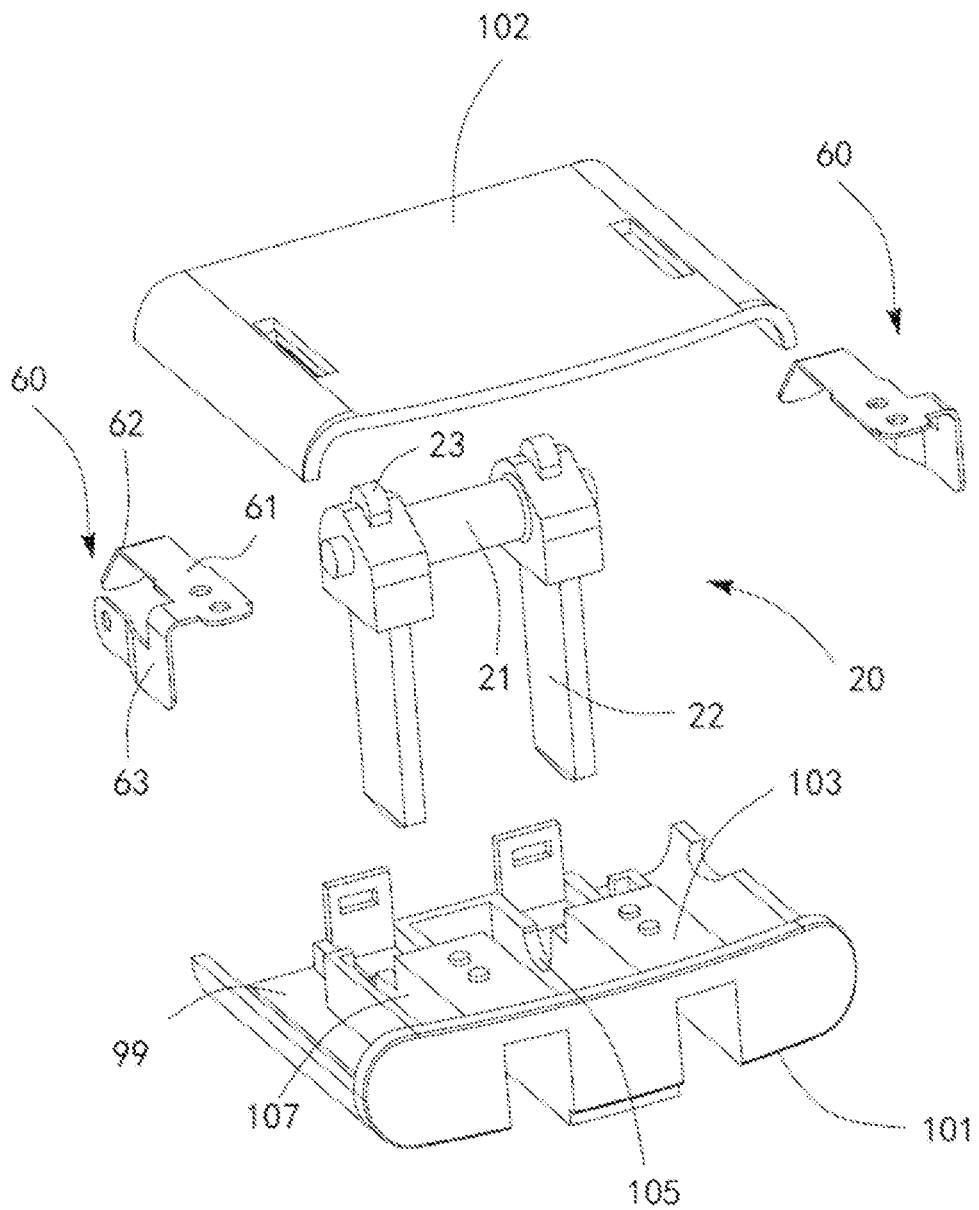
FIG. 4 is a partial exploded schematic view of the power adapter illustrated in FIG. 1.

Referring to FIG. 2, FIG. 3, and FIG. 4, in the embodiments, the holder 10 has a front surface 11, a rear surface 12 opposite the front surface 11, a first end surface 13 and a second end surface 14 that are connected between the front surface 11 and the rear surface 12 and opposite to each other, and a first side surface 15 and a second side surface 16 that are connected between the front surface 11 and the rear surface 12 and opposite to each other. The boss 109 is on the front surface 11 and adjacent to the first end surface 13. The prong 20 extends out from or retracts to the holder 10 from the front surface 11. The first end surface 13 and the second end surface 14 may be respectively located at front and rear ends of the holder 10, and the first side surface 15 and the second side surface 16 may be respectively located at left and right sides of the holder 10. When the holder 10 is fixed in the inner cavity 99, the first end surface 13 is adjacent to the first end 92 of the housing 90, and the second end surface 14 is received in the inner cavity 99.

In the embodiments, when the prong 20 extends out from the holder 10, the end of the prong 20 extends beyond the front surface 941. The prong 20 is provided with a metal conductor at the end of the prong 20, so that the prong 20 and a power supply electrode in the power socket can be in a conducting state, and the abutting surface 108 abuts against the power socket. When the prong 20 retracts to the holder 10, the prong 20 is received in the receiving groove 18, so that the entire power adapter 100 is in the shape of a rectangular block, and thus it is convenient for storing and carrying the power adapter 100, and the holder 10 can be used to effectively protect the prong 20, thereby ensuring security.

Specifically, the prong 20 is provided with a rotating shaft 21 and two pin posts 22 fixed on the rotating shaft 21. A longitudinal direction of the pin post 22 is perpendicular to a longitudinal direction of the rotating shaft 21. A central axis of the pin post 22 intersects with a central axis of the rotating shaft 21. The two pin posts 22 are arranged in parallel in an axial direction of the rotating shaft 21. The rotating shaft 21 is always located in the receiving groove 18. The rotating shaft 21 is in a position of the receiving groove 18 away from the first end surface 13, so that an end of the pin post 22 away from the rotating shaft 21 can be flipped to extend out from the receiving groove 18. When the prong 20 retracts to the holder 10, the prong 20 is limited by a bottom wall of the receiving groove 18, to avoid excessive retraction of the prong 20 to the holder 10. When the prong 20 extends out from the holder 10, the prong 20 is limited by a sidewall of the receiving groove 18 adjacent to the rotating shaft 21, so as to avoid excessive flipping of the prong 20 relative to the holder 10, and thus it is conducive to plugging the prong 20 into the power socket. The rotating shaft 21 may be provided with an insulator, and the insulator covers one end of the pin post 22. The two pin posts 22 are isolated via the rotating shaft 21 to avoid a short circuit between the two pin posts 22. The pin post 22 is a metal member, so that current can be acquired via the prong 20.

The boss 109 defines two opposite receiving grooves 18, the rotating shaft 21 passes through the two receiving grooves 18, and the two pin posts 22 can be flipped to extend out from or retract to the two receiving grooves 18, respectively. The two receiving grooves 18 are used to receive the two pin posts 22, respectively, so that the stability of the holder 10 is improved, and the two pin posts 22 can be effectively isolated to avoid a short circuit between the two pin posts 22. It can be understood that the pin post 22 can be flipped to extend out from the receiving groove 18, which means that the pin post 22 rotates relative to the holder 10 in a flipping manner, to enable the end of the pin post 22 to rotate out of the receiving groove 18, thereby facilitating plugging of the end of the pin post 22 into the power socket. The pin post 22 can be flipped to retract to the receiving groove 18, which means that the pin post 22 rotates relative to the holder 10 in a flipping manner, so that the entire pin post 22 is received in the receiving groove 18 for easy portability.

In the embodiments, the holder 10 defines a receiving cavity 17, and the receiving cavity 17 is used for receiving components such as a circuit board, a power chip, and a power transformer module. One end of the prong 20 rotationally connected to the holder 10 is partially received in the receiving cavity 17, so that the prong 20 can be electrically coupled with the components such as the circuit board, the power chip, and the power transformer module. Optionally, the holder 10 includes a first casing 101 and a second casing 102 covered with the first casing 101. The boss 109 is on a surface of the first casing 101 away from the second casing 102, and the rotating shaft 21 is rotationally connected between the first casing 101 and the second casing 102. The front surface 11 is the surface of the first casing 101 away from the second casing 102, and the rear surface 12 is a surface of the second casing 102 away from the first casing 101. The rotating shaft 21 is clamped by the first casing 101 and the second casing 102, so that the rotating shaft 21 can rotate smoothly and steadily relative to the holder 10.

Specifically, the first casing 101 is provided with a bearing boss 103 at a side of the first casing 101 facing the second casing 102, where the bearing boss 103 corresponds to the receiving groove 18, and the second casing 102 is provided with a bearing protrusion 104 at a side of the second casing 102 facing the first casing 101, where the bearing protrusion 104 fits the bearing boss 103. The bearing boss 103 defines a first U-shaped groove 105, and the bearing protrusion 104 defines a second U-shaped groove 106. The first U-shaped groove 105 and the second U-shaped groove 106 cooperatively carry the rotating shaft 21 of the prong 20, so that the prong 20 can be flipped relative to the holder 10. The first U-shaped groove 105 communicates with the receiving cavity 17 and the receiving groove 18. The bearing boss 103 defines two first U-shaped grooves 105 respectively on two opposite side walls of the bearing boss 103, so that the rotating shaft 21 can pass through the receiving groove 18 through the first U-shaped groove 105, and the pin post 22 is fixed to a portion of the rotating shaft 21 passing through the receiving groove 105. The second casing 102 is provided with four bearing protrusions 104 corresponding to four second U-shaped grooves 106, so as to improve the structural stability of the rotating shaft 21 relative to the holder 10, ensure smooth rotation of the rotating shaft 21 relative to the holder 10, and effectively isolate the two pin posts 22.

In the embodiments, the power adapter 100 further includes two prong elastic sheets 60, where one prong elastic sheet 60 is electrically coupled with one pin post 22, and the other prong elastic sheet 60 is electrically coupled with the other pin post 22. The pin post 22 is provided with a conductive contact end 23 away from the rotating shaft 21. When the prong 20 is flipped relative to the holder 10 to extend out from the holder 10, the conductive contact end 23 elastically abuts against the prong elastic sheet 60. When the prong 20 is flipped relative to the holder 10 to retract to the holder 10, the conductive contact end 23 is separated from the prong elastic sheet 60.

Specifically, the prong elastic sheet 60 includes a fixing end 61 and a curved end 62. The fixing end 61 is correspondingly clamped between an end of the bearing boss 103 and an inner wall of the second casing 102. The curved end 62 is opposite to the pin post 22 of the prong 20. The curved end 62 curves along a curve. The curved end 62 has elastic deformation properties. When the prong 20 is flipped to extend out from the holder 10, the conductive contact end 23 is rotated to contact the curved end 62, so that the curved end 62 is deformed, and the curved end 62 exerts an elastic resisting force against the conductive contact end 23, and thus the pin post 22 is in close contact with the prong elastic sheet 60 to enable that there is a damping force during flipping of the pin post 22, that is, there is a damping force during flipping of the prong 20 relative to the holder 10, thereby reducing an impact force on the holder 10 caused by flipping of the prong 20 relative to the holder 10. When the prong 20 is flipped to retract to the holder 10, the conductive contact end 23 is rotated to be separated from the curved end 62, and the curved end 62 returns to a natural extended state.

More specifically, the first casing 101 further defines an elastic-sheet slot 107 at one side of the bearing boss 103, the prong elastic sheet 60 is provided with a conductive leg 63 that is snapped into the elastic-sheet slot 107, and one end of the rotating shaft 21 extends into the elastic-sheet slot 107 and abuts against the conductive leg 63, so that the pin post 22 and the conductive leg 63 are in a conducting state via the rotating shaft 21. The rotating shaft 21 is provided with axis conductors respectively in contact with the two pin posts 22. An end of the axis conductor extends into the elastic-sheet slot 107 and contacts the conductive leg 63. A portion of each of the two axis conductors of the rotating shaft 21 that is connected to the pin post 22 is wrapped by insulators to avoid a short circuit. The elastic-sheet slot 107 stabilizes the conductive leg 63, so that the prong elastic sheet 60 can be kept in effective contact with the prong 20 after the prong 20 is flipped relative to the holder 10 more than 10 times, which improves the stability of the prong elastic sheet 60 and effective conduction between the prong elastic sheet 60 and the prong 20, thereby increasing the service life of the power adapter 100.

In the embodiments, referring to FIG. 1, FIG. 2, and FIG. 3, the moving part 30 may be movably arranged on the holder 10. The moving part 30 may be disposed on the rear surface 12, the first side surface 15, the second side surface 16, the first end surface 13, or the second end surface 14. The moving part 30 can move linearly on the holder 10, or can rotate on the holder 10, or can move on the holder 10 in a manner including a linear motion and a rotation motion. The moving part 30 can be moved in response to a user's manual actuation force. The moving part 30 is spaced apart from the receiving groove 18 to prevent the moving part 30 from approaching the prong 20, so that the user can operate the moving part 30 at a position of the holder 10 away from the prong 20 to make the prong 20 extend out from or retract to the holder 10, thereby ensuring safety.

Figure 5:
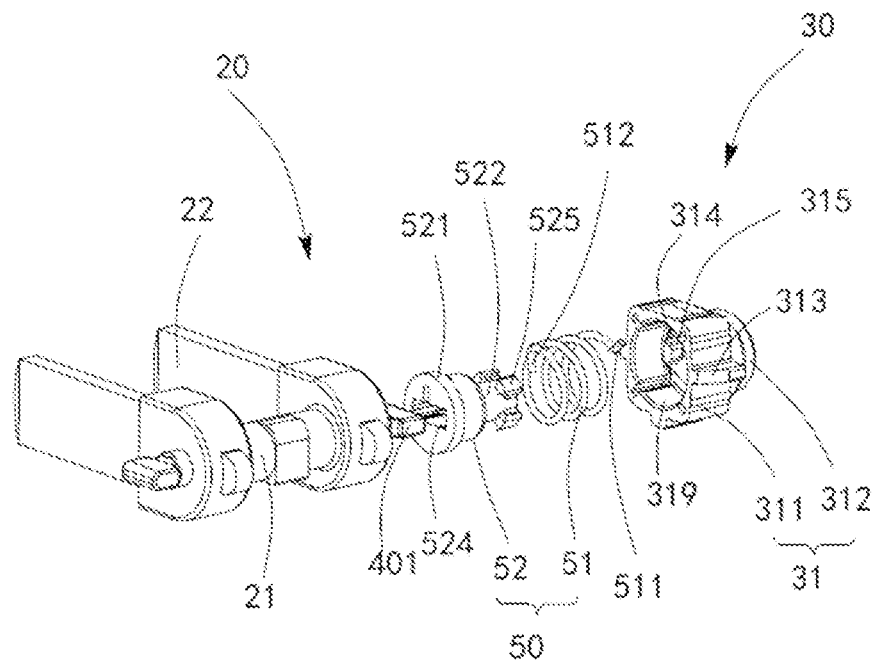
FIG. 5 is a partial exploded schematic view of the power adapter illustrated in FIG. 1.

In an embodiment, referring to FIG. 2, FIG. 3, and FIG. 5, the moving part 30 is provided with a button 31. The button 31 is disposed on the holder 10, and when the button 31 is pressed, the button 31 is slidable. The button 31 is located outside the receiving groove 18. The button 31 can serve as a motion switch trigger button for locking or unlocking the prong 20. For example, when the button 31 is in a non-pressed state, part of the button 31 extends beyond an outer surface of the holder 10, the prong 20 is in a locked state, the prong 20 remains stationary relative to the holder 10, and the prong 20 is limited to a state of retracting to the holder 10. When the button 31 is in a pressed state, the button 31 retracts to the holder 10, the prong 20 is in an unlocked state, and the prong 20 is triggered to receive a driving force, so that the prong 20 is flipped relative to the holder 10. The prong 20 can receive a driving force from a driving member 51 in the receiving cavity 17. The driving member 51 may be any component capable of outputting a driving force. For example, the prong 20 can receive an elastic force from a spring, a magnetic force from a magnet, or air pressure from a piston.

Figure 8:
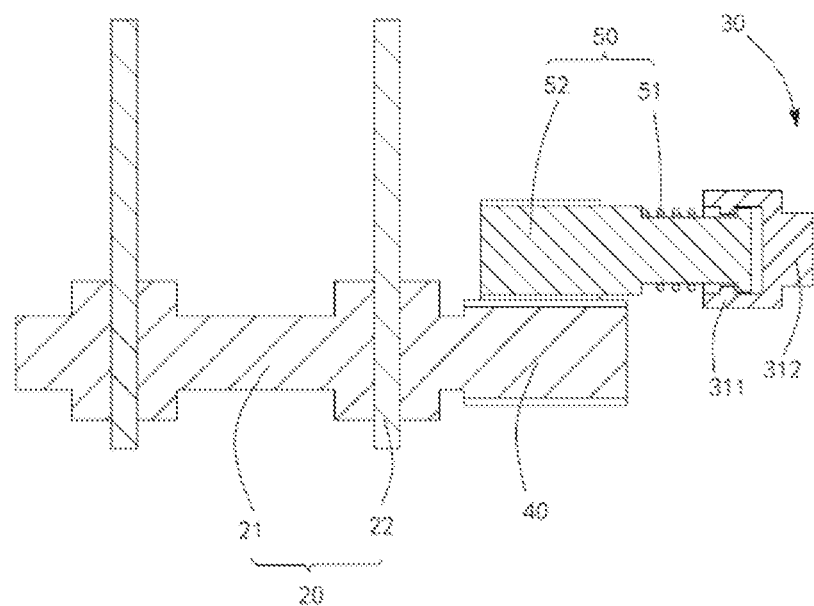
FIG. 8 is a partial sectional schematic view of a power adapter provided in embodiments of the present disclosure.

It can be understood that, after the prong 20 is flipped relative to the holder 10 to extend out from the holder 10, a force can be applied to the prong 20 to enable that the prong 20 is flipped relative to the holder 10 to retract to the holder 10, and a flipping torque of the prong 20 can be returned to the driving member 51, so that the driving member 51 stores energy, and finally the button 31 is reset to a state of extending beyond the holder 10, and the prong 20 and a transmission part 40 (as illustrated in FIG. 8) are locked together again.

In the embodiment, the button 31 is disposed on the first side surface 15 or the second side surface 16 of the holder 10. A linear sliding direction of the button 31 is substantially perpendicular to the first side surface 15 or the second side surface 16. Specifically, for example, the button 31 penetrates the first side surface 15 of the holder 10. The holder 10 defines a button hole 151 on the first side surface 15. The button hole 151 is formed by splicing a first half-hole defined on an edge of the first casing 101 and a second half-hole defined on an edge of the second casing 102. The button 31 is installed in the button hole 151. When the button 31 is in the pressed state, the button 31 retracts to the button hole 151. When the button 31 is in the non-pressed state, an end of the button 31 extends out from the button hole 151 to present a state where the button 31 partially extends beyond the holder 10, which is convenient to press the button 31. The housing 90 correspondingly defines a button external-hole 944 on a peripheral portion 94 for the button 31 to pass through, so that the button 31 partially extends beyond the housing 90, which is convenient for the button 31 to receive a pressing force.

In the embodiment, the button 31 includes a button base 311 and a button cap 312 arranged on the button base 311. The button base 311 slidably fits the button hole 151. The button cap 312 is used for receiving a pressing force. When the button cap 312 receives a pressing force, the button cap 312 is located in the button hole 151, and the button base 311 can trigger the prong 20 to receive a driving torque of the driving member 51, so that the prong 20 is unlocked and starts to rotate. When the button cap 312 receives no pressing force, the button base 311 can drive the button cap 312 to return to a state of extending beyond the holder 10, and the button base 311 can lock the rotating shaft 21 of the prong 20 again to limit movement of the transmission part 40 and the rotating shaft 21 of the prong 20.

Figure 6:
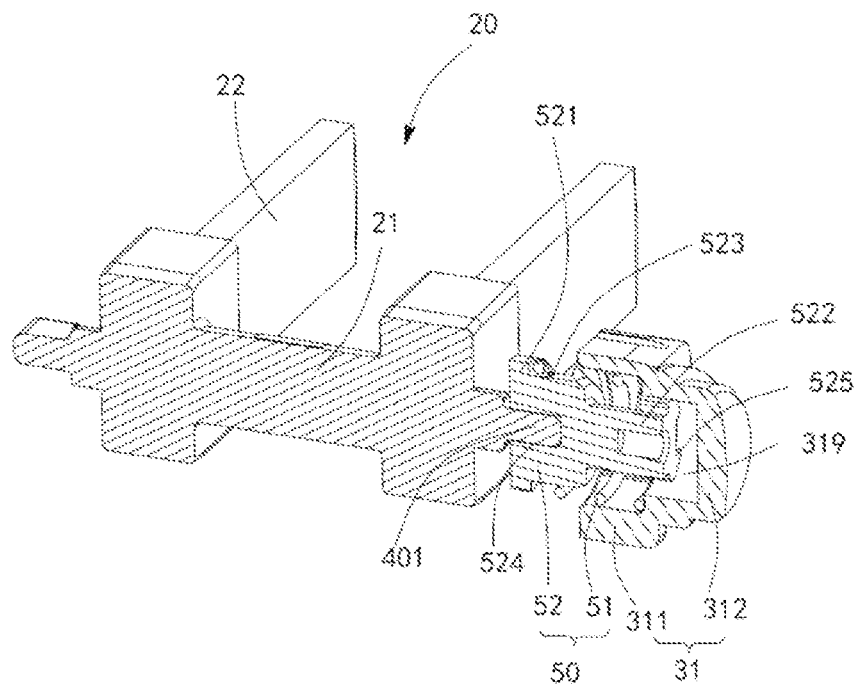
FIG. 6 is a partial sectional schematic view of the power adapter illustrated in FIG. 1.
Figure 7:
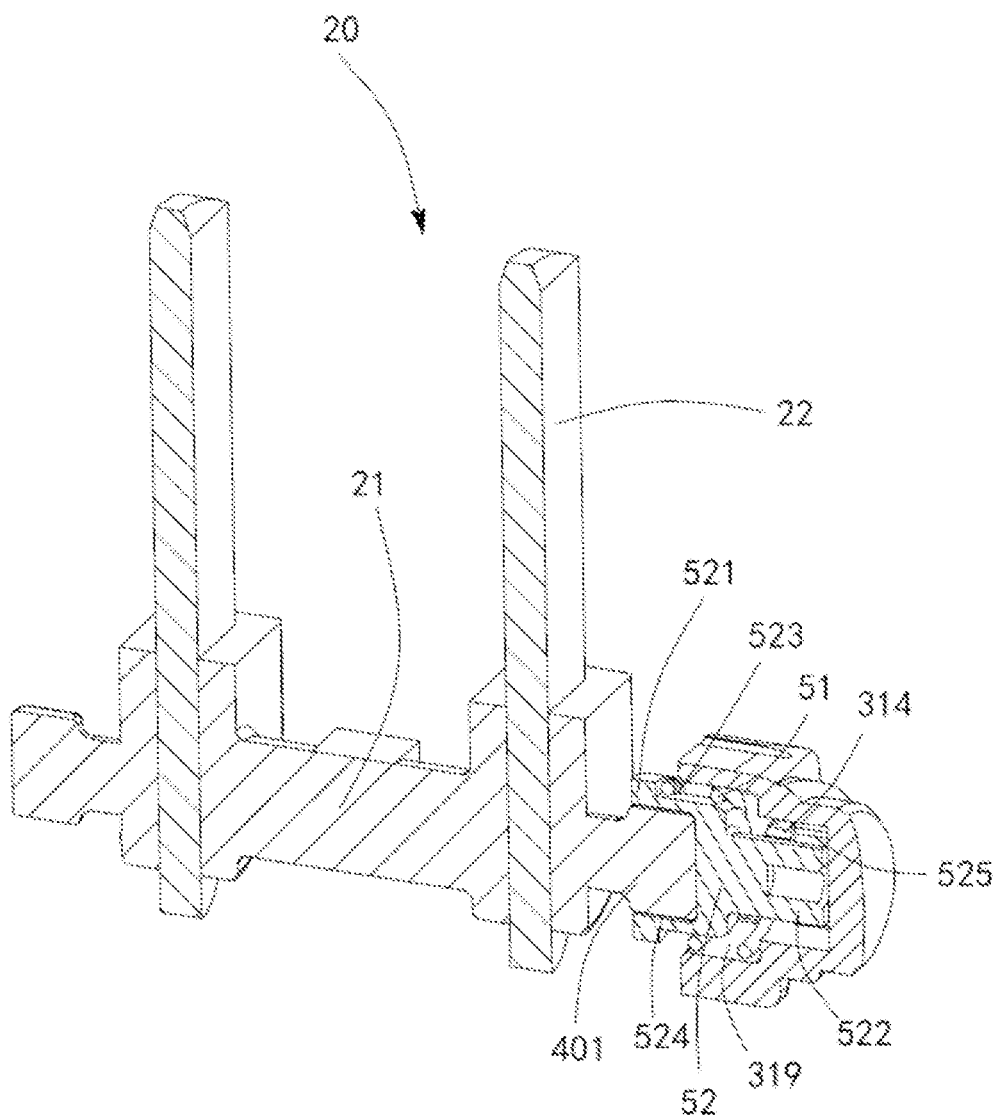
FIG. 7 is a partial sectional schematic view illustrating another state of the power adapter illustrated in FIG. 1.

In an embodiment, referring to FIG. 5, FIG. 6, and FIG. 7, the button base 311 is provided with a sliding guide protrusion 313 on an outer peripheral sidewall of the button base 311, and the button hole 151 defines a sliding guide slot on an inner peripheral sidewall of the button hole 151, where the sliding guide protrusion 313 slidably fits the sliding guide slot. The sliding guide protrusion 313 slidably fits the sliding guide slot, so that the button base 311 can slide smoothly in the button hole 151, thereby improving the controllability of that the button 31 is slidable when the button 31 is pressed. Certainly, in other embodiments, the button base 311 may define the sliding guide slot on the outer peripheral sidewall of the button base 311, and the button hole 151 may be provided with the sliding guide protrusion 313 on the inner peripheral sidewall of the button hole 151, where the sliding guide protrusion 313 slidably fits the sliding guide slot. The sliding guide protrusion 313 slidably fits the sliding guide slot, so that the button base 311 can slide smoothly in the button hole 151.

Optionally, the button base 311 is in the shape of a rectangular block, and the button base 311 is provided with two sliding guide protrusions 313 respectively on two opposite sides of the button base 311.

Optionally, the button cap 312 is in the shape of a circular post, so that it is convenient to press the button 31, and the comfort of pressing the button 31 can be improved.

Optionally, a linear sliding direction of the button 31 is parallel to an axial direction of the rotating shaft 21, so that the button 31 is non-rotatable relative to the holder 10, and the rotation of the rotating shaft 21 is limited.

Certainly, in other embodiments, the button hole 151 can also be defined on the rear surface 12, the first end surface 13, or the second end surface 14, that is, the button 31 can be pressed on the rear surface 12 of the holder 10, pressed on the first end surface 13, or pressed on the second end surface 14.

In the embodiment, the power adapter 100 further includes a driving assembly 50 connecting the button 31 and the prong 20. When the button 31 is in the pressed state, the button 31 releases a driving torque of the driving assembly 50 to the rotating shaft 21 of the prong 20. When the button 31 is in the non-pressed state, the button 31 restricts the driving assembly 50 from releasing the driving torque to the rotating shaft 21 of the prong 20. The driving assembly 50 can release a rotation torque to the rotating shaft 21, or can release a linear sliding torque to the rotating shaft 21, or can release a combined torque of a rotation torque and a linear torque to the rotating shaft 21. It can be understood that when the button 31 is in the pressed state, the button 31 is unlocked from part of the driving assembly 50 to lift a state in which the driving assembly 50 is restricted. When the button 31 is in the non-pressed state, part of the driving assembly 50 is locked with the button 31 to maintain the state in which the driving assembly 50 is restricted.

Specifically, the driving assembly 50 includes a limiting member 52 and a driving member 51. The limiting member 52 is connected to the rotating shaft 21 and the driving member 51. When the button 31 is in the non-pressed state, the limiting member 52 is locked with the button 31, and restricts a driving torque of the driving member 51 from being transmitted to the rotating shaft 21. When the button 31 is in the pressed state, the limiting member 52 is unlocked from the button 31, and transmits the driving torque of the driving member 51 to the rotating shaft 21.

It can be understood that the limiting member 52 is connected to the rotating shaft 21, so that when the limiting member 52 moves, the rotating shaft 21 also moves, and when the limiting member 52 is stationary, the rotating shaft 21 is also stationary. The limiting member 52 can drive the rotating shaft 21 to rotate when the limiting member 52 is unlocked from the button 31. When the limiting member 52 is locked with the button 31, movement of the rotating shaft 21 can be limited by the limiting member 52, so that the rotating shaft 21 remains stationary relative to the holder 10.

Specifically, the limiting member 52 includes a first connection end 521 and a second connection end 522 opposite the first connection end 521. The first connection end 521 is connected to the rotating shaft 21 of the prong 20. The second connection end 522 can be locked with or unlocked from the button base 311. The limiting member 52 is further provided with a driving-force receiving portion 523 for receiving the driving torque of the driving member 51, so that the limiting member 52 can transmit the driving torque to the rotating shaft 21. The driving-force receiving portion 523 may be disposed on the first connection end 521 or the second connection end 522, or may be disposed between the first connection end 521 and the second connection end 522.

In the embodiment, the driving member 51 can release the rotation torque to the limiting member 52. The first connection end 521 of the limiting member 52 can transmit the rotation torque to the rotating shaft 21, so that the prong 20 is flipped relative to the holder 10 to extend out from the holder 10.

In an embodiment, the first connection end 521 is fixedly connected to an end of the rotating shaft 21, so that the limiting member 52 and the rotating shaft 21 rotate synchronously, and thus the rotation torque of the limiting member 52 can be effectively transmitted to the rotating shaft 21, avoiding idling of the limiting member 52, thereby ensuring that the prong 20 can be flipped effectively.

Optionally, the first connection end 521 defines a slot 524, and the rotating shaft 21 is provided with a snap-fitting plate 401 at an end of the rotating shaft 21, where the snap-fitting plate 401 is inserted into the slot 524 to realize a fixed connection between the first connection end 521 and the rotating shaft 21. The snap-fitting plate 401 is disposed at an end of the rotating shaft 21 away from the pin post 22. Certainly, the transmission part 40 can also be fixedly connected to the rotating shaft 21 via inserting, screwing, or welding.

It can be understood that the sliding guide protrusion 313 of the button base 311 fits the sliding guide slot of the button hole 151, so that rotation of the button 31 is limited by the holder 10, and the button 31 cannot rotate relative to the holder 10. When the second connection end 522 of the limiting member 52 is locked with the button 31, rotation of the limiting member 52 is limited by the button 31, that is, when the limiting member 52 is connected with the driving member 51, due to limitation provided by the button 31, the rotation torque of the driving member 51 cannot be released via the limiting member 52, that is, the limiting member 52 is locked with the button 31, and rotation of the transmission part 40 and the prong 20 are limited.

In another embodiment, as illustrated in FIG. 8, the limiting member 52 can transmit the driving torque to the rotating shaft 21 via the transmission part 40, that is, the limiting member 52 is indirectly connected to the rotating shaft 21. For example, the first connection end 521 and transmission part 40 are geared to transmit the rotation torque. The first connection end 521 is provided with a gear, the transmission part 40 is provided with a gear or a gear set, and the transmission part 40 is meshed with the first connection end 521. When the limiting member 52 receives the rotation torque of the driving member 51, the first connection end 521 transmits the rotation torque to the transmission part 40 via gear-to-gear meshing. The transmission part 40 is provided with a gear coaxial with and fixed with the rotating shaft 21, so that the transmission part 40 can transmit the rotation torque to the rotating shaft 21, and finally the limiting member 52 in an unlocked state can transmit the rotation torque to the prong 20, so that the prong 20 can be flipped relative to the holder 10 to extend out from the holder 10.

Figure 9:
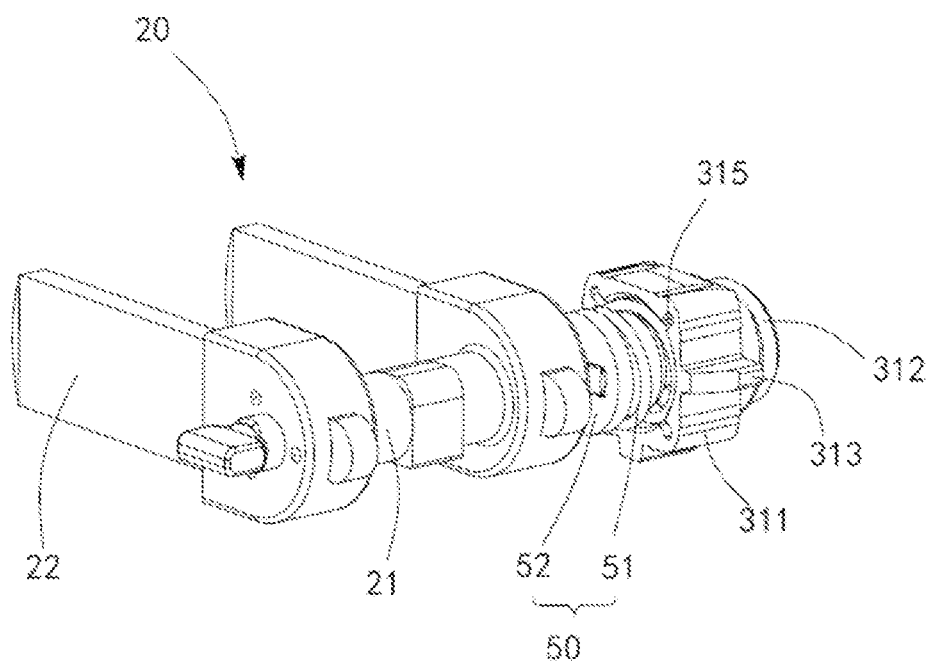
FIG. 9 is a partial perspective schematic view of the power adapter illustrated in FIG. 1.

In the embodiment, referring to FIG. 6, FIG. 7, and FIG. 9, the limiting member 52 is locked with the button 31 in a snap-fitting manner. Specifically, the button base 311 defines an insertion hole 319 on an end surface of the button base 311 away from the button cap 312, where the insertion hole 319 extends toward the button cap 312. The second connection end 522 is inserted into the insertion hole 319 and slidably fits the insertion hole 319, so that the button 31 can be pressed. The second connection end 522 is provided with a limiting protrusion 525 on an outer peripheral sidewall of the second connection end 522, and the insertion hole 319 defines a limiting slot 314 on an inner peripheral sidewall of the insertion hole 319, where the limiting protrusion 525 can fit the limiting slot 314. When the button 31 is in the non-pressed state, the limiting protrusion 525 fits the limiting slot 314 to restrict the limiting member 52 from rotating relative to the button 31. At this point, the button 31 cannot rotate relative to the holder 10, that is, the limiting member 52 cannot rotate relative to the holder 10. The transmission part 40 is fixed with the limiting member 52, so that the transmission part 40 is limited by the button 31 and thus cannot rotate relative to the holder 10, that is, the rotating shaft 21 of the prong 20 is also limited by the button 31 and thus cannot rotate relative to the holder 10, and the prong 20 remains in a state of retracting to the receiving groove 18. When the button 31 is in the pressed state, the limiting protrusion 525 slides relative to the limiting slot 314 to a staggered state, and then the limiting member 52 is unlocked from the button 31, so that rotation of the limiting member 52 is not limited by the button 31, and the driving energy of the driving member 51 can be released via the limiting member 52, that is, the limiting member 52 rotates relative to the holder 10 under the driving force of the driving member 51, the limiting member 52 drives the transmission part 40 and the rotating shaft 21 to rotate, and finally drives the prong 20 to flip to extend out from the holder 10. Certainly, in other embodiments, the limiting member 52 can also be locked with the button 31 by magnetic attraction. For example, the second connection end 522 is provided with a magnet, and the button base 311 is provided with a magnet, where the magnet on the second connection end 522 and the magnet on the button base 311 mutually magnetically attract each other. When the button 31 is in the non-pressed state, the second connection end 522 and the button base 311 are magnetically attracted, so that the limiting member 52 is fixed relative to the button 31, that is, the limiting member 52 is locked with button 31. When the button 31 is in the pressed state, the second connection end 522 and the button base 311 are separated from each other due to that the magnetic attraction force is less than a pressing force, so that the limiting member 52 is unlocked from the button 31.

Optionally, the limiting member 52 may be provided with multiple limiting protrusions 525 at the second connection end 522 of the limiting member 52, where the multiple limiting protrusions 525 are arranged around a central axis of the limiting member 52. The multiple limiting protrusions 525 are symmetrically arranged around the central axis of the limiting member 52. The button 31 defines multiple limiting slots 314 correspondingly, and the limiting slots 314 are symmetrically arranged around a central axis of the button 31.

Optionally, the central axis of the button 31, the central axis of the limiting member 52, the central axis of the transmission part 40, and the central axis of the rotating shaft 21 are arranged coaxially.

It can be understood that, when the driving member 51 drives the limiting member 52 to drive the transmission part 40 and the rotating shaft 21 to rotate, the limiting protrusion 525 of the limiting member 52 is closer to the bottom of the insertion hole 319 than the limiting slot 314. At this point, the limiting slot 314 and the limiting protrusion 525 are staggered, and the button 31 cannot be reset due to blocking of the limiting protrusion 525. The prong 20 is rotated manually to enable the prong 20 to retract to the receiving groove 18, and then the rotating shaft 21 of the prong 20 drives the limiting member 52 to rotate via the transmission part 40, so that the limiting protrusion 525 is rotated to be aligned with the limiting slot 314, and accordingly the limiting protrusion 525 slides again to a position where the limiting protrusion 525 fits the limiting slot 314, and the button 31 is reset, so that the button 31 can be pressed next time. During manually pressing the prong 20 to retract to the receiving groove 18, the rotation torque of the prong 20 is transmitted to the driving member 51 via the transmission part 40 and the limiting member 52, so that the driving member 51 can store driving energy again, where the driving energy will be released in response to next pressing of the button 31.

Figure 10:
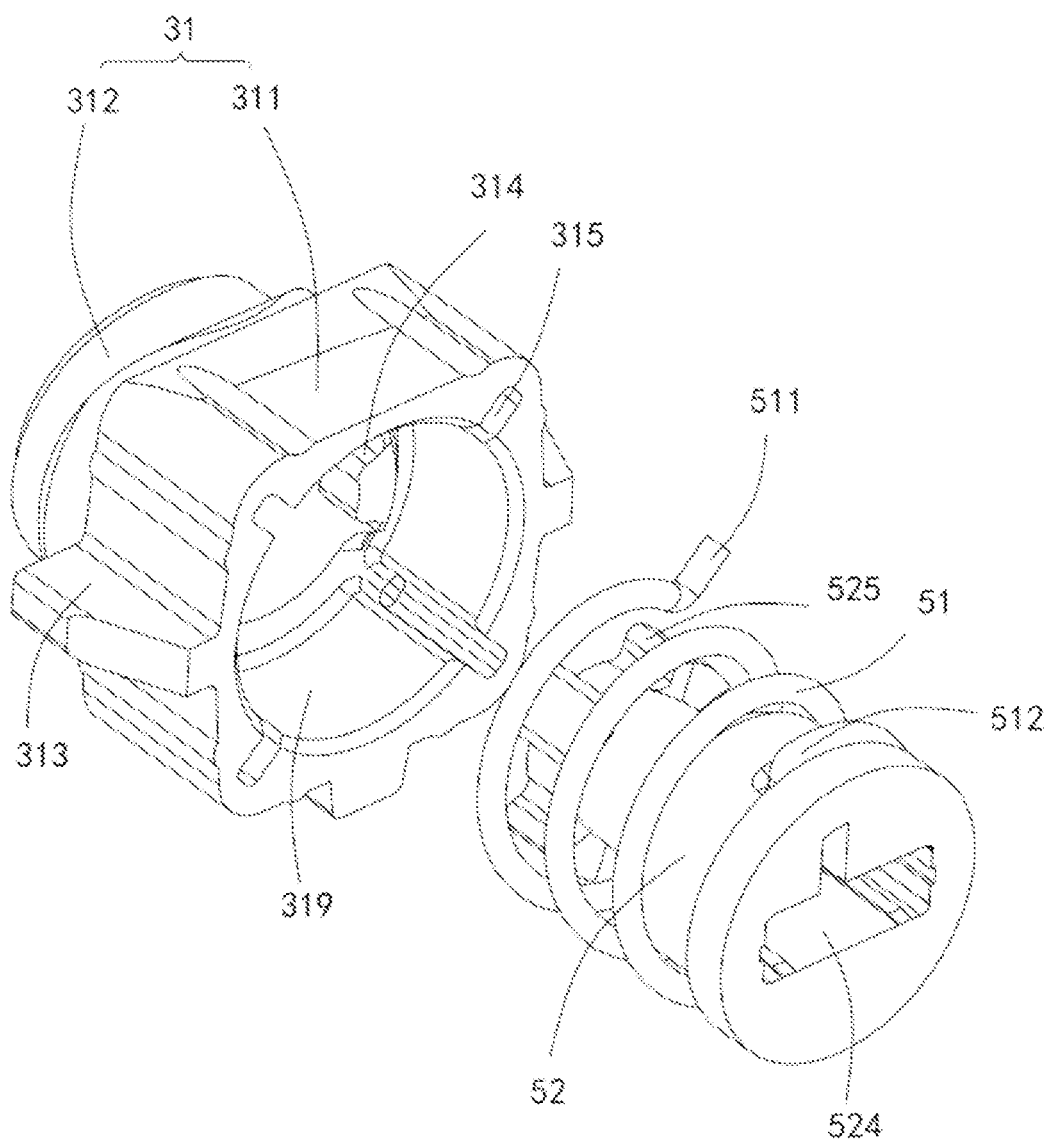
FIG. 10 is a partial exploded schematic view of the power adapter illustrated in FIG. 1.

In the embodiment, referring to FIG. 6, FIG. 7, and FIG. 10, the driving member 51 is provided with an elastic member, and the elastic member is connected to the button 31 and the limiting member 52. When the button 31 is in the non-pressed state, the elastic member can store the rotation torque, and when the button 31 is in the pressed state, the elastic member releases the rotation torque to the limiting member 52. One end of the elastic member is fixedly connected to the button 31, and the other end of the elastic member is fixedly connected to the limiting member 52. The elastic member is provided with a curved arm twisted along a curve between two ends of the elastic member. When the limiting protrusion 525 fits the limiting slot 314, the curved arm of the elastic member between the two ends of the elastic member is in a pre-compressed deformation state, that is, the elastic member stores elastic torsional driving energy. By pressing the button 31, the limiting protrusion 525 slides relative to the limiting slot 314 to a disengaged state, and the curved arm between the two ends of the elastic member begins to restore to a natural stretched state, that is, the two ends of the elastic member open relatively in a plane perpendicular to a sliding direction of the button 31, so that the elastic member releases the rotation torque to drive the limiting protrusion 525 to rotate relative to the button 31 and the holder 10, thereby finally enabling the prong 20 to flip relative to the holder 10 to extend out from the holder 10. When the prong 20 is manually pressed to retract to the receiving groove 18, the prong 20 drives the limiting member 52 to rotate relative to the button 31 via the transmission part 40, so that the two ends of the elastic member move relatively close to each other on the plane perpendicular to the sliding direction of the button 31, and the curved arm between the two ends of the elastic member is compressed again to deform to a pre-compressed deformation state, enabling the elastic member to store torsional driving energy.

In the embodiment, the elastic member further provides a sliding-reset torque to the button 31, so that the button 31 can return to the non-pressed state after being pressed. The curved arm of the elastic member between the two ends of the elastic member extends along a helical curve. During pressing the button 31 to make the button 31 slide relative to the limiting member 52, the two ends of the elastic member are compressed in the sliding direction of the button 31, that is, the elastic member stores a linear sliding torque. When the limiting protrusion 525 is aligned with the limiting slot 314 and the limiting protrusion 525 slidably fits the limiting slot 314, the two ends of the elastic member open relatively in the sliding direction of the button 31, that is, the elastic member releases the linear sliding torque to the button 31, so that the button 31 returns to the non-pressed state. It can be understood that the elastic member is a rectangular spring. The elastic member can store or release the rotation torque at the two ends of the elastic member as the button 31 and the limiting member 52 rotate relatively, and also store or release the linear sliding torque at the two ends of the elastic member as the button 31 and the limiting member 52 slide relatively, that is, one elastic member can store or release driving energy in two directions, thereby increasing the utilization efficiency of the elastic member, simplifying the structure of the driving assembly 50, and improving the maneuverability of the power adapter 100. Certainly, in other embodiments, the end of the elastic member away from the button 31 can also be fixed to the transmission part 40 or the rotating shaft 21, as long as that the elastic member can store or release the rotation torque at the two ends of the elastic member during relative rotation between the button 31 and the limiting member 52, and can store or release the sliding torque at the two ends of the elastic member during relative sliding between the button 31 and the limiting member 52.

Optionally, the button base 311 is provided with a fixing groove 315 on an end surface of the button base 311 away from the button cap 312, where the fixing groove 315 communicates with the insertion hole 319. One end of the elastic member extends into the insertion hole 319, and is provided with a first hook 511 fixed in the fixing groove 315 to increase the stability of the elastic member relative to the button 31. The limiting member 52 defines a fixing hole on the first connection end 521. The end of the elastic member away from the button 31 is sleeved on the limiting member 52, and is provided with a second hook 512 inserted into the fixing hole to increase the stability of the elastic member relative to the limiting member 52. The fixing hole serves as the driving-force receiving portion 523 of the limiting member 52, and the elastic member drives the limiting member 52 to rotate by means of stable fit between the second hook 512 and the fixing hole. Certainly, in other embodiments, the end of the elastic member away from the button 31 can also be fixed to the second connection end 522, or fixed between the first connection end 521 and the second connection end 522.

Figure 11:
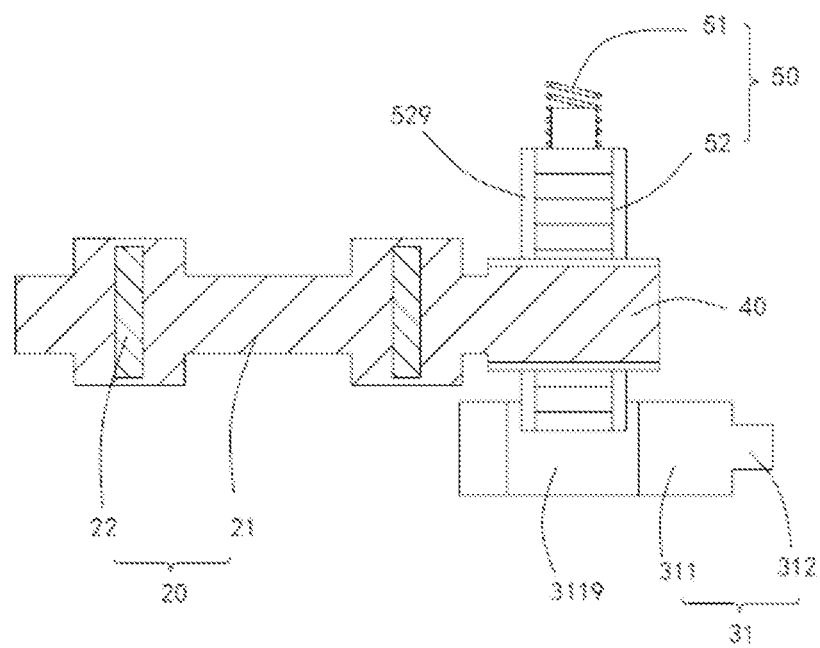
FIG. 11 is a partial sectional schematic view of a power adapter provided in embodiments of the present disclosure.
Figure 12:
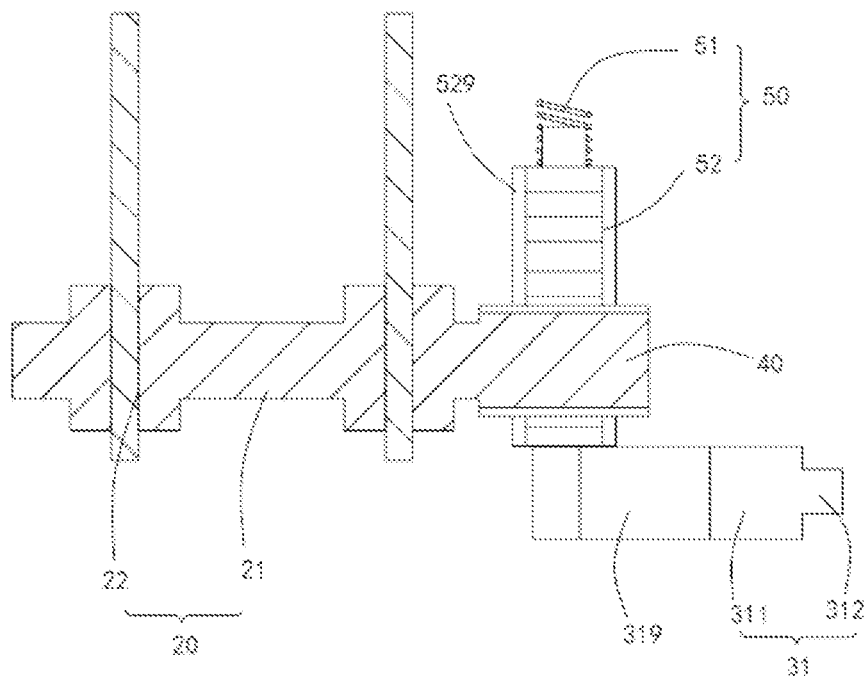
FIG. 12 is a partial sectional schematic view illustrating another state of the power adapter illustrated in FIG. 11.

In another embodiment similar to the embodiment illustrated in FIGS. 1-7 and 9-10, as illustrated in FIGS. 11 and 12, the driving member 51 can also drive the limiting member 52 to slide linearly. The limiting member 52 and the rotating shaft 21 of the prong 20 are connected via the transmission part 40, so that the transmission part 40 can convert the linear sliding torque of the limiting member 52 into the rotation torque and transmit the rotation torque to the rotating shaft 21. Specifically, the limiting member 52 is provided with a rack, and the transmission part 40 is provided with a gear fixedly connected to and coaxially arranged with the rotating shaft 21. The rack on the limiting member 52 is meshed with the gear on the rotating shaft 21, or the rack of the limiting member 52 is meshed with the gear on the rotating shaft 21 via a reversing gear, or the rack of the limiting member 52 is meshed with the gear on the rotating shaft 21 via multiple gears meshed in sequence. The button base 311 defines a via hole 3119 on a peripheral side of the button base 311, where the via hole 3119 laterally penetrates the button base 311. The limiting member 52 is also provided with a guide slider 529 arranged in parallel with the rack. A longitudinal direction of the limiting member 52 is perpendicular to the sliding direction of the button 31. The sliding direction of the button 31 is parallel to the axial direction of the rotating shaft 21. When the button 31 is in the non-pressed state, the guide slider 529 and the via hole 3119 are staggered, and an end of the guide slider 529 abuts against the peripheral side of the button base 311, so that the limiting member 52, the button 31, the transmission part 40, and the rotating shaft 21 are all stationary relative to the holder 10, that is, the limiting member 52 is locked with the button 31. When the button 31 is pressed until the guide slider 529 directly faces the via hole 3119, the driving member 51 can drive the guide slider 529 to slidably fit the via hole 3119, that is, the limiting member 52 is unlocked from the button 31, so that the limiting member 52 acquires a linear sliding torque, the rack drives the gear to rotate, the gear drives the rotating shaft 21 to rotate, and finally the prong 20 is flipped to extend out from the holder 10. In an embodiment, the driving member 51 is a rectangular spring connecting the holder 10 and the limiting member 52. When the button 31 is in the non-pressed state, the driving member 51 is in a compressed state. When the button 31 is pressed, the driving member 51 returns to the natural stretched state, and then the driving member 51 releases the linear sliding torque to the limiting member 52.

It can be understood that, in the embodiment illustrated in FIGS. 1-7 and 9-10, or in another embodiment similar to the embodiment illustrated in FIGS. 1-7 and 9-10, the driving member 51 can be replaced with other structural components that can store driving energy. For example, the driving member 51 may be two magnets that repel each other, where one magnet is fixed to the holder 10, and the other magnet is fixed to the limiting member 52. By means of the movement of the limiting member 52 relative to the holder 10, the two magnets can attract or repel each other, that is, storing or releasing of driving energy can be realized to meet a requirement that the prong 20 can be flipped relative to the holder 10 to extend out from the holder 10 when the button 31 is pressed. For another example, the driving member 51 may be a piston disposed in an air chamber. The piston is fixed to the limiting member 52, and by means of the movement of the limiting member 52 relative to the holder 10, the piston slides in the air chamber to make gas in the air chamber compressed or expanded, that is, the driving member 51 stores or releases driving energy to meet the requirement that the prong 20 can be flipped relative to the holder 10 to extend out from the holder 10 when the button 31 is pressed.

Figure 13:
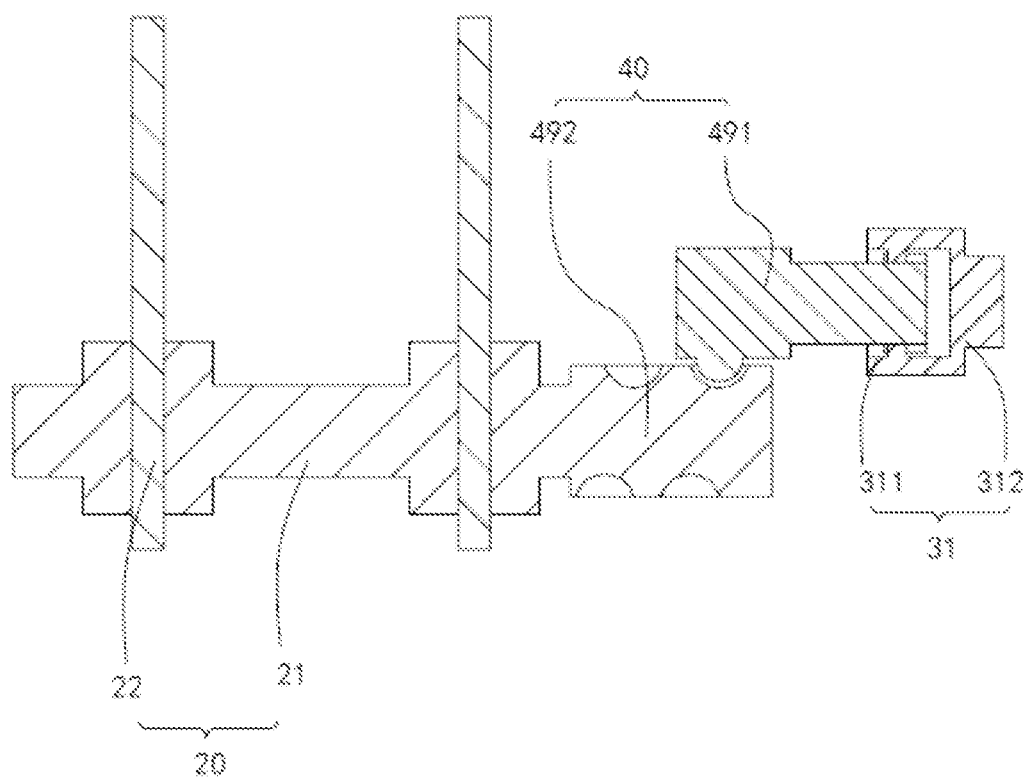
FIG. 13 is a partial sectional schematic view of a power adapter provided in embodiments of the present disclosure.

In another embodiment similar to the embodiment illustrated in FIGS. 1-7 and 9-10, as illustrated in FIG. 13, the linear sliding torque of the button 31 can be directly transmitted to the rotating shaft 21 of the prong 20 via the transmission part 40, so that the prong 20 can be flipped to extend out from the holder 10. Specifically, the transmission part 40 is provided with a transmission slider 491 fixedly connected to the button 31 and a worm 492 fixedly connected to the rotating shaft 21, and the transmission slider 491 is engaged with the worm 492. When the button 31 is pressed, the button 31 drives the transmission slider 491 to slide relative to the holder 10, and the transmission slider 491 drives the worm 492 to rotate, so that the worm 492 drives the rotating shaft 21 of the prong 20 to rotate, and finally the prong 20 is flipped relative to the holder 10 to extend out from the holder 10. The holder 10 is provided with a limiting magnet capable of magnetically attracting the transmission slider 491. After the prong 20 is flipped to extend out from the holder 10, the limiting magnet magnetically attracts the transmission slider 491, so that the prong 20 is kept in the state of extending out of the holder 10. When the prong 20 needs to be received in the receiving groove 18, a force that is greater than a magnetic attraction force of the limiting magnet to the transmission slider 491 is applied to the prong 20, so that the transmission slider 491 is finally separated from the limiting magnet, the prong 20 is flipped to be received in the receiving groove 18, and button 31 resets so that the button 31 can be pressed next time.

Based on the embodiment illustrated in FIGS. 1-7 and 9-10, the structure of the housing 90 of the power adapter 100 in the present disclosure can also be improved, for example, another power adapter that does not include the housing 90 is provided, or a power adapter with a housing of other structural shapes is provided, that is, based on the embodiment illustrated in FIGS. 1-7 and 9-10, there is no limitation on the structural form of the housing 90 of the power adapter 100 of the present disclosure. Any technical solutions similar to the technical solution in the embodiment illustrated in FIGS. 1-7 and 9-10 are all within the scope of protection of the present disclosure, where the technical solution in the embodiment illustrated in FIGS. 1-7 and 9-10 is that the button 31 is used to release the driving torque of the driving assembly 50 to the prong 20 or restrict the driving torque of the driving assembly 50 from being transmitted to the prong 20, to make the prong 20 flip relative to the holder 10 to extend out from or retract to the holder 10.

Figure 14:
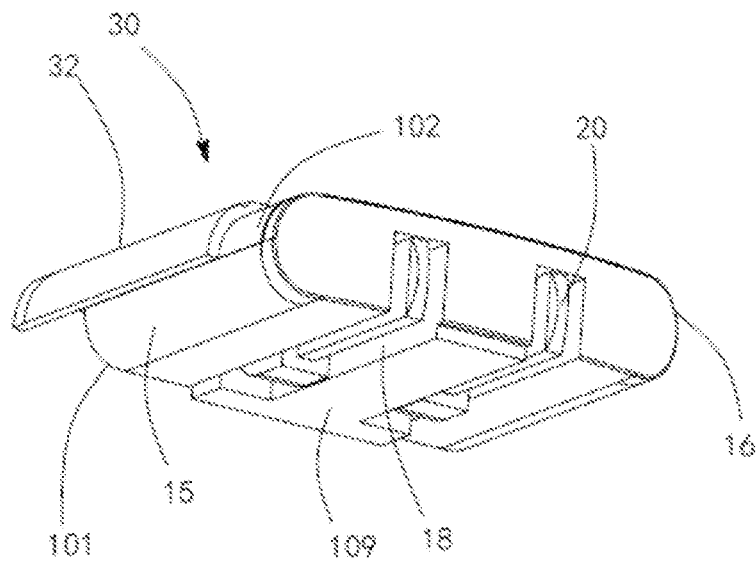
FIG. 14 is a partial perspective schematic view of a power adapter provided in embodiments of the present disclosure.
Figure 15:
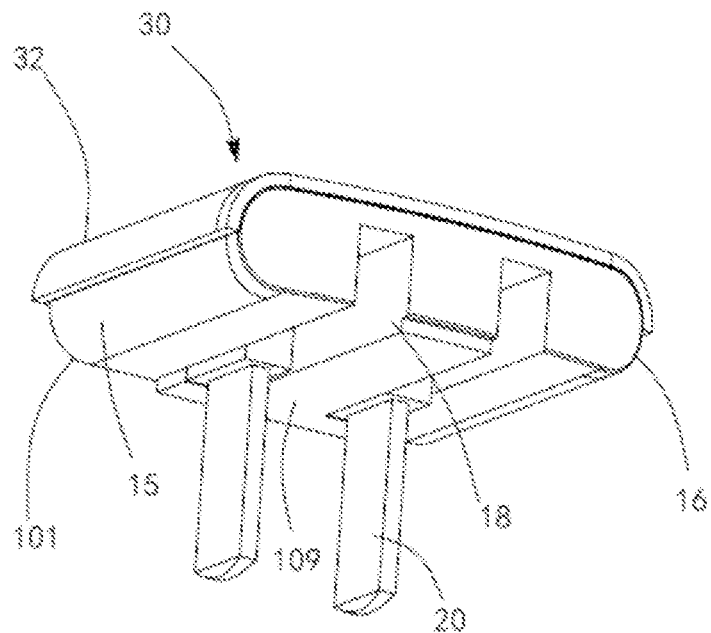
FIG. 15 is a partial perspective schematic view illustrating another state of the power adapter illustrated in FIG. 14.
Figure 16:
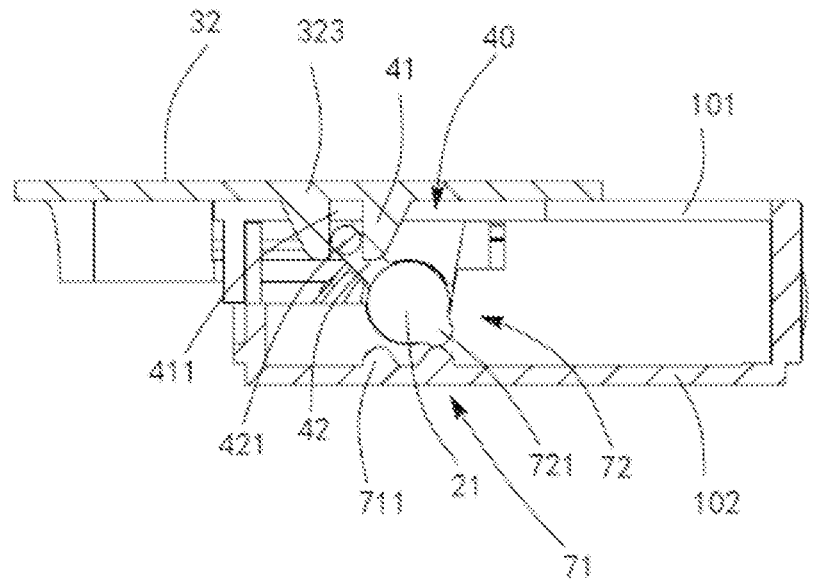
FIG. 16 is a partial sectional schematic view of the power adapter illustrated in FIG. 14.

It can be understood that, referring to FIGS. 14, 15, and 16, the power adapter 100 in the present disclosure further includes the transmission part 40 received in the holder 10. The transmission part 40 is connected to the moving part 30 and the prong 20 to convert a motion torque of the moving part 30 into a rotation torque and transmit the rotation torque to the prong 20, so that the prong 20 can be flipped relative to the housing 90. That is, by moving the moving part 30 relative to the holder 10, the moving part 30 drives the prong 20 to extend out from or retract to the holder 10.

Another embodiment is provided. The embodiment differs from the embodiment illustrated in FIGS. 1-10 in that the moving part 30 can be slidably arranged on the holder 10 and is located outside the receiving groove 18, and the transmission part 40 converts the linear sliding torque of the moving part 30 into the rotation torque and transmit the rotation torque to the rotating shaft 21 of the prong 20. The moving part 30 can slide relative to the holder 10 along a straight line. The moving part 30 is directly connected to the transmission part 40, so that the linear sliding torque of the moving part 30 can be transmitted to the transmission part 40. The transmission part 40 is directly connected to the rotating shaft 21, so that the transmission part 40 can transmit the rotation torque to the rotating shaft 21 to make the rotating shaft 21 rotate relative to the holder 10.

In the embodiment, the moving part 30 is provided with a sliding cover 32, and the sliding cover 32 is arranged at a side of the holder 10 away from the receiving groove 18. The receiving groove 18 is defined at a side of the first casing 101 away from the second casing 102. The sliding cover 32 is slidably connected to the second casing 102. A sliding direction of the sliding cover 32 is parallel to the first side surface 15 and perpendicular to the rotating shaft 21. The sliding cover 32 is stacked on the second casing 102. The sliding cover 32 can slide to a position where the second casing 102 is fully covered by the sliding cover 32 and to a position where the sliding cover 32 and the second casing 102 partially overlap. The sliding cover 32 covers a side of the housing 90 facing away from the through groove 91. The sliding cover 32 partially penetrates the housing 90 to be slidably connected to the second casing 102.

Figure 17:
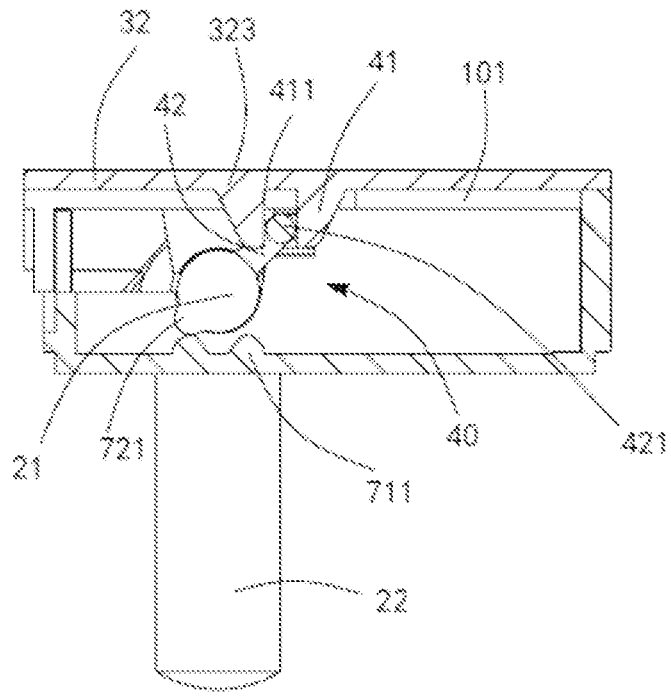
FIG. 17 is a partial sectional schematic view illustrating another state of the power adapter illustrated in FIG. 14.

In an embodiment, as illustrated in FIG. 17, when the sliding cover 32 slides to the position where the second casing 102 is fully covered by the sliding cover 32, the prong 20 is flipped relative to the holder 10 to extend out from the holder 10. As illustrated in FIG. 16, when the sliding cover 32 slides to the position where the sliding cover 32 and the second casing 102 partially overlap, the prong 20 is flipped relative to the holder 10 to retract to the holder 10. Certainly, in other embodiments, when the sliding cover 32 slides to the position where the second casing 102 is fully covered by the sliding cover 32, the prong 20 is flipped relative to the holder 10 to retract to the holder 10, and when the sliding cover 32 slides to the position where the sliding cover 32 and the second casing 102 partially overlap, the prong 20 is flipped relative to the holder 10 to extend out from the holder 10.

Figure 18:
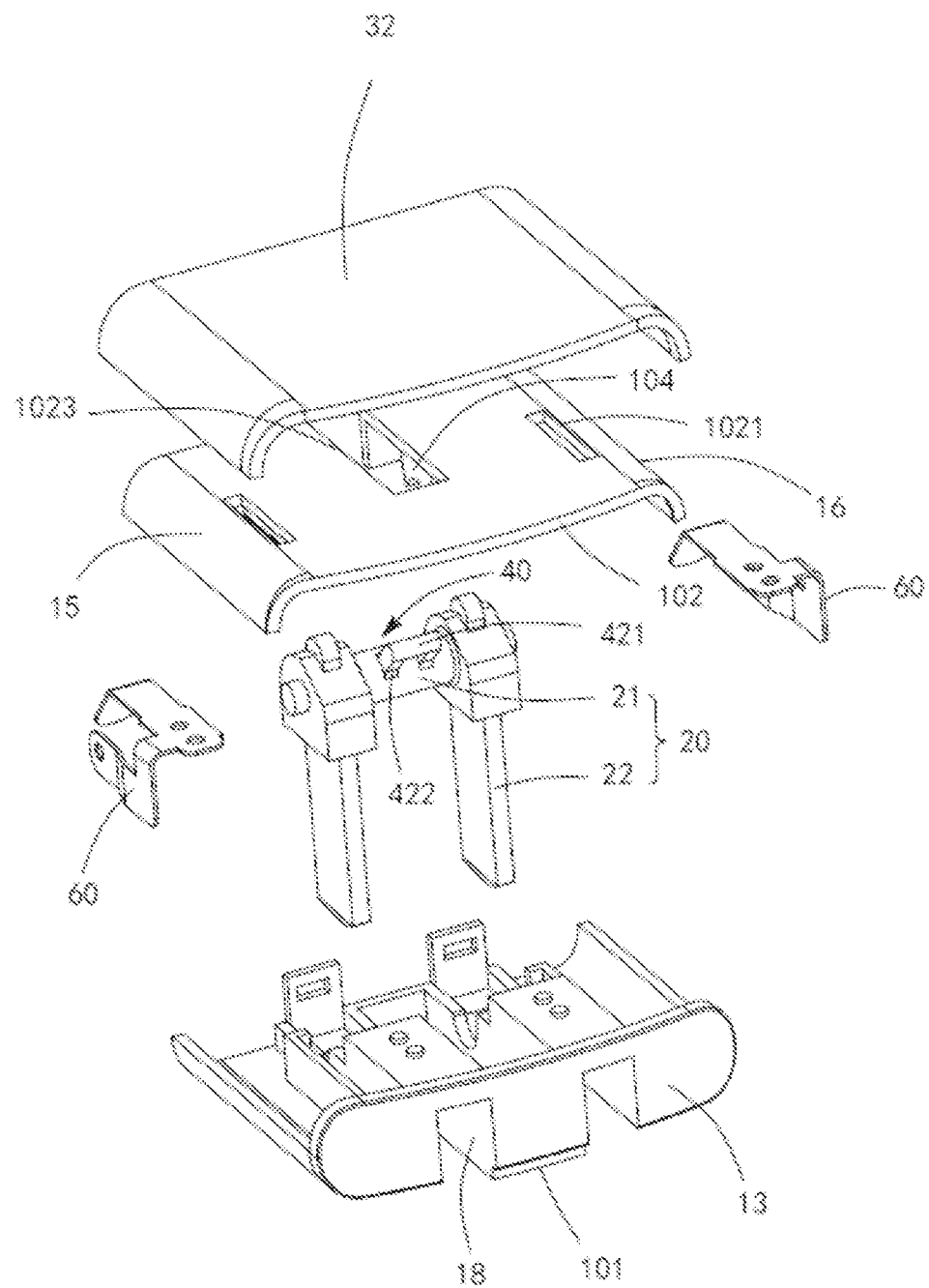
FIG. 18 is a partial exploded schematic view of the power adapter illustrated in FIG. 14.
Figure 19:
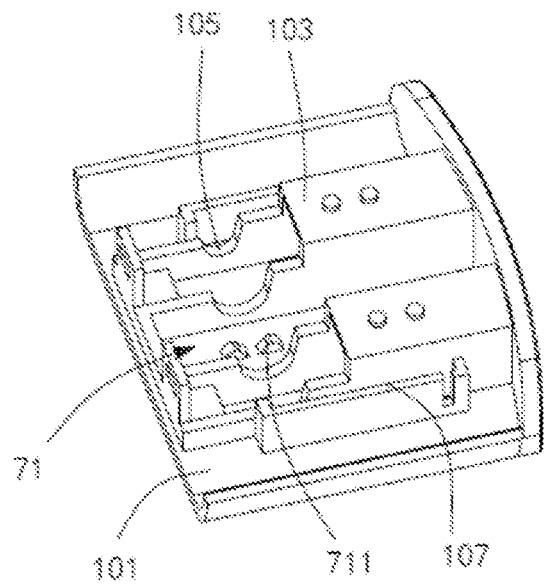
FIG. 19 is a partial perspective schematic view of the power adapter illustrated in FIG. 14.

Referring to FIG. 16, FIG. 17, and FIG. 18, optionally, both the first side surface 15 and the second side surface 16 are in the shape of a circular arc. The sliding cover 32 is provided with two opposite curved sides. The curved side extends in a circular arc surface. The opposite curved sides are respectively aligned with opposite sides of the second casing 102, so as to simplify the overall appearance of the power adapter 100.

Optionally, the receiving groove 18 further penetrates the first end surface 13 of the holder 10, so as to facilitate sweeping dust and impurities in the receiving groove 18. The rotating shaft 21 is substantially located at a middle position between the first end surface 13 and the second end surface 14, so that when the prong 20 is flipped to extend out from the holder 10, the center of the prong 20 substantially faces the center of the first casing 101, and thus it is convenient to apply to the prong 20 a plug-in force via the holder 10, so that the prong 20 can be plugged into the power socket.

Figure 20:
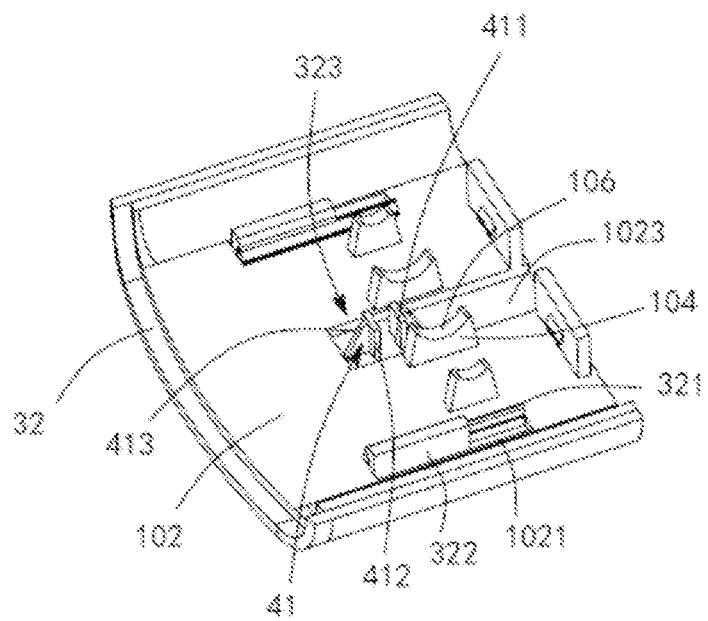
FIG. 20 is a partial perspective schematic view of the power adapter illustrated in FIG. 14.
Figure 21:
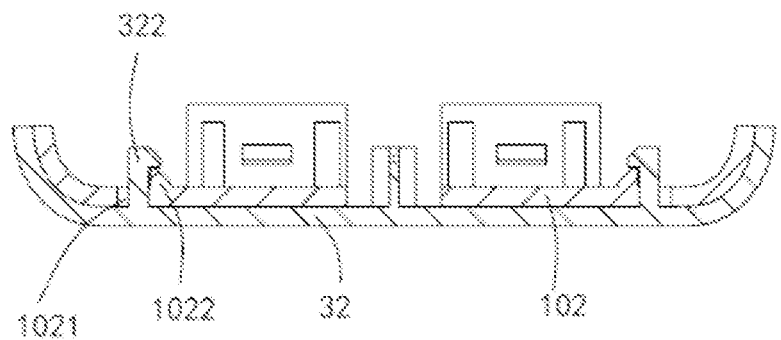
FIG. 21 is a partial sectional schematic view of the power adapter illustrated in FIG. 14.

Optionally, as illustrated in FIG. 18, FIG. 20, and FIG. 21, the second casing 102 defines two opposite sliding slots 1021. One sliding slot 1021 is adjacent to the first side surface 15, and the other sliding slot 1021 is adjacent to the second side surface 16. The sliding cover 32 is provided with two sliding protrusions 321, where one sliding protrusion 321 slidably fits one sliding slot 1021, and the other sliding protrusion 321 slidably fits the other sliding slot 1021, so that the sliding cover 32 can slide relative to the second casing 102, and the sliding cover 32 is prevented from moving in a width direction of the holder 10. The width direction of the holder 10 is a direction in which the first side surface 15 is opposite to the second side surface 16. The second casing 102 is provided with snap flags 1022 on the inner side of the second casing 102, where the snap flags 1022 are respectively adjacent to the two sliding slots 1021. The sliding protrusion 321 passes through the sliding slot 1021. A sliding guide fastener 322 and the snap flag 1022 are engaged, so that the sliding cover 32 is prevented from moving in a thickness direction of the holder 10. The thickness direction of the holder 10 is a direction in which the front surface 11 is opposite to the rear surface 12.

Optionally, the second casing 102 defines a sliding guide through hole 1023. The sliding guide through hole 1023 is between the two bearing protrusions 104. The sliding cover 32 is provided with a connecting portion 323 passing through the sliding guide through hole 1023. The connecting portion 323 is connected to the transmission part 40. The sliding guide through hole 1023 guides sliding of the connecting portion 323, and facilitates the connection of the sliding cover 32 to the transmission part 40, so as to ensure that the linear sliding torque of the sliding cover 32 can be transmitted to the transmission part 40.

Certainly, in other embodiments, the sliding cover 32 can also be slidably disposed on the first side surface 15 or the second side surface 16 of the holder 10, and the user can slide the sliding cover 32 at the side of the power adapter 100 to quickly and conveniently make the prong 20 extend out from or retract to the holder 10.

In the embodiment, referring to FIG. 16, FIG. 17, and FIG. 18, the transmission part 40 is provided with a push block 41 and a rocker 42, where the push block 41 is fixedly connected to the connecting portion 323, and the rocker 42 has an end rotationally and slidably fitting the push block 41. One end of the rocker 42 away from the push block 41 is fixedly arranged with the rotating shaft 21 of the prong 20 to drive the prong 20 to rotate. One end of the rocker 42 can slidably fit the push block 41 in a direction toward or away from the sliding cover 32, and the rocker 42 can also rotate relative to the sliding cover 32 with the end connected to the push block 41 as a rotation axis. A rotation axial direction of the rocker 42 relative to the sliding cover 32 is parallel to the axial direction of the rotating shaft 21. When the sliding cover 32 slides to a position where the sliding protrusion 321 is at a closed end of the sliding slot 1021, one end of the rocker 42 is slid relative to the push block 41 to a position away from the sliding cover 32, and the prong 20 is flipped relative to the holder 10 to retract to or extend out from the holder 10. When the sliding cover 32 slides to a position where the sliding protrusion 321 is at a middle position of the sliding slot 1021 between two closed ends of the sliding slot 1021, one end of the rocker 42 is slid relative to the push block 41 to a position close to the sliding cover 32, and the prong 20 is flipped to a half-rotation position, that is, the prong 20 is flipped to a substantially inclined state relative to the holder 10.

Optionally, the rocker 42 extends in a radial direction of the rotating shaft 21. A direction of sliding of one end of the rocker 42 relative to the push block 41 is parallel to the thickness direction of the holder 10.

Optionally, the rocker 42 and the rotating shaft 21 are integrally arranged to increase the stability of the rocker 42 relative to the rotating shaft 21.

Figure 22:
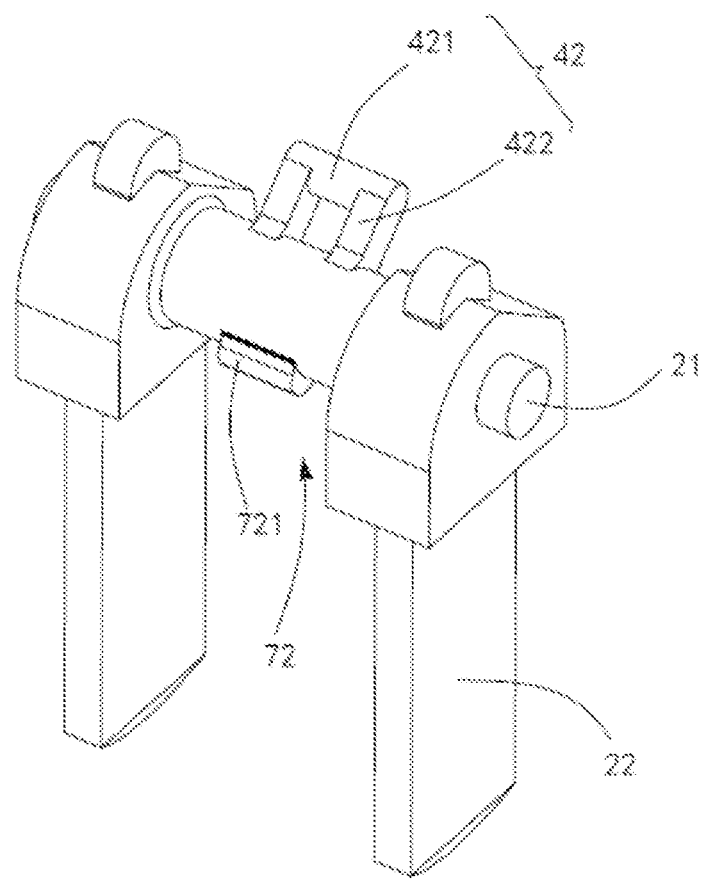
FIG. 22 is a partial perspective schematic view of the power adapter illustrated in FIG. 14.

In the embodiment, referring to FIG. 18, FIG. 20, and FIG. 22, the push block 41 defines a rotating-shaft sliding groove 411, and the rocker 42 is provided with a slidable rotating shaft 421 on an end of the rocker 42, where the slidable rotating shaft 421 slidably and rotationally fits the rotating-shaft sliding groove 411. The slidable rotating shaft 421 laterally extends from one end of the rocker 42 away from the rotating shaft 21. The slidable rotating shaft 421 is parallel to the rotating shaft 21. When the sliding cover 32 slides relative to the second casing 102, the slidable rotating shaft 421 slides in the rotating-shaft sliding groove 411 and rotates around its own central axis. The rocker 42 rotates relative to the second casing 102 and drives the rotating shaft 21 to rotate.

Optionally, the push block 41 is provided with two opposite clamping plates 412 and reinforcing ribs 413 respectively fixed to the two clamping plates 412. The reinforcing rib 413 is disposed at a side of the clamping plate 412 facing away from the other clamping plate 412. The rotating-shaft sliding groove 411 is between the two clamping plates 412. The two clamping plates 412 can guide sliding of the slidable rotating shaft 421 and allow the slidable rotating shaft 421 to rotate.

Optionally, as illustrated in FIGS. 16, 17, and 18, the rocker 42 is provided with two connecting rods 422, and the two connecting rods 422 are arranged in parallel in the axial direction of the rotating shaft 21. The slidable rotating shaft 421 is fixed to ends of the two connecting rods 422 away from the rotating shaft 21, so that the structure of the slidable rotating shaft 421 is stable.

It can be understood that the linear sliding torque of the sliding cover 32 relative to the second casing 102 is decomposed into a linear torque parallel to the thickness direction of the holder 10 and a rotation torque with the rotating shaft 21 as the axis. The rocker 42 transmits the rotation torque to the rotating shaft 21, so that the rotating shaft 21 rotates, and finally the prong 20 can be flipped relative to the holder 10 to extend out from or retract to the holder 10.

Further, referring to FIG. 16, FIG. 17, FIG. 19, and FIG. 22, the power adapter 100 includes a first damping member 71 arranged in the holder 10 and a second damping member 72 arranged on the prong 20, The first damping member 71 is used to provide a damping force for hindering movement of the second damping member 72, so that flipping of the prong 20 relative to the holder 10 is hindered.

When the moving part 30 slides relative to the holder 10 in a straight line, the second damping member 72 rotates relative to the holder 10 along with the rotating shaft 21 of the prong 20, that is, the second damping member 72 rotates around the axis of the rotating shaft 21 and rotates relative to the first damping member 71. The first damping member 71 is located in a tangential direction of an arc rotation track of the second damping member 72. When the second damping member 72 rotates to approach and resist against the first damping member 71, the first damping member 71 applies a damping force to the second damping member 72, so that rotation of the second damping member 72 along with the rotating shaft 21 is hindered, and thus rotation of the prong 20 relative to the holder 10 is hindered. The first damping member 71 cooperates with the second damping member 72, so that there is a sense of stagnation when the prong 20 is flipped relative to the holder 10 to extend out from or retract to the holder 10, thereby avoiding a relatively great impact on the holder 10 when flipping of the prong 20 to extend out from or retract to the holder 10 stops.

Optionally, the first damping member 71 is disposed on a position of an inner side of the first casing 101 that directly faces the rotating shaft 21. The second damping member 72 is disposed on a peripheral side of the rotating shaft 21. The second damping member 72 is disposed on the peripheral side of the rotating shaft 21 and is opposite to the rocker 42.

Optionally, the first damping member 71 is a damping boss on an inner side of the first casing 101. The second damping member 72 is a rotating protrusion on the peripheral side of the rotating shaft 21. The second damping member 72 extends in the radial direction of the rotating shaft 21. When the sliding cover 32 slides relative to the second casing 102, the rotating shaft 21 rotates relative to the holder 10, and the second damping member 72 slides to approach the first casing 101 along with the rotating shaft 21, the second damping member 72 is in close contact with the first damping member 71, and a mutual resisting force between the second damping member 72 and the first damping member 71 increases as the distance between the second damping member 72 and the first casing 101 decreases.

It can be understood that when the second damping member 72 rotates to be in contact with the first damping member 71, the slidable rotating shaft 421 of the rocker 42 is slid in the rotating-shaft sliding groove 1021 to a position away from the sliding cover 32, and the prong 20 is flipped relative to the holder 10 to extend out from or retract to the holder 10, at this point, the damping force of the first damping member 71 to the second damping member 72 is the least. When the second damping member 72 rotates to a position where a resisting force between the first damping member 71 and the second damping member 72 is the greatest, the slidable rotating shaft 421 of the rocker 42 is slid in the rotating-shaft sliding groove 1021 to a position close to the sliding cover 32, and the prong 20 is flipped to a substantially inclined state relative to the holder 10, at this point, the damping force of the first damping member 71 to the second damping member 72 is the greatest.

Specifically, the first damping member 71 is provided with two first convex teeth 711 at an end of the first damping member 71, a damping recess is formed between the two first convex teeth 711, and the second damping member 72 is provided with a second convex tooth 721 at an end of the second damping member 72, where the second convex tooth 721 can fit against the damping recess. When the second convex tooth 721 rotates along with the rotating shaft 21 to contact the first convex tooth 711, the first convex tooth 711 hinders further rotation of the second convex tooth 721 along with the rotating shaft 21, so that there is a sense of stagnation during the rotation of the rotating shaft 21. When the second convex tooth 721 rotates to fit the damping recess, the two first convex teeth 711 clamp the second convex tooth 721, so that there is a sense of stagnation for positioning during the rotation of the rotating shaft 21, and thus during sliding of the sliding cover 32, it needs to overcome the damping force of the first damping member 71 to the second damping member 72 to cause the prong 20 to extend out from or retract to the holder 10, thereby improving an operation feeling of sliding the sliding cover 32.

More specifically, the end of the first convex tooth 711 is in the shape of an arc convex surface, or/and the end of the second convex tooth 721 is in the shape of an arc convex surface, so that when the second convex tooth 721 rotationally fits the first convex tooth 711, the second convex tooth 721 is allowed to slide over the surface of the first convex tooth 711, to achieve fit between the second convex tooth 721 and the damping recess. Certainly, in other embodiments, the first damping member 71 may also be provided with three or more first convex teeth 711.

Figure 23:
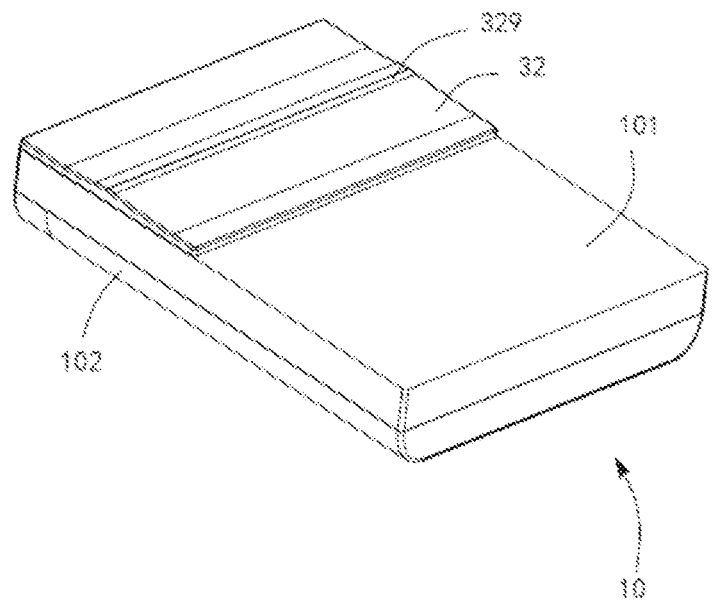
FIG. 23 a partial perspective schematic view of a power adapter provided in embodiments of the present disclosure.
Figure 24:
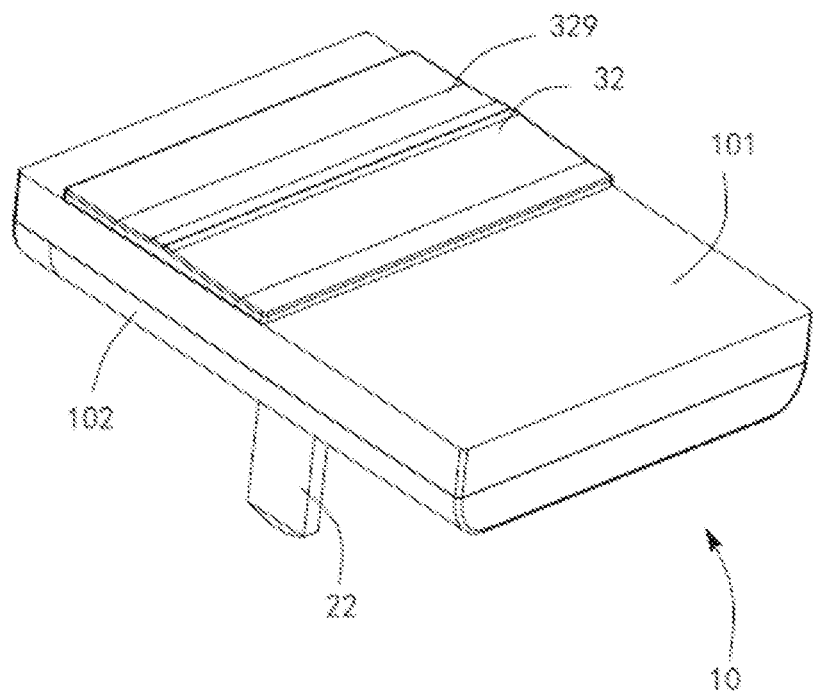
FIG. 24 is a partial perspective schematic view illustrating another state of the power adapter illustrated in FIG. 23.
Figure 25:
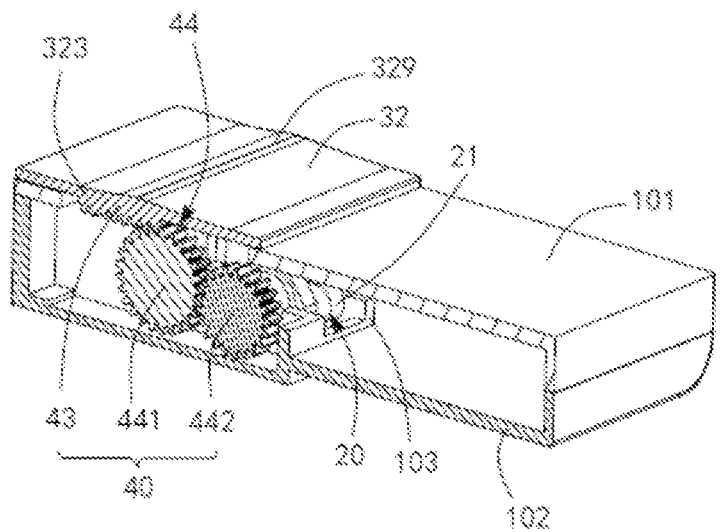
FIG. 25 is a partial sectional schematic view of the power adapter illustrated in FIG. 23.

The present disclosure provides another embodiment. Referring to FIG. 23, FIG. 24, and FIG. 25, the embodiment is substantially the same as the embodiment illustrated in FIGS. 14-22, except that the transmission part 40 is provided with a rack 43 fixedly connected to the moving part 30 and multiple gears meshed in sequence. The gear 44 at the head end is meshed with the rack 43, the gear 44 at the tail end is fixedly connected to and is coaxially arranged with the rotating shaft 21 of the prong 20. The rack 43 slides in a straight line relative to the holder 10 along with the moving part 30, drives the gear 44 at the head end to rotate, and then drives the gear 44 at the tail end to rotate, the gear 44 at the tail end drives the rotating shaft 21 to rotate, and finally the prong 20 is driven to flip relative to the holder 10 to extend out from or retract to the holder 10.

In the embodiment, the rack 43 is fixed on the connecting portion 323 of the slider. The rack 43 is disposed at a side of the sliding cover 32 facing the second casing 102. A longitudinal direction of the rack 43 is parallel to the sliding direction of the sliding cover 32. The transmission part 40 is provided with a first gear 441 rotationally connected to the holder 10 and meshed with the rack 43, and a second gear 442 fixedly connected to and arranged coaxially with the rotating shaft 21. The second gear 442 is meshed with the first gear 441. The first gear 441 is the gear 44 at the head end, and the second gear 442 is the gear 44 at the tail end. An end of a rotating shaft of the first gear 441 is clamped between the bearing boss 103 and the bearing protrusion 104. The second gear 442 is fixed to the rotating shaft 21 at the middle of the rotating shaft 21, so that the rotating shaft 21 can receive the rotation torque at the middle of the rotating shaft 21 to rotate evenly. An outer diameter of the first gear 441 is larger than an outer diameter of the second gear 442, so that when the sliding cover 32 slides a small distance, the second gear 442 can rotate approximately 90 degrees, and thus the prong 20 can be flipped to extend out.

Optionally, the rack 43 and the sliding cover 32 are integrally arranged.

Optionally, the first gear 441 is rotationally arranged between two bearing bosses 103 and two bearing protrusions 104.

Optionally, the second casing 102 is partially covered by the sliding cover 32.

Optionally, the sliding cover 32 is provided with a boss 329 on a surface of the sliding cover 32 away from the second casing 102, and with the aid of the boss 329, it is convenient for the sliding cover 32 to receive a pushing-pulling force.

When the sliding cover 32 slides to be flush with an end edge of the second casing 102, the prong 20 is flipped to retract to the holder 10. When the sliding cover 32 slides to approximately face the center of the second casing 102, the prong 20 is flipped to extend out from the holder 10. The rotating shaft 21 of the prong 20 approximately faces the center of the first casing 101, so that it is easy to insert the prong 20 into the power socket after the prong 20 extends out from the holder 10.

Certainly, in other embodiments, the transmission part 40 can also be provided with one gear 44. The gear 44 is fixedly connected to and coaxially arranged with the rotating shaft 21, and is further meshed with the rack 43. When the sliding cover 32 drives the rack 43 to slide, the gear 44 rotates under the action of the rack 43 and then drives the rotating shaft 21 to rotate.

In other embodiments, the transmission part 40 may also be provided with a gear that is meshed with the first gear 441 and the second gear 442, or provided with multiple gears that are meshed in sequence between the first gear 441 and the second gear 442. The first gear 441 is the gear at the head end, and the second gear 442 is the gear at the tail end.

Figure 26:
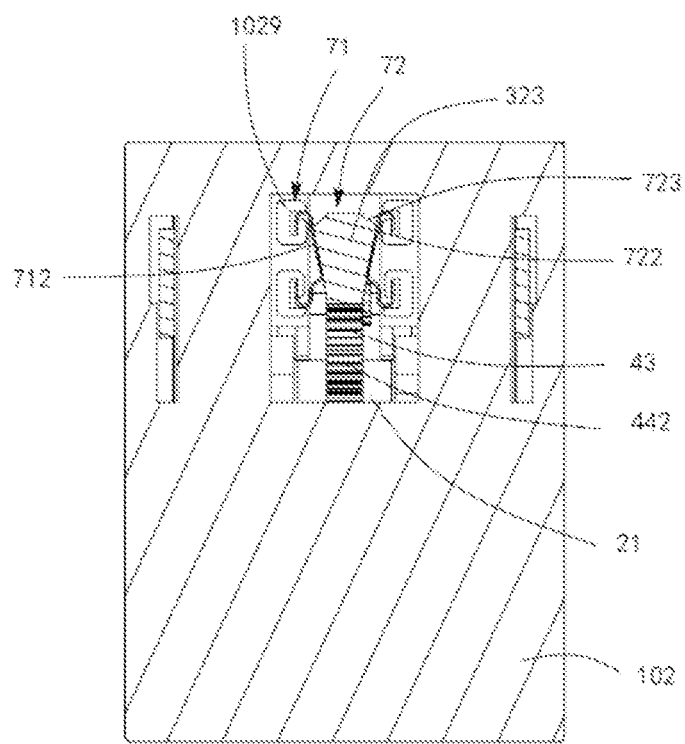
FIG. 26 is a partial sectional schematic view of the power adapter illustrated in FIG. 23.
Figure 27:
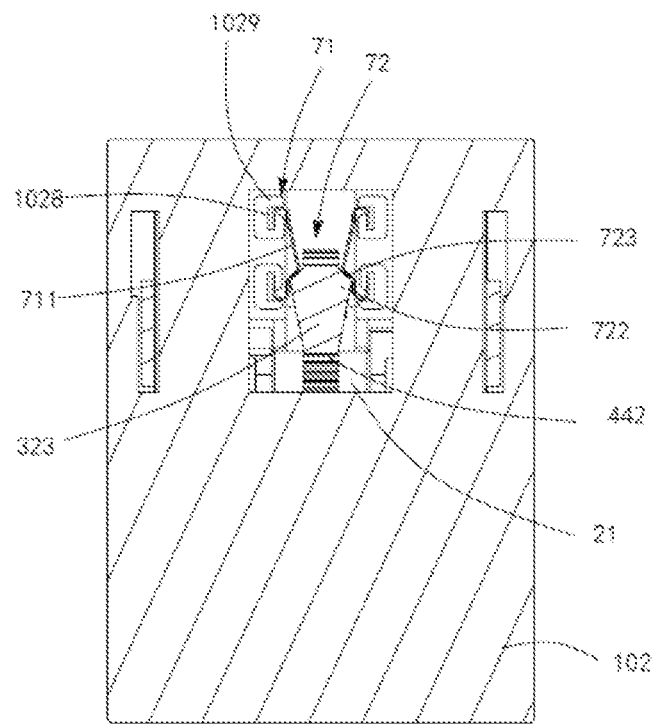
FIG. 27 is a partial sectional schematic view illustrating another state of the power adapter illustrated in FIG. 23.
Figure 28:
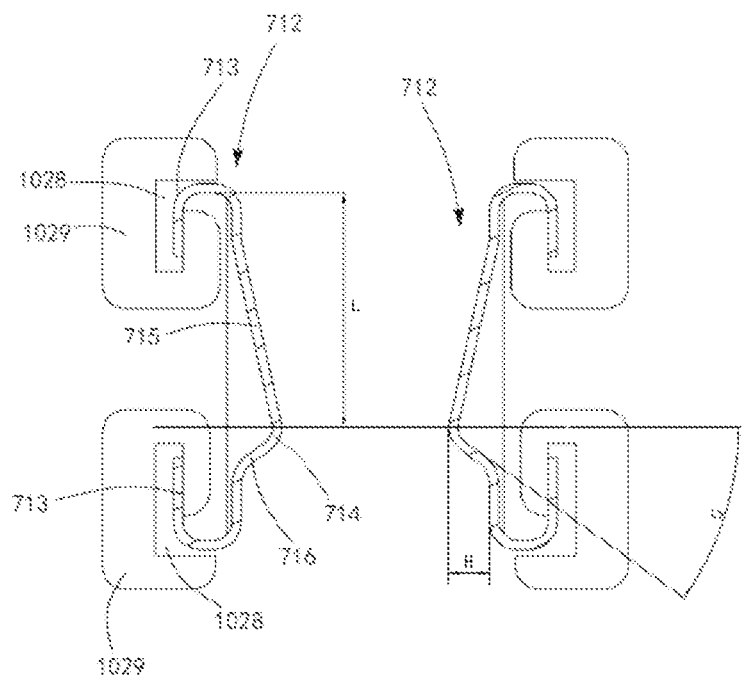
FIG. 28 is a partial schematic view of the power adapter illustrated in FIG. 23.

Further, referring to FIG. 26, FIG. 27, and FIG. 28, the embodiment differs from the embodiment illustrated in FIGS. 14-22 in that the first damping member 71 is provided with two opposite elastic sheets 712. A clamping groove is formed between the two elastic sheets 721, the second damping member 72 is disposed on the moving part 30 and provided with a projection 722 to fit the clamping groove. The second damping member 72 slides in a straight line relative to the first damping member 71 along with the moving part 30. During sliding of the second damping member 72, an elastic clamping force of the two elastic sheets 712 to the projection 722 is the damping force to the second damping member 72. The two elastic sheets 712 are fixed on an inner side of the holder 10, where one elastic sheet 712 is located at one side of the sliding guide through hole 1023, and the other elastic sheet 712 is located at the other side of the sliding guide through hole 1023. The projection 722 is fixed to a side wall of the sliding cover 32 connected to the rack 43.

Optionally, the second casing 102 is provided with two opposite fixing bosses 1029 on an inner side of the second casing 102. The two elastic sheets 712 are respectively fixed to the two fixing bosses 1029, and are respectively located on sides of the two fixing bosses 1029 that are adjacent to each other.

Optionally, the projection 722 is disposed on the connecting portion 323 of the sliding cover 32. The projection 722 on the connecting portion 323 protrudes toward the two fixing bosses 1029, so that the projection 722 can abut against the two elastic sheets 712. The projection 722 and the sliding cover 32 are integrally arranged.

Optionally, the rack 43 is disposed at a side of the projection 722 facing away from the sliding cover 32, so that the rack 43 is meshed with the first gear 441. The rack 43 and the projection 722 are integrally arranged.

Specifically, the fixing boss 1029 defines two fixing slots 1028. The two fixing slots 1028 are arranged opposite to each other in a direction parallel to the sliding direction of the sliding cover 32. The elastic sheet 712 is provided with two fixing hooks 713 respectively at both ends of the elastic sheet 712, and each of the two fixing hooks 713 stably fit one of the two fixing slots 1028. The elastic sheet 712 is provided with a first arched portion 714 between the two fixing hooks 713. The first arched portion 714 is arched in the shape of a curved line. The first arched portion 714 can be elastically deformed under a resisting force. The first arched portion 714 of one of the elastic sheets 712 is arched towards the other elastic sheet 712. A clamping region is formed between the two first arched portions 714. The projection 722 is provided with second arched portions 723 at a side facing the elastic sheets 712. The first damping member 71 hinders movement of the second damping member 72 when the projection 722 passes through the clamping region and the second arched portion 723 resists against the first arched portion 714.

It can be understood that, when the second arched portion 723 slides along with the projection 722 to contact the first arched portion 714, the first arched portion 714 begins to deform, sliding of the sliding cover 32 begins to be hindered, and the prong 20 is flipped from the retracted state to the extending-out state and the rotation of the prong 20 is hindered. If the sliding cover 32 further slides, the resisting force applied to the sliding cover 32 will increase. When an arched end of the second arched portion 723 further slides along with the projection 722 to contact an arched end of the first arched portion 714, the deformation degree of the first arched portion 714 is the greatest, and the projection 722 receives a greatest resisting force during sliding. At this point, there is a sense of stagnation when the sliding cover 32 slides, and the prong 20 is flipped to an inclined state relative to the holder 10. When the arched end of the second arched portion 723 further slides along with the projection 722 to slide over the arched end of the first arched portion 714, the first arched portion 714 begins to deform toward a natural stretched state, and the resisting force applied to the projection 722 during sliding of the projection 722 will gradually decrease. At this point, the second arched portion 723 can slide quickly under the action of an elastic restoring force provided by the first arched portion 714, so that the sliding cover 32 slides quickly, and the prong 20 is quickly flipped to extend out from the holder 10. When the prong 20 is flipped to extend out from the holder 10, the second arched portion 723 is limited and pressed by the first arched portion 714, thus the projection 722 and the sliding cover 32 are prevented from retreating, and the prong 20 is locked by using a transmission relationship among the sliding cover 32, the transmission part 40, and the prong 20, so that the prong 20 is kept in the state of extending out of the holder 10.

More specifically, as illustrated in FIG. 28, the elastic sheet 712 includes a first inclined segment 715 and a second inclined segment 716 bent relative to the first inclined segment 715. When the sliding cover 32 drives the prong 20 to slide from the retracted state to the extending-out state, the projection 722 first contacts the first inclined segment 715 and is finally locked by the second inclined segment 716. The arched end of the first arch portion 714 is formed at a junction of the first inclined segment 715 and the second inclined segment 716. A distance between an end of the first inclined segment 715 and the arched end of the first arch portion 714 in a direction parallel to the sliding direction of the sliding cover 32 is set to be a first distance L. A distance between the end of the second inclined segment 716 and the arched end of the first arch portion 714 in a direction perpendicular to the sliding direction of the sliding cover 32 is set to be a second distance H. An included angle between a longitudinal direction of the second inclined segment 716 and the direction perpendicular to the sliding direction of the sliding cover 32 is set to be an inclined angle A. By adjusting the first distance L, a hindering stroke and a fast-sliding stroke of the sliding cover 32 during the sliding of the sliding cover 32 can be adjusted. By adjusting the second distance H, an elastic resisting force of the elastic sheet 712 to the projection 722 can be adjusted, thereby adjusting a sliding damping force for the sliding cover 32. By adjusting the inclined angle A, a locking force of the elastic sheet 712 to the sliding cover 32 can be adjusted.

Figure 29:
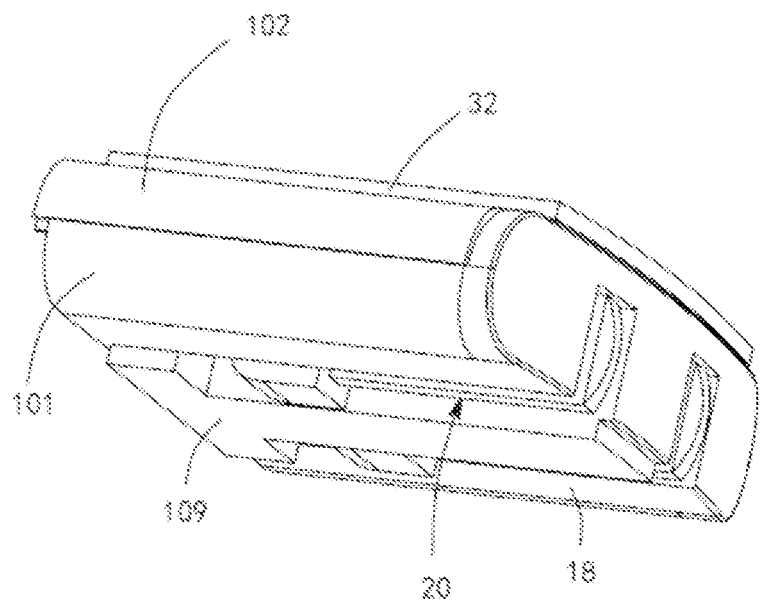
FIG. 29 a partial perspective schematic view of a power adapter provided in embodiments of the present disclosure.
Figure 30:
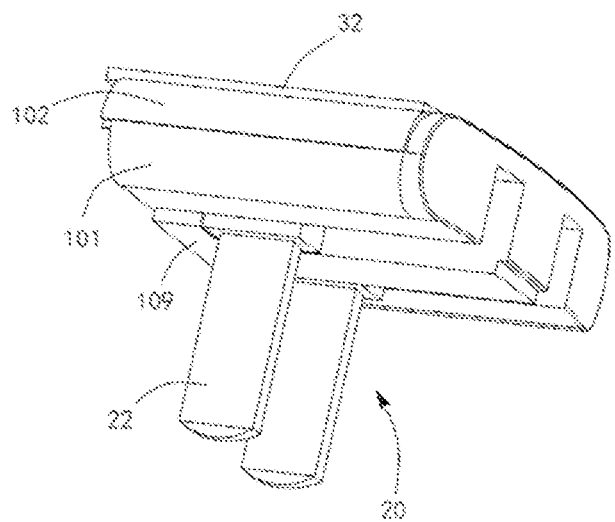
FIG. 30 is a partial perspective schematic view illustrating another state of the power adapter illustrated in FIG. 29.
Figure 31:
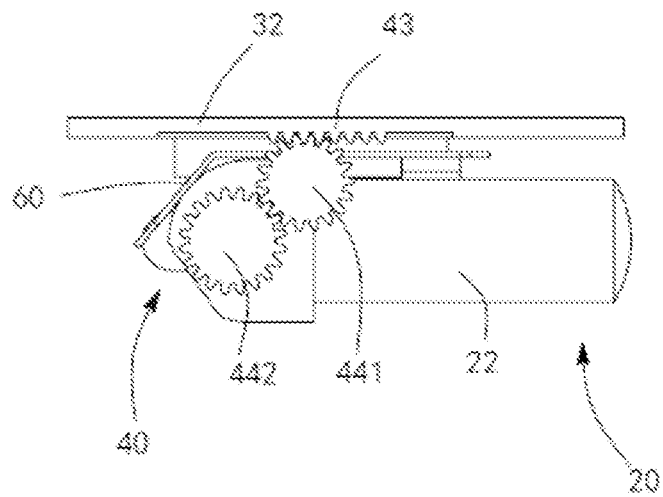
FIG. 31 is a partial sectional schematic view of the power adapter illustrated in FIG. 29.
Figure 32:
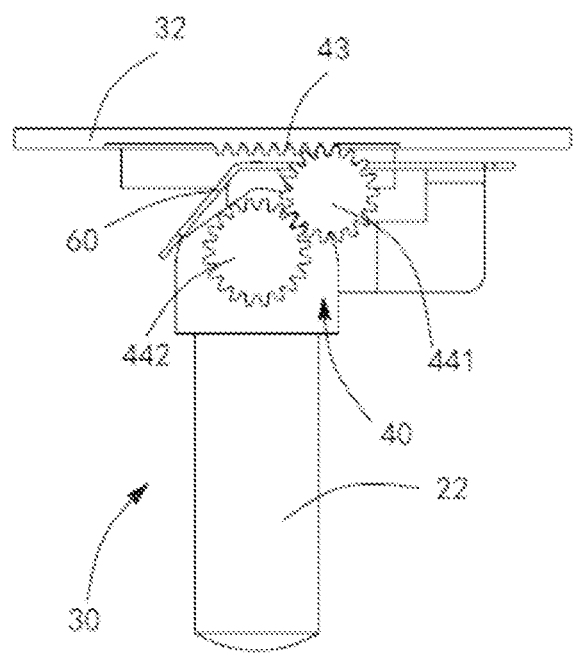
FIG. 32 is a partial sectional schematic view illustrating another state of the power adapter illustrated in FIG. 29.
Figure 33:
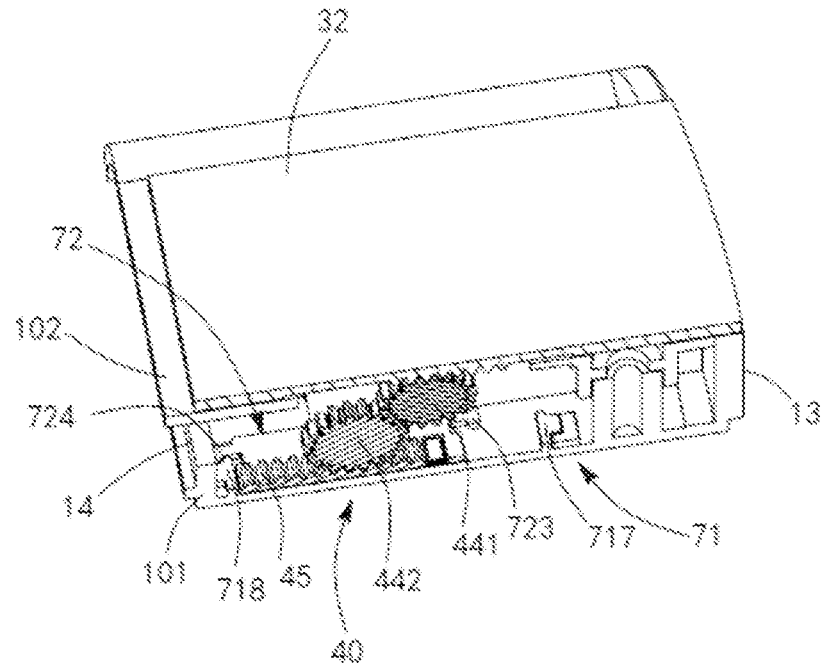
FIG. 33 is a partial sectional schematic view of the power adapter illustrated in FIG. 29.
Figure 34:
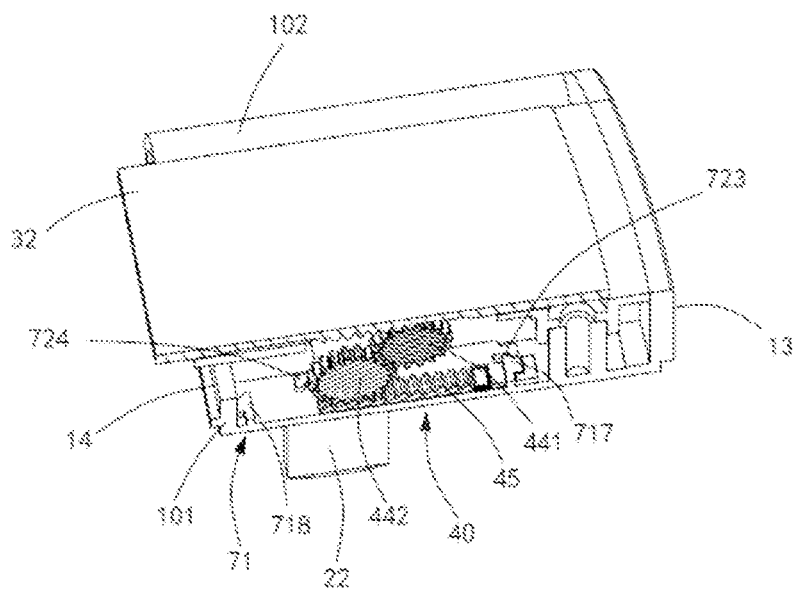
FIG. 34 is a partial sectional schematic view illustrating another state of the power adapter illustrated in FIG. 29.

Referring to FIGS. 29 and 30, the present disclosure provides an embodiment, which is substantially the same as the embodiment illustrated in FIGS. 23-28, except that the sliding cover 32 covers part of the second casing 102, so that a side of the second casing 102 is exposed relative to the sliding cover 32, and accordingly a side of the holder 10 is exposed relative to the sliding cover 32, so as to improve the appearance performance. The transmission part 40 further includes a sliding rack 45 (see FIG. 33) meshed with the second gear 442. Referring further to FIG. 31 and FIG. 32, the further difference is that the outer diameter of the second gear 442 is larger than the outer diameter of the first gear 441, and the axis of the first gear 441 is closer to the first housing 102 than the axis of the second gear 442. As illustrated in FIGS. 33 and 34, the outer diameter of the second gear 442 is larger than the outer diameter of the first gear 441, so that a sliding stroke of the sliding rack 45 is smaller than a sliding stroke of the sliding cover 32, so as to facilitate damping cooperation between the second damping member 72 on the sliding rack 45 and the first damping member 71. The second damping member 72 is arranged on the sliding rack 45. The sliding rack 45 is slidably arranged on an inner side of the first casing 101 and is driven to slide relative to the first casing 101 by the rotation of the second gear 442. The sliding direction of the sliding rack 45 is opposite to the sliding direction of the rack 43. When the sliding cover 32 drives the rack 43 to slide away from the end face of the holder 10, the sliding rack 45 slides toward the end face of the holder 10. When the sliding cover 32 drives the rack 43 to slide toward the end face of the holder 10, the sliding rack 45 slides away from the end face of the holder 10. By arranging the second damping member 72 on the sliding rack 45, the transmission part 40 can effectively acquire the damping force to effectively hinder the movement of the transmission part 40, so that the prong 20 can be effectively locked when the prong 20 is flipped to the extending-out state or the retracted state.

Specifically, referring to FIG. 33 and FIG. 34, the first damping member 71 is provided with a first locking boss 717 and a second locking boss 718 that are fixed to the inner side of the first casing 101, where the second locking boss 718 is opposite to the first locking boss 717. The first locking boss 717 defines a first slot, and the second locking boss 718 defines a second slot. A direction in which the first locking boss 717 is opposite to the second locking boss 718 is parallel to the sliding direction of the sliding cover 32. The first locking boss 717 is adjacent to the first end surface 13 of the holder 10, and the second locking boss 718 is adjacent to the second end surface 14 of the holder 10. The second damping member 72 is provided with a first elastic buckle 723 fixed on an end of the sliding rack 45 and a second elastic buckle 724 fixed at the other end of the sliding rack 45. The first elastic buckle 723 and the second elastic buckle 724 can both be made from materials with elastic deformation properties. When the sliding cover 32 drives the prong 20 to flip to extend out from the holder 10, the sliding rack 45 slides to a position adjacent to the first end surface 13, the first elastic buckle 723 is snapped into the first slot, and the second elastic buckle 724 is disengaged from the second groove, so that the sliding rack 45 remains in a position where the sliding rack 45 is locked with the first casing 101, and the prong 20 remains in the state of extending out of the holder 10. When the sliding cover 32 drives the prong 20 to retract to the holder 10, the sliding rack 45 slides to a position adjacent to the second end surface 14, the second elastic buckle 724 is snapped into the second slot, and the first elastic buckle 723 is disengaged from the first slot, so that the sliding rack 45 remains in a position where the sliding rack 45 is locked with the first casing 101, and the prong 20 remains in the state of retracting to the holder 10.

It can be understood that during snapping the first elastic buckle 723 into the first slot, the first elastic buckle 723 first contacts the first locking boss 717 and gradually deforms, and finally returns to a natural stretched state after being snapped into the first slot, so that when the sliding cover 32 drives the prong 20 to flip relative to the holder 10 to extend out from the holder 10, there is a sense of stagnation first, and finally the sliding cover 32 slides to and stabilizes at a position where the sliding cover 32 is locked at the end of the sliding cover 32. Similarly, during snapping the second elastic buckle 724 into the second slot, the second elastic buckle 724 first contacts the second locking boss 718 and gradually deforms, and finally returns to a natural stretched state after being snapped into the second slot, so that when the sliding cover 32 drives the prong 20 to flip relative to the holder 10 to retract to the holder 10, there is a sense of stagnation first, and finally the sliding cover 32 slides to and stabilizes at the position where the sliding cover 32 is locked at the end of the sliding cover 32.

Figure 35:
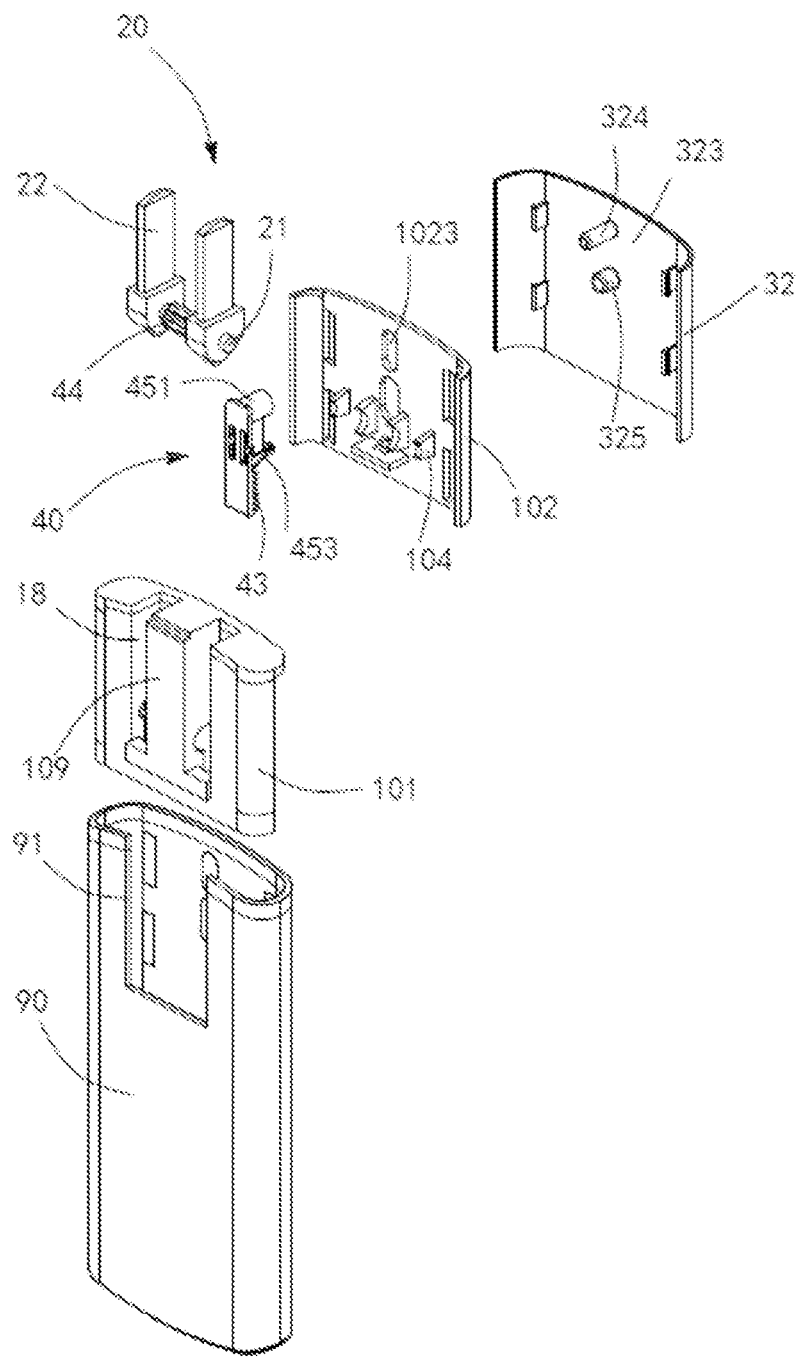
FIG. 35 is an exploded schematic view of a power adapter provided in embodiments of the present disclosure.
Figure 36:
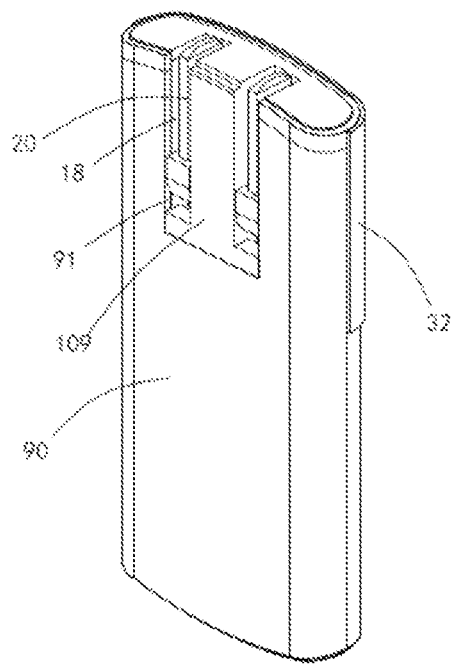
FIG. 36 is a perspective schematic view of the power adapter illustrated in FIG. 35.
Figure 37:
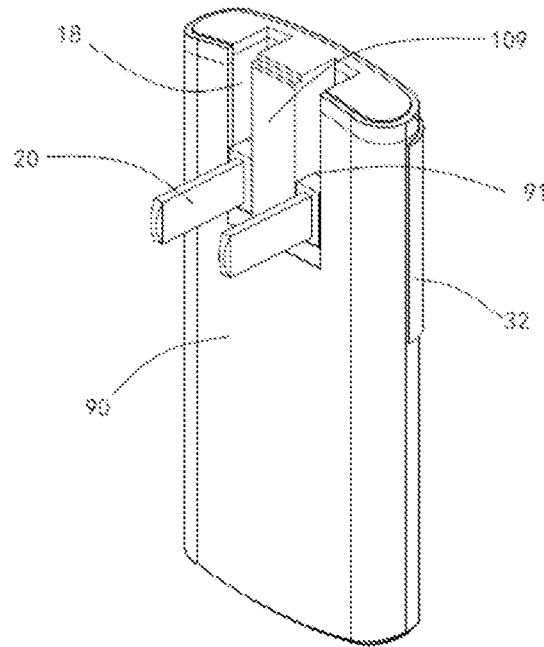
FIG. 37 is another perspective schematic view of the power adapter illustrated in FIG. 35.

Referring to FIGS. 35, 36, and 37, the present disclosure provides an embodiment, which is substantially the same as the embodiment illustrated in FIGS. 23-28, except that the transmission part 40 is provided with the rack 43 fixedly connected to the sliding cover 32 and slidably arranged on the first casing 101, and a gear 44 fixed to and coaxially arranged with the rotating shaft 21, where the gear 44 is meshed with the rack 43.

Specifically, the connecting portion 323 of the sliding cover 32 is provided with a first connecting shaft 324 and a second connecting shaft 325 parallel to the first connecting shaft 324. The first connecting shaft 324 and the second connecting shaft 325 penetrate the housing 90. The first connecting shaft 324 and the second connecting shaft 325 are disposed opposite to each other in the sliding direction of the sliding cover 32. The second casing 102 defines two sliding guide through holes 1023. The first connecting shaft 324 passes through and slides in one sliding guide through hole 1023, and the second connecting shaft 325 passes through and slides in the other sliding guide through holes 1023. The rack 43 is in contact with and slides on the inner side of the first casing 101. The rack 43 is provided with a connecting boss 451 protruding toward the second casing 102. The connecting boss 451 defines a first mating hole and is provided with an insertion post 453 at an end of the connecting boss 451, where the first mating hole is opposite to the insertion post 453. The second connecting shaft 325 defines a second mating hole. The first connecting shaft 324 is inserted into the first mating hole, and the insertion post 453 is inserted into the second mating hole, so that the sliding cover 32 is fixed with the rack 43 via hole-shaft cooperation. The rack 43 is provided with multiple transmission teeth arranged at one end of the connecting boss 451, so that the transmission teeth of the rack 43 are meshed with transmission teeth of the gear 44.

Figure 38:
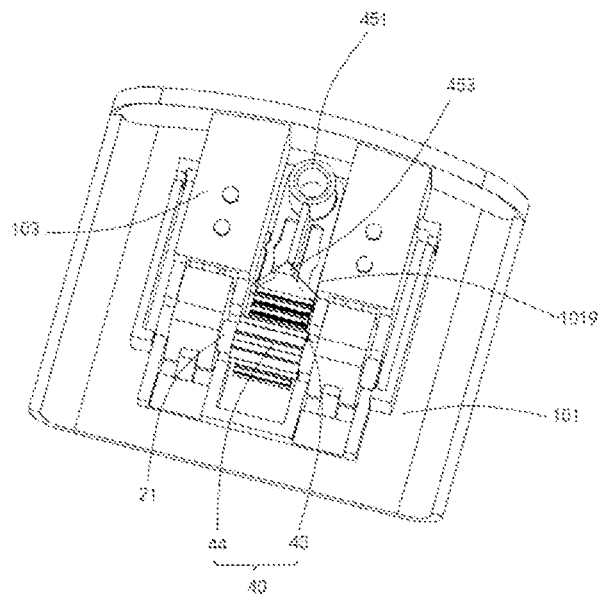
FIG. 38 is a partial perspective schematic view of the power adapter illustrated in FIG. 35.

Optionally, referring to FIG. 35 and FIG. 38, the first casing 101 defines a rack sliding-slot 1019 on an inner side of the first casing 101, where the rack sliding-slot 1019 guides sliding of the rack 43. Both opposite inner sidewalls of the rack 43 guide sliding of the rack 43. The rack sliding-slot 1019 defines a first positioning groove and a second positioning groove on an inner sidewall of the rack sliding-slot 1019, where the first positioning groove is opposite to the second positioning groove. The rack 43 is provided with a positioning protrusion on an outer sidewall of the rack 43. The positioning protrusion has elastic deformation properties. When the positioning protrusion slides to a position where the positioning protrusion 431 fits the first positioning groove, the prong 20 is flipped to retract to the housing 90. When the positioning protrusion 431 slides to a position where the positioning protrusion 431 fits the second positioning groove, the prong 20 is flipped to extend out from the housing 90. When the positioning protrusion 431 abuts against the inner sidewall of the rack sliding-slot 1019, there is a damping force when the rack 43 slides in the rack sliding-slot 1019, so that there is a feeling of stagnation during sliding of the sliding cover 32.

Figure 39:
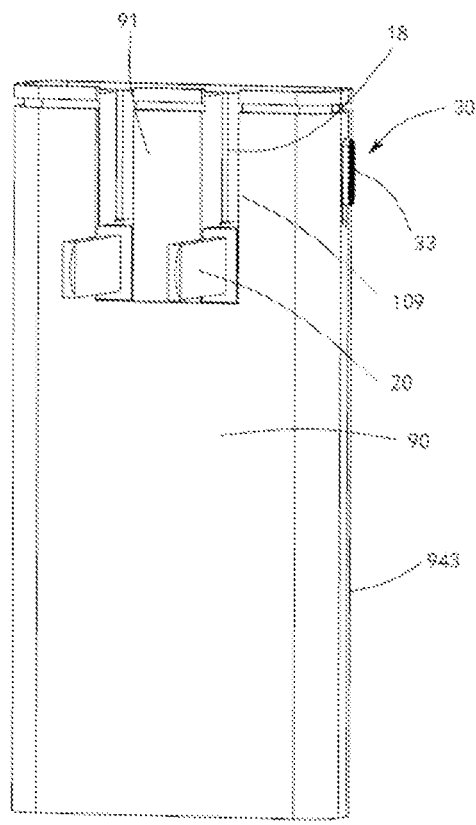
FIG. 39 is a perspective schematic view of a power adapter provided in embodiments of the present disclosure.
Figure 40:
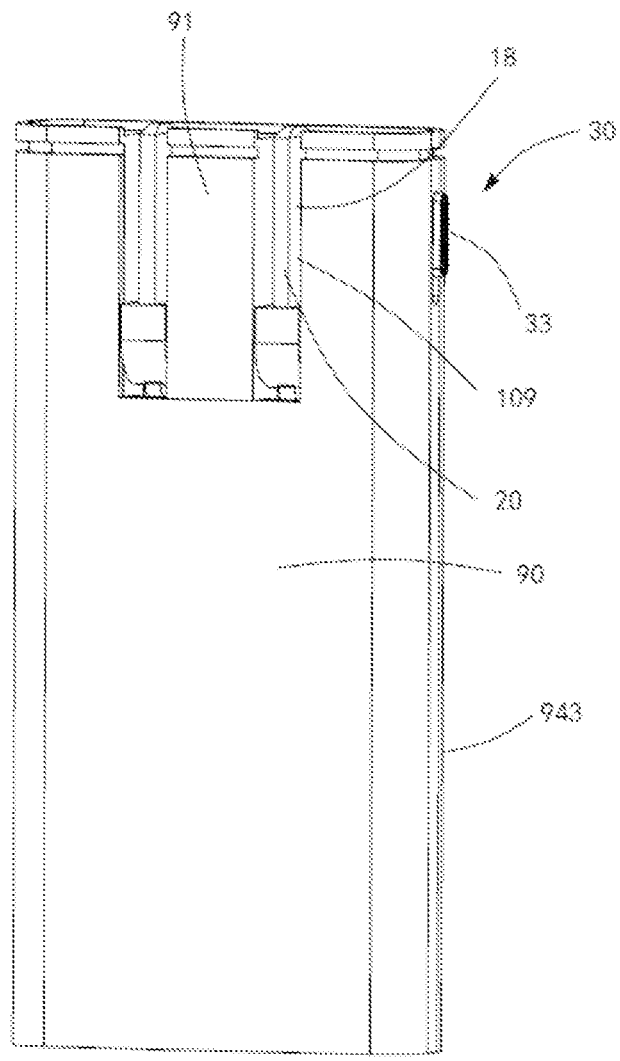
FIG. 40 is a perspective schematic view illustrating another state of the power adapter illustrated in FIG. 39.
Figure 41:
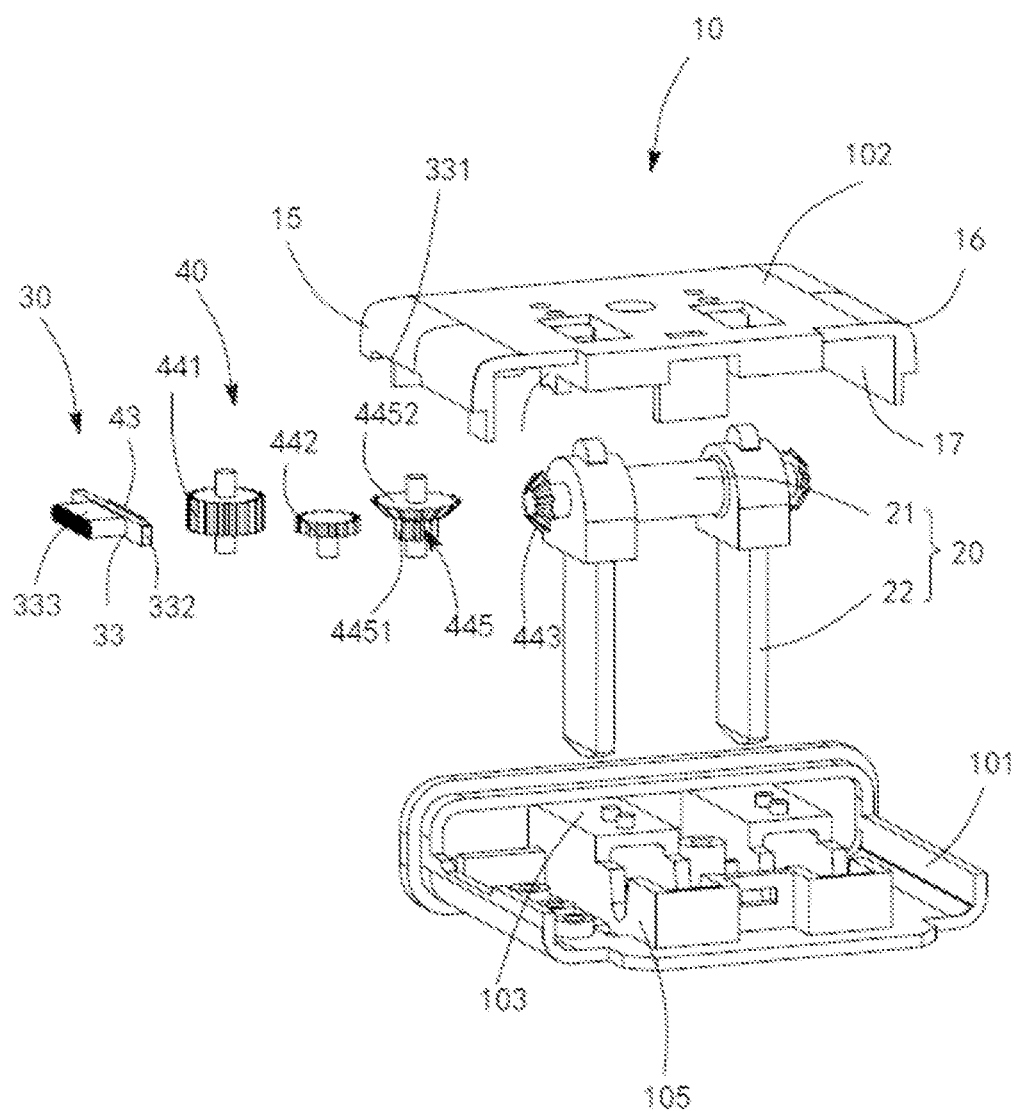
FIG. 41 is a partial exploded schematic view of the power adapter illustrated in FIG. 39.

Referring to FIG. 39, FIG. 40, and FIG. 41, the present disclosure further provides an embodiment, which is substantially the same as the embodiment illustrated in FIGS. 23-28, except that the moving part 30 is provided with a sliding button 33, and the sliding button 33 is disposed on the holder 10 and located outside the receiving groove 18. The sliding button 33 is slidably arranged on the holder 10 along a straight line. The sliding button 33 penetrates the side surface 943 of the housing 90. A sliding direction of the sliding button 33 is parallel to a longitudinal direction of the housing 90. The sliding button 33 is connected to the transmission part 40, and transmits a linear sliding torque to the transmission part 40, and the transmission part 40 converts the linear sliding torque of the sliding button 33 into a rotation torque and transmits the rotation torque to the rotating shaft 21. The sliding button 33 is a manipulation button slidable on the holder 10. By sliding the sliding button 33, the user can control the prong 20 to flip relative to the holder 10 to extend out from or retract to the holder 10.

Optionally, the sliding button 33 is slidably disposed on the first side surface 15 or the second side surface 16 of the holder 10.

Optionally, a portion of the sliding button 33 extends out from the holder 10, so that the portion of the sliding button 33 that extends out from the holder 10 can receive a sliding pushing-pulling force.

Specifically, the first casing 101 defines a first strip-shaped groove on an edge of the first casing 101, and the second casing 102 defines a second strip-shaped groove on an edge of the second casing 102. The first strip-shaped groove and the second strip-shaped groove cooperatively form a sliding guide slot 331 for the sliding button 33. The sliding guide slot 331 is defined on the first side surface 15 or the second side surface 16, so that the user can slide the sliding button 33 at a side of the power adapter 100 to achieve the effect of convenience, swiftness, and labor saving.

The sliding button 33 includes a sliding base 332 and a sliding button-cap 333 disposed on the sliding base 332. The sliding base 332 is in the shape of a rectangular plate. A longitudinal direction of the sliding base 332 is parallel to the sliding direction of the sliding cover 32. The sliding base 332 is located in the receiving cavity 17. The sliding button-cap 333 is in the shape of a rectangular boss. A longitudinal direction of the sliding button-cap 333 is parallel to the longitudinal direction of the sliding base 332. The sliding button-cap 333 is shorter than the sliding base 332. An end of the sliding button-cap 333 extends beyond the holder 10. When the sliding button-cap 333 slides from one end of the sliding guide slot 331 to the other end of the sliding guide slot 331, the sliding base 332 always covers the sliding guide slot 331 to prevent the dust and impurities from entering into the receiving cavity 17 through the sliding guide slot 331. The sliding base 332 is connected to the transmission part 40 at a side of the sliding base 332 away from the sliding button-cap 333, to transmit the sliding torque of the sliding button 33 to the transmission part 40.

Optionally, the sliding button-cap 333 is provided with multiple serrations undulating in a wavy curve on an end surface of the sliding button-cap 333 away from the sliding base 332. The multiple serrations are arranged in the longitudinal direction of the sliding button-cap 333 to facilitate the user to push the sliding button-cap 333.

Figure 42:
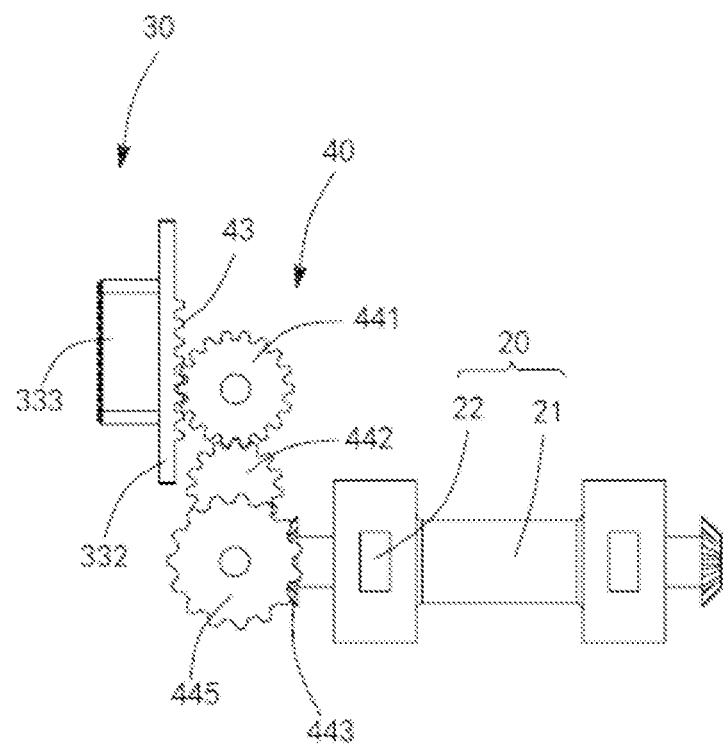
FIG. 42 is a partial schematic view of the power adapter illustrated in FIG. 39.
Figure 43:
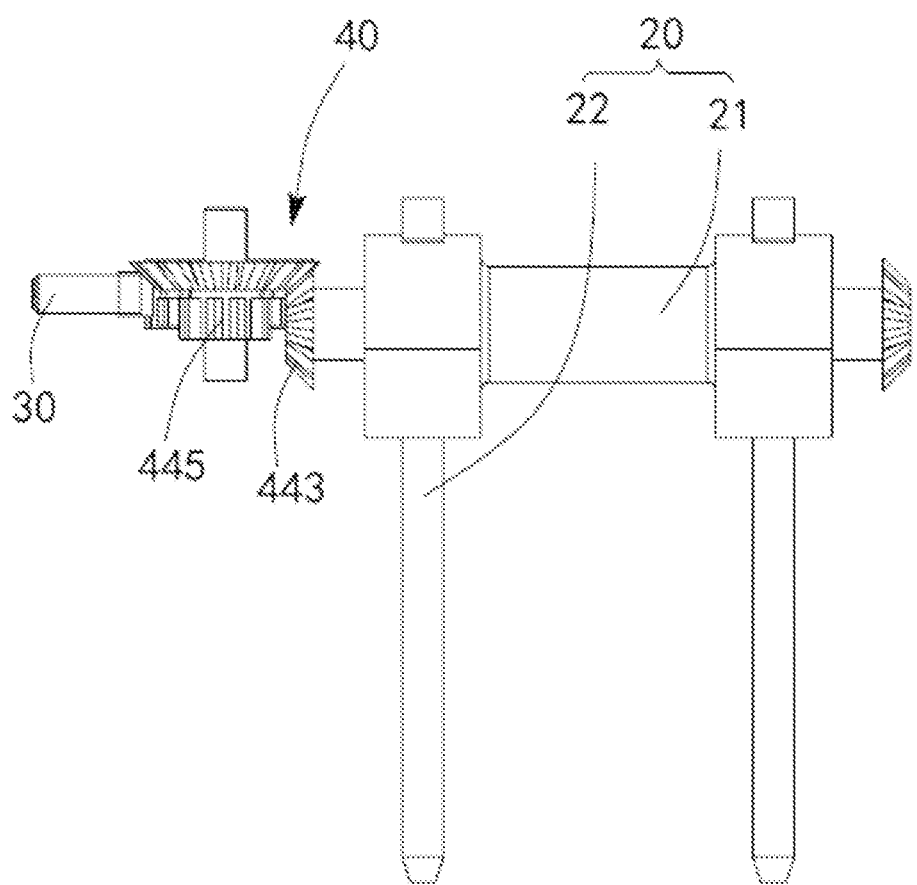
FIG. 43 is another partial schematic view of the power adapter illustrated in FIG. 39.

In the embodiment, referring to FIG. 41, FIG. 42, and FIG. 43, the transmission part 40 is provided with the rack 43 fixed to the sliding base 332, the first gear 441 meshed with the rack 43 and rotationally connected to the holder 10, the second gear 442 meshed with the first gear 441 and rotationally connected to the holder 10, a reversing gear 445 meshed with the second gear 442 and rotationally connected to the holder 10, and a third gear 443 meshed with the reversing gear 445 and fixedly connected to the rotating shaft 21, where the third gear 443 is arranged coaxially with the rotating shaft 21. The first gear 441 is a gear at the head end and meshed with the rack 43, and the third gear 443 is a gear at the tail end and fixedly connected to the rotating shaft 21. The sliding button 33 drives the rack 43 to slide, the rack 43 drives the first gear 441, the second gear 442, the reversing gear 445, and the third gear 443 to rotate, and finally the prong 20 is controlled to extend out from the holder 10 or flip relative to the holder 10. A rotation axial direction of the first gear 441 is parallel to a direction in which the front surface 11 is opposite to the rear surface 12. A rotation axial direction of the second gear 442 is parallel to the rotation axial direction of the first gear 441. A rotation axial direction of the reversing gear 445 is parallel to the rotation axial direction of the second gear 442. The reversing gear 445 is provided with a bottom gear 4451 meshed with the second gear 442 and a tapered gear 4452 coaxial with the bottom gear 4451. The tapered gear 4452 is meshed with the third gear 443.

Optionally, one end of the rotating shaft of the first gear 441 is rotationally connected to the first casing 101, and the other end of the rotating shaft of the first gear 441 is rotationally connected to the second casing 102. The rotating shaft of the second gear 442 is rotationally connected to the first casing 101. One end of the rotating shaft of the reversing gear 445 is rotationally connected to the first casing 101, and the other end of the rotating shaft of the reversing gear 445 is rotationally connected to the second casing 102.

Optionally, the outer diameter of the second gear 442 is smaller than the outer diameter of the first gear 441.

Optionally, the rack 43 and the sliding base 332 are integrally disposed.

Optionally, the moving part 30 is provided with two sliding buttons 33, where one sliding button 33 is slidably disposed on the first side surface 15 of the holder 10, and the other sliding button 33 is slidably disposed on the second side surface 16 of the holder 10. The power adapter 100 includes two transmission parts 40, where one transmission part 40 is connected to one sliding button 33, the other transmission part 40 is connected to the other sliding button 33, and one third gear 443 is fixed to one end of the rotating shaft 21, and the other third gear 443 is fixed to the other end of the rotating shaft 21, so that the two sliding buttons 33 can be used to quickly drive the prong 20 to flip relative to holder 10.

It can be understood that since the outer diameter of the first gear 441 is larger than the outer diameter of the second gear 442, a relatively large transmission ratio can be achieved, so that when the sliding button 33 slides a small distance, the sliding button 33 can drive the prong 20 to flip relative to the holder 10 to extend out from the holder 10.

Certainly, in other embodiments, one gear or multiple sequentially meshed gears may be disposed between the first gear 441 and the third gear 443 to increase the transmission effect of the transmission part 40, thereby meeting more usage requirements.

Figure 44:
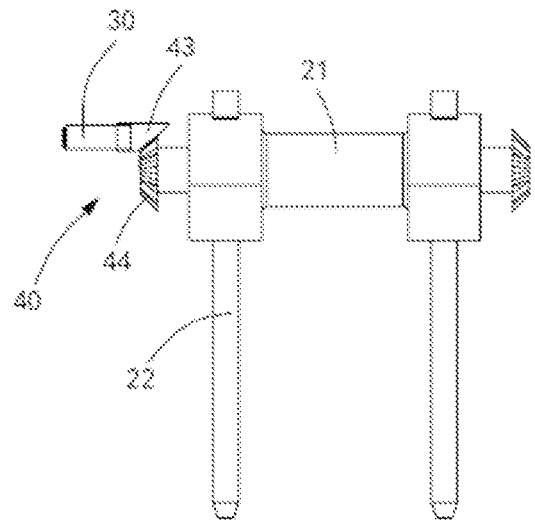
FIG. 44 is a partial schematic view of a power adapter provided in embodiments of the present disclosure.
Figure 45:
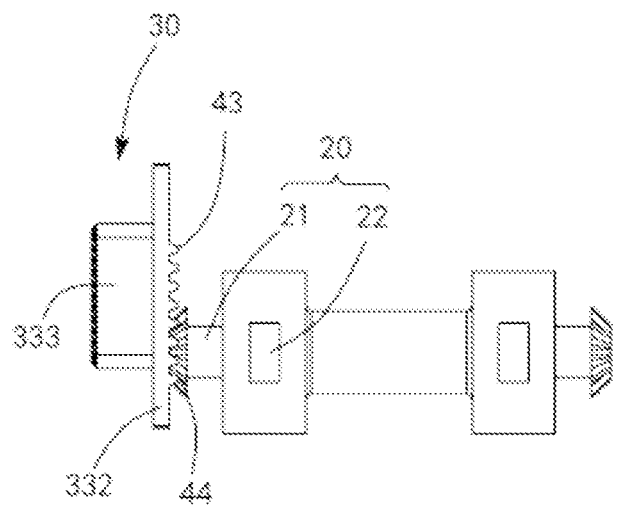
FIG. 45 is a partial schematic view of the power adapter illustrated in FIG. 44.

Referring to FIGS. 44 and 45, in another embodiment similar to the embodiment illustrated in FIGS. 39-43, the rack 43 is meshed with the gear 44 fixed to the rotating shaft 21. The rack 43 is provided with an inclined serrated surface, and multiple first transmission serrations are arranged on the serrated surface. The gear 44 fixed to the rotating shaft 21 is disposed coaxially with the rotating shaft 21, the gear 44 is provided with an inclined tapered serrated surface, and multiple transmission serrations are arranged on the tapered serrated surface. The rack 43 is meshed with the gear 44, thereby realizing a simplified structure of the transmission part 40 between the sliding button 33 and the prong 20, and making the power adapter 100 relatively light, thin, and more compact.

Figure 46:
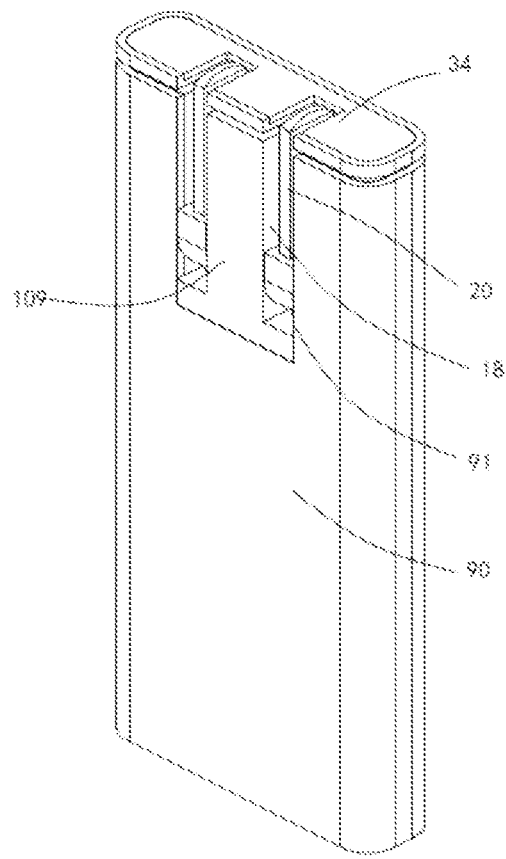
FIG. 46 is a perspective schematic view of a power adapter provided in embodiments of the present disclosure.
Figure 47:
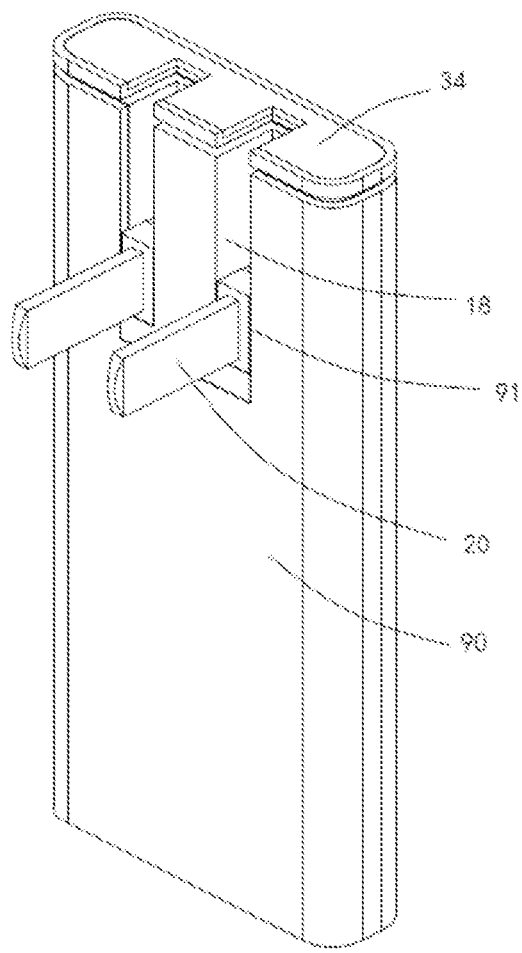
FIG. 47 is a perspective schematic view illustrating another state of the power adapter illustrated in FIG. 46.

Referring to FIGS. 46 and 47, the present disclosure provides an embodiment, which is substantially the same as the embodiment illustrated in FIGS. 23-28, except that the moving part 30 is provided with a pressing cover 34, and the pressing cover 34 is slidably disposed at the end of the holder 10. Upon receiving a pressing force of the user, the pressing cover 34 can slide relative to the housing 90 in a straight line. The pressing cover 34 transmits a linear sliding torque to the transmission part 40, and the transmission part 40 converts the linear sliding torque into a rotation torque and transmits the rotation torque to the rotating shaft 21.

Optionally, the pressing cover 34 is slidably disposed on the first end surface 13 or the second end surface 14. The sliding direction of the pressing cover 34 is parallel to a normal direction of the first end surface 13 or the second end surface 14.

Optionally, the first end surface 13 or the second end surface 14 is fully covered by the pressing cover 34.

Figure 48:
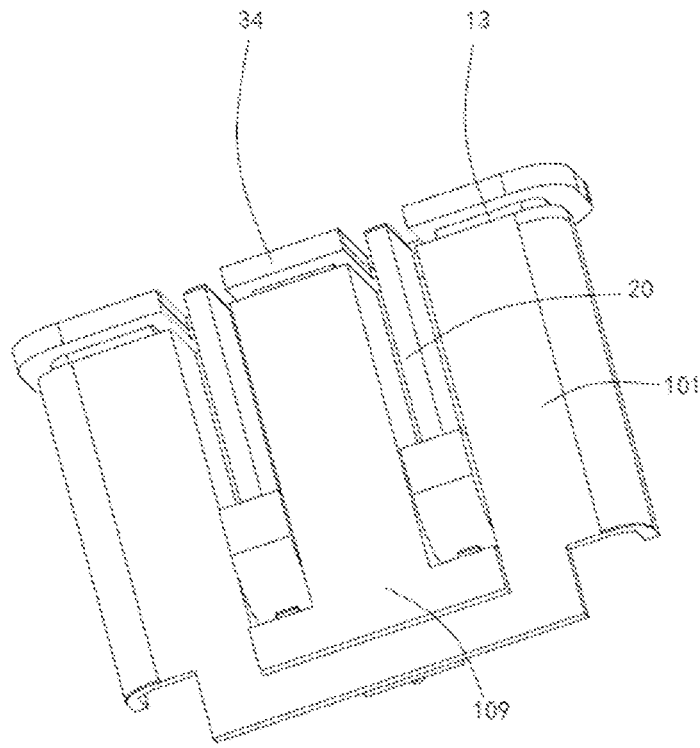
FIG. 48 is a partial perspective schematic view of the power adapter illustrated in FIG. 46.
Figure 49:
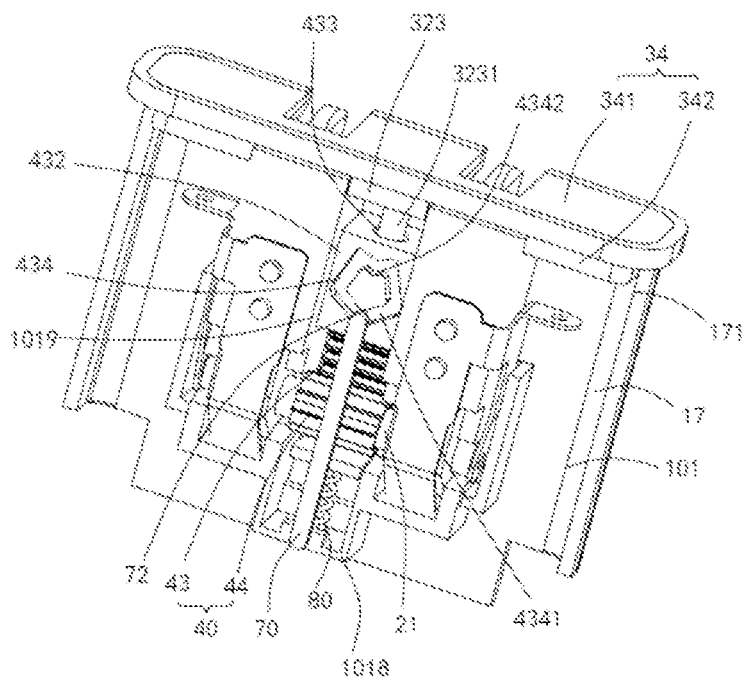
FIG. 49 is a partial perspective schematic view of the power adapter illustrated in FIG. 46.
Figure 50:
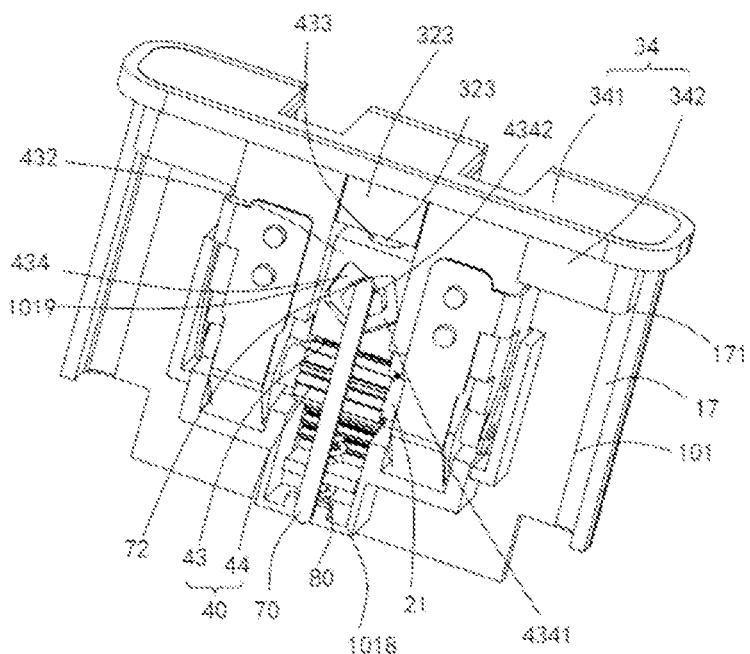
FIG. 50 is a partial perspective schematic view illustrating another state of the power adapter illustrated in FIG. 46.

Specifically, referring to FIGS. 48, 49, and 50, the holder 10 defines a sliding guide hole 171 on the first end surface 13 of the holder 10, where the sliding guide hole 171 extends to the receiving cavity 17. The pressing cover 34 includes a pressing cover-plate 341 and a sliding protrusion 342 disposed on the pressing cover-plate 341. The sliding protrusion 342 slidably fits the sliding guide hole 171. The pressing cover-plate 341 can cover the first end surface 13. The pressing cover-plate 341 is provided with the connecting portion 323 at a side of the pressing cover plate 341 facing the receiving groove 18, where the connecting portion 323 is connected to the transmission part 40. When the pressing cover 34 is pressed to retract toward the holder 10, the pressing cover 34 transmits the sliding torque to the transmission part 40, the transmission part 40 drives the rotating shaft 21 to rotate, so that the prong 20 is driven to flip relative to the housing 90 to extend out from the housing 90. When the pressing cover 34 returns to a state of extending out of the holder 10, the transmission part 40 drives the prong 20 to flip relative to the housing 90 to retract to the housing 90.

Optionally, the connecting portion 323 is provided with an insertion rod 3231. The insertion rod 3231 is inserted into the transmission part 40 to transmit the sliding torque of the pressing cover 34 to the transmission part 40.

In the embodiment, the transmission part 40 includes the rack 43 fixedly connected to the pressing cover 34, and the gear 44 meshed with the rack 43 and fixed to the rotating shaft 21. The gear 44 is arranged coaxially with the rotating shaft 21. The rack 43 is in close contact with and slides on the first casing 101. An end of the rack 43 is fixedly connected to the connecting portion 323. The longitudinal direction of the rack 43 is parallel to the sliding direction of the pressing cover 34. The gear 44 is fixed on the rotating shaft 21 and is located between the two pin posts 22.

Optionally, the rack 43 is provided with a connecting protrusion 432 at an end of the rack 43, and the connecting protrusion 432 defines a connecting insertion-hole 433, where the insertion rod 3231 is inserted into the connecting insertion-hole 433, so that the insertion rod 3231 and the pressing cover 34 are fixedly connected.

Optionally, the first casing 101 is provided with the rack sliding-slot 1019, and the rack sliding-slot 1019 guides sliding of the rack 43.

Further, in the embodiment, the power adapter 100 further includes an elastic restoring member 80. The elastic restoring member 80 is elastically connected between the housing 90 and the rack 43, and the elastic restoring member 80 is used to provide an elastic restoring force for driving the pressing cover 34 to return to the state of extending out of the holder 10.

The first casing 101 is provided with a fixing baffle 1018 at an end of the rack sliding-slot 1019 away from the pressing cover 34. One end of the elastic restoring member 80 is fixed against the fixing baffle 1018, and the other end of the elastic restoring member 80 is fixed against an end of the rack 43 away from the connecting portion 323. When the pressing cover 34 is pressed to retract to the holder 10, the rack 43 compresses the elastic restoring member 80, so that the elastic restoring member 80 elastically deforms. When the pressing force on the pressing cover 34 is removed, the elastic restoring member 80 returns to a natural stretched state, so that the rack 43 pushes the pressing cover 34 to extend out from the housing 90. Certainly, in other embodiments, the elastic restoring member 80 may also be connected between the holder 10 and the pressing cover 34 to provide an elastic restoring force for driving the pressing cover 34 to extend out from the holder 10.

Further, in the embodiment, the power adapter 100 further includes a limiting rod 70 connected to the holder 10 and the transmission part 40. The limiting rod 70 is used to position a motion state of the transmission part 40.

Specifically, one end of the limiting rod 70 is rotatably connected to the first casing 101, and the other end of the limiting rod 70 is slidably connected to the connecting protrusion 432 of the rack 43. One end of the limiting rod 70 cooperates with sliding positions of the connecting protrusion 432 for positioning. After the prong 20 extends out from the holder 10, one end of the limiting rod 70 is fixed at a first preset position of the connecting protrusion 432, so that the prong 20 stays in the state of extending out of the holder 10. When the prong 20 retracts to the holder 10, the end of the limiting rod 70 is fixed at a second preset position of the connecting protrusion 432, so that the prong 20 stays in the state of retracting to the holder 10.

In an embodiment, the connecting protrusion 432 defines a curved sliding-slot 434, and the curved sliding-slot 434 has a first clamping end 4341 and a second clamping end 4342 opposite the first clamping end 4341. A sliding slot between the first clamping end 4341 and the second clamping end 4342 extends in a curve. The first clamping end 4341 is opposite to the second clamping end 4342 in the sliding direction of the pressing cover 34. The first clamping end 4341 is farther from the pressing cover 34 than the second clamping end 4342. The limiting rod 70 is provided with a limiting rotating-shaft at one end of the limiting rod 70 and is provided with a limiting slider 72 at the other end of the limiting rod 70, where the limiting rotating-shaft is rotationally connected to the first casing 101. The limiting slider 72 and the limiting rotating-shaft extend parallel to each other. The limiting slider 72 slidably fits the curved sliding groove 434. When the limiting slider 72 slides to the first clamping end 4341, the force on the pressing cover 34 is removed, the rack 43 is subjected to the elastic force of the elastic restoring member 80 and the limiting force of the limiting slider 72, so that the rack 43 is kept in a stationary state in which the rack 43 is away from the fixing baffle 1018, that is, the pressing cover 34 is kept in a stationary state in which the pressing cover 34 extends out from the holder 10. When the limiting slider 72 slides to the second clamping end 4342, the force on the pressing cover 34 is removed, the rack 43 is subjected to the elastic force of the elastic restoring member 80 and the limiting force of the limiting slider 72, so that the rack 43 is kept in a stationary state in which the rack 43 is close to the fixing baffle 1018, that is, the pressing cover 34 is kept in a stationary state in which the pressing cover 34 retracts to the holder 10.

Optionally, both the first clamping end 4341 and the second clamping end 4342 are V-shaped grooves, so that when the limiting slider 72 slides to the first clamping end 4341 or the second clamping end 4342, sliding of the rack 43 can be limited by the limiting slider 72.

Figure 51:
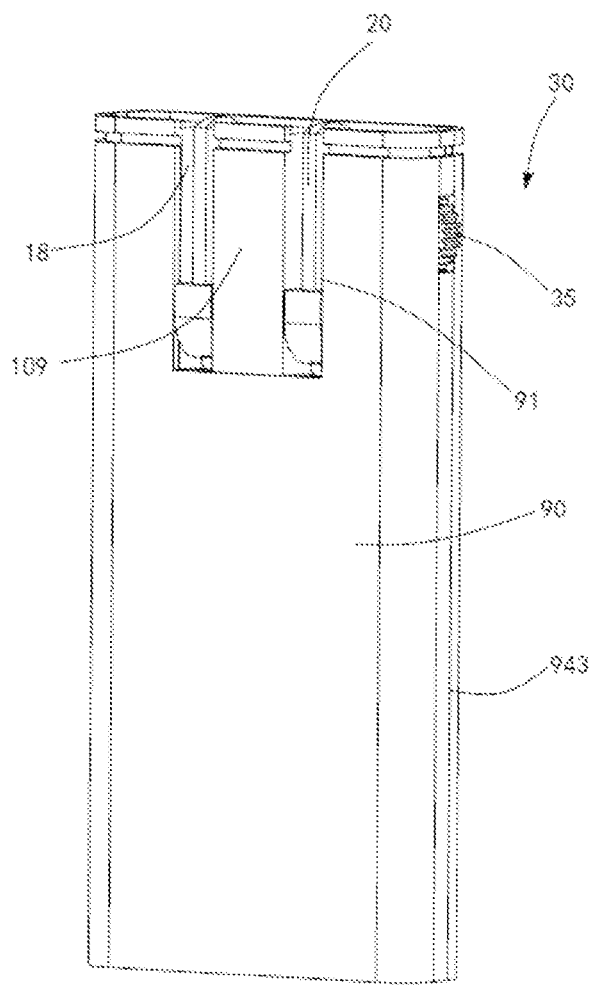
FIG. 51 is a perspective schematic view of a power adapter provided in embodiments of the present disclosure.
Figure 52:
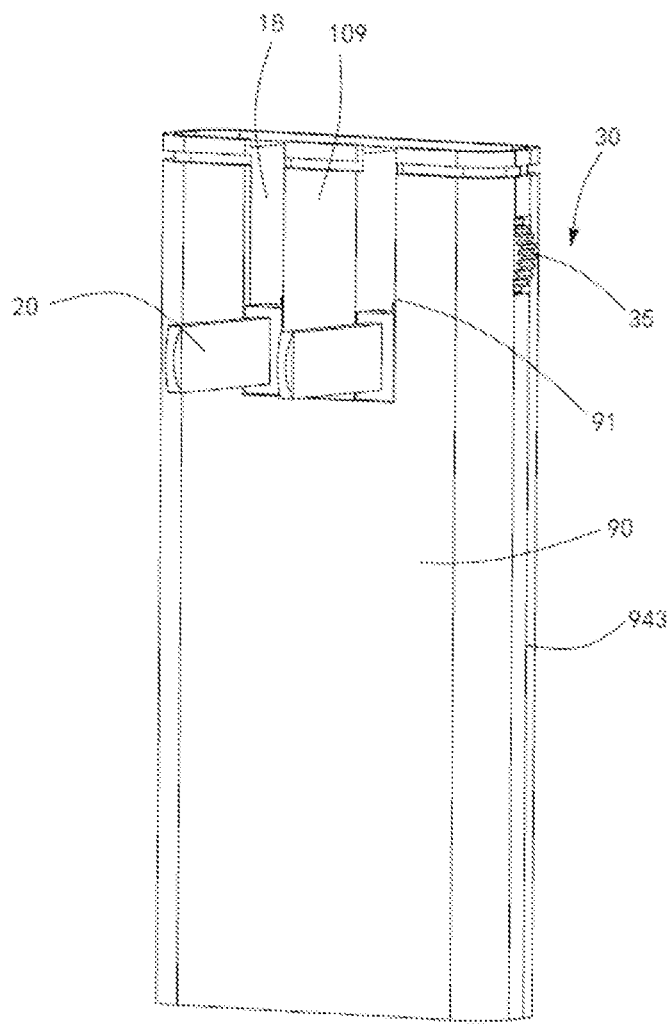
FIG. 52 is a perspective schematic view illustrating another state of the power adapter illustrated in FIG. 51.
Figure 53:
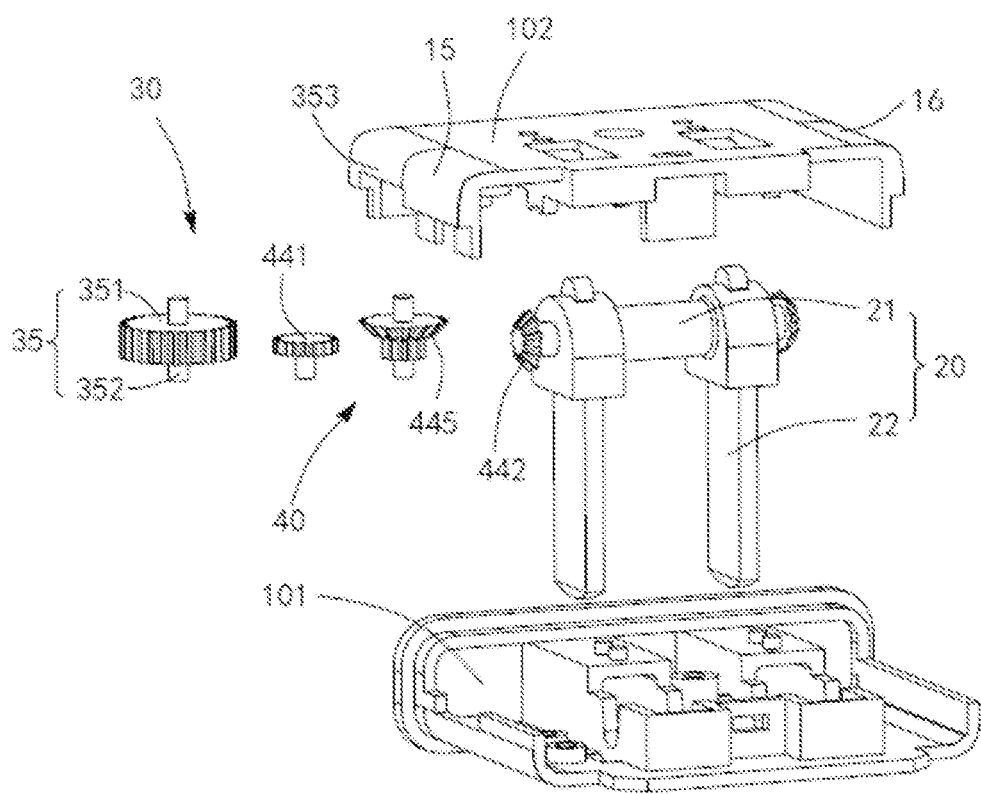
FIG. 53 is a partial exploded schematic view of the power adapter illustrated in FIG. 51.

Referring to FIG. 51, FIG. 52, and FIG. 53, the present disclosure further provides an embodiment, which is different from the embodiment illustrated in FIGS. 1-7 and 9-10 in that the moving part 30 is rotationally arranged on the holder 10, and the transmission part 40 transmits the rotation torque of the moving part 30 to the prong 20, so that the prong 20 can be flipped relative to the holder 10.

In the embodiment, the moving part 30 is partially exposed to the outside of the holder 10 and the housing 90, so that the user can manually turn the moving part 30 to make the moving part 30 rotate relative to the holder 10, and by means of the transmission part 40, the rotation of the moving part 30 drives the prong 20 to flip relative to the holder 10 to extend out from or retract to the holder 10. The moving part 30 is located outside the receiving groove 18 to prevent the moving part 30 from interfering with rotation of the prong 20. The rotation axial direction of the moving part 30 may be parallel to the axial direction of the rotating shaft 21, or may be perpendicular to the axial direction of the rotating shaft 21, or may be inclined relative to the axial direction of the rotating shaft 21. A rotation amplitude of the moving part 30 may be less than a rotation amplitude of the prong 20, or may be greater than the rotation amplitude of the prong 20, or may be equal to the rotation amplitude of the prong 20. A rotation rate of the moving part 30 may be less than the rotation rate of the prong 20 or greater than a rotation rate of the prong 20, or may be equal to the rotation rate of the prong 20.

Figure 54:
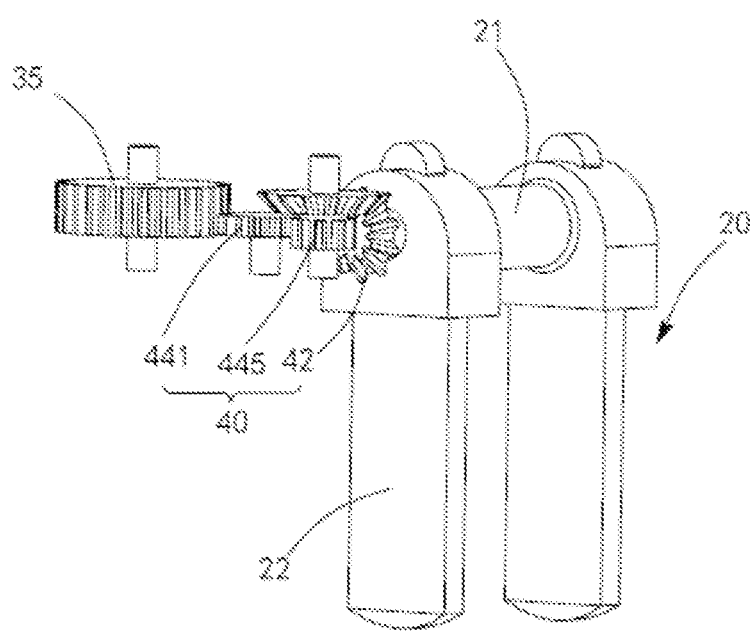
FIG. 54 is a partial perspective schematic view of the power adapter illustrated in FIG. 51.

In an embodiment, referring to FIG. 53 and FIG. 54, the moving part 30 is provided with a knob 35, the knob 35 is rotationally arranged on one side of the holder 10 adjacent to the receiving groove 18, and the knob 35 is partially exposed to the outside of the holder 10. The knob 35 penetrates the side surface 943 of the housing 90, and a rotation plane of the knob 35 is parallel to the longitudinal direction of the housing 90, so that the user can touch and rotate the knob 35 at one side of the housing 90. The knob 35 includes a wheel 351 and a rotating shaft 352 fixed with the wheel 351. The wheel 351 is partially exposed to the outside of the holder 10 and the housing 90 to receive a turning force. The wheel 351 is in the shape of a circular plate. The rotating shaft 352 is rotationally connected to the holder 10, so that the wheel 351 can stably rotate relative to the holder 10. The transmission part 40 may be connected to the wheel 351 or the rotating shaft 352 to receive a rotation torque of the knob 35 and transmit the rotation torque to the rotating shaft 21. The knob 35 is a control button on the holder 10, and the knob 35 can be rotated. By rotating the knob 35 by the user, the prong 20 can be controlled to flip relative to the holder 10 to extend out from or retract to the holder 10.

Optionally, the knob 35 is disposed on the first side surface 15 or the second side surface 16 of the holder 10.

Specifically, the first casing 101 is provided with a first strip-shaped groove on the edge of the first casing 101, and the second casing 102 is provided with a second strip-shaped groove on the edge of the second casing 102. The first strip-shaped groove and the second strip-shaped groove cooperatively form a rotating slot 353 for the wheel 351. The rotating slot 353 is defined on the first side surface 15 or the second side surface 16, so that the user can rotate the knob 35 at one side of the power adapter 100 to achieve the effect of convenience, swiftness, and labor saving.

Two larger surfaces of the wheel 351 are perpendicular to the rotating shaft 352. The axial direction of the rotating shaft 352 is parallel to the thickness direction of the holder 10, so that a thickness direction of the wheel 351 is parallel to the thickness direction of the holder 10, and thus the user can touch and slide along one side of the holder 10 to trigger the wheel 351 to rotate.

Optionally, a peripheral side of the wheel 351 is provided with multiple serrations undulating in a wavy curve. The multiple serrations are equally spaced in the circumferential direction of the wheel 351 to facilitate the user to rotate the knob 35. The wheel 351 is provided with the multiple serrations, so that the wheel 351 can form a gear, thereby facilitating transmission of the rotation torque of the wheel 351 to the transmission part 40.

In the embodiment, the transmission part 40 is provided with the first gear 441 meshed with the wheel 351 and rotationally connected to the holder 10, the reversing gear 445 meshed with the first gear 441 and rotationally connected to the holder 10, and the second gear 442 meshed with the reversing gear 445 and fixedly connected to the rotating shaft 21. The second gear 442 is coaxially arranged with the rotating shaft 21. The first gear 441 is the gear at the head end and is connected with the knob 35, and the second gear 442 is the gear at the tail end and is fixedly connected to the rotating shaft 21. The wheel 351 drives the first gear 441 to rotate, the first gear 441 drives the reversing gear 445 and the second gear 442 to rotate, and finally the prong 20 is controlled to extend out from the holder 10 or flip relative to the holder 10. The rotation axial direction of the first gear 441 is parallel to the direction in which the front surface 11 is opposite to the rear surface 12. The rotation axial direction of the reversing gear 445 is parallel to the rotation axial direction of the first gear 441. The reversing gear 445 is provided with the bottom gear 4451 meshed with the first gear 441 and the tapered gear 4452 coaxial with the bottom gear 4451. The tapered gear 4452 is meshed with the second gear 442.

Optionally, one end of the first gear 441 is rotationally connected to the first casing 101, and the other end of the first gear 441 is rotationally connected to the second casing 102. One end of the reversing gear 445 is rotationally connected to the first casing 101, and the other end of the reversing gear 445 is rotationally connected to the second casing 102.

Optionally, the outer diameter of the first gear 441 is less than an outer diameter of the wheel 351.

Optionally, the moving part 30 is provided with two knobs 35, where one knob 35 is rotationally arranged on the first side surface 15 of the holder 10, and the other knob 35 is rotationally arranged on the second side surface 16 of the holder 10. The power adapter 100 includes two transmission parts 40, where one transmission part 40 is connected to one knob 35, the other transmission part 40 is connected to the other knob 35, one second gear 442 is fixed to one end of the rotating shaft 21, and the other second gear 442 is fixed to the other end of the rotating shaft 21, so that the two knobs 35 can be used to quickly control the prong 20 to flip relative to the holder 10.

It can be understood that, since the outer diameter of the wheel 351 is larger than the outer diameter of the first gear 441, a relatively large transmission ratio can be achieved, so that when the knob 35 rotates a small amount, the prong 20 can be driven to flip relative to the holder 10 to extend out from the holder 10.

Certainly, in other embodiments, the third gear 443 or multiple sequentially meshed gears can also be disposed between the first gear 441 and the reversing gear 445, so as to increase the transmission effect of the transmission part 40 and meet more usage requirements.

Figure 55:
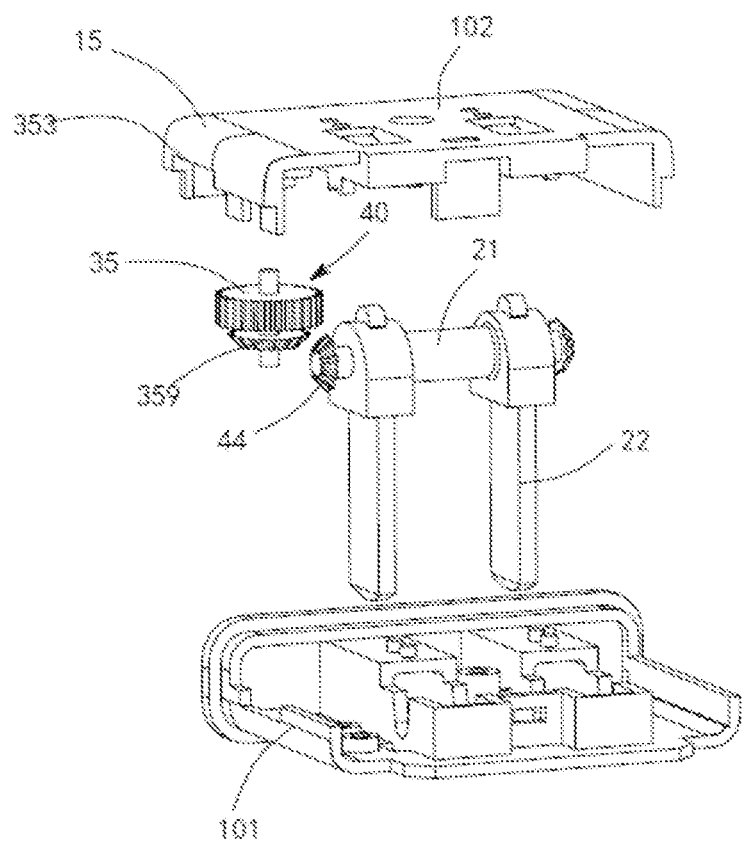
FIG. 55 is a partial exploded schematic view of a power adapter provided in embodiments of the present disclosure.

Referring to FIG. 55, in another embodiment similar to the embodiment illustrated in FIGS. 51-54, the knob 35 is provided with a knob gear 359, and the knob gear 359 is meshed with the gear 44 fixed to the rotating shaft 21. The knob gear 359 has an inclined serrated surface, and multiple first transmission serrations are arranged on the serrated surface. The gear 44 fixed to the rotating shaft 21 is disposed coaxially with the rotating shaft 21, and the gear 44 has an inclined tapered serrated surface. Multiple second transmission serrations are arranged on the tapered serrated surface. The multiple first transmission serrations are meshed with the multiple second transmission serrations to realize meshing between the knob gear 359 and the gear 44, thereby simplifying the structure of the transmission part 40 between the knob 35 and the prong 20, making the power adapter 100 relatively lighter, thinner, and more compact.

Figure 56:
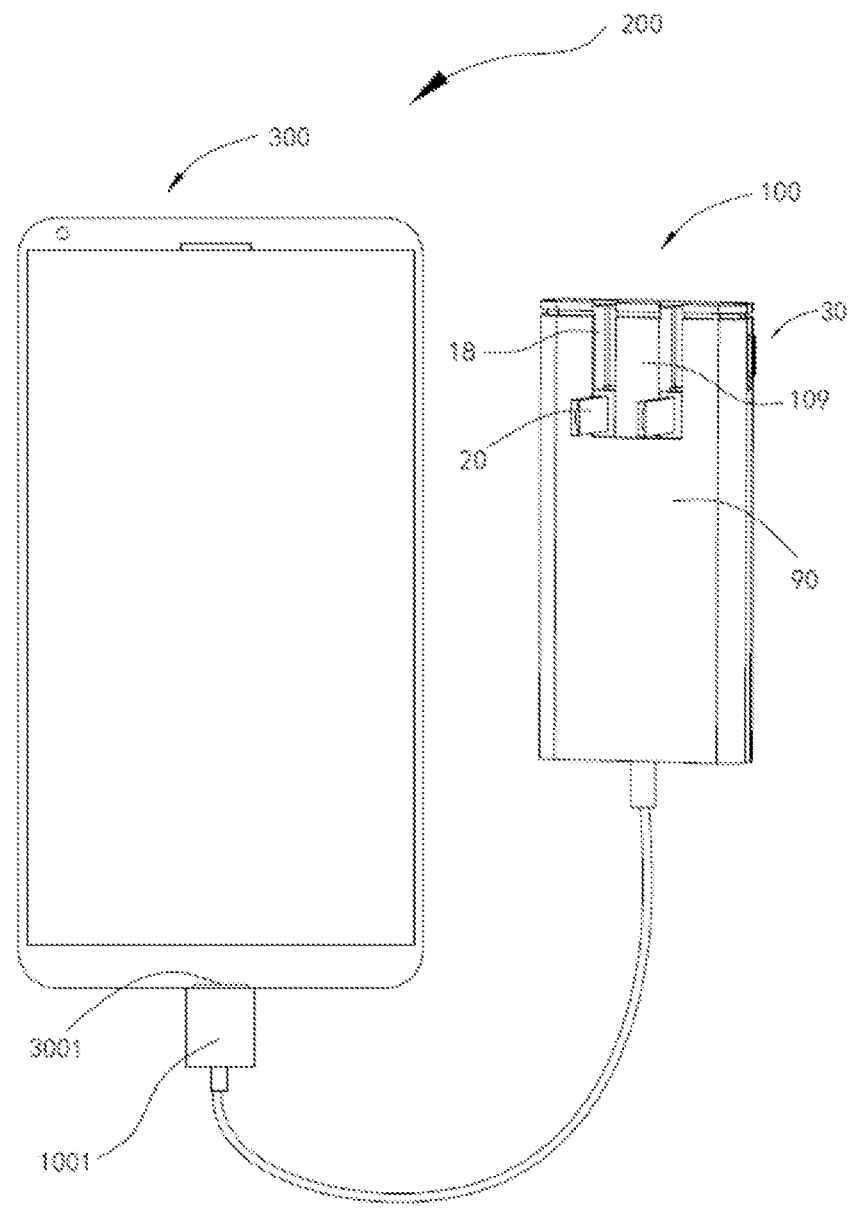
FIG. 56 is a schematic view of an electronic device assembly provided in the present disclosure.

Referring to FIG. 56, the present disclosure further provides an electronic device assembly 200. The electronic device assembly 200 includes a power adapter 100 and an electronic device 300. The power adapter 100 is electrically coupled with the electronic device 300, and the power adapter 100 is used to charge the electronic device 300 when the prong 20 is plugged into the power socket. It can be understood that the electronic device 300 may be a mobile phone, a smart watch, a notebook computer, a tablet computer, a smart earphone, or other devices. The electronic device 300 is provided with a power port 3001. The power adapter 100 is provided with a charging end 1001 configured to be electrically coupled with the power port 3001, and the charging end 1001 can be coupled with the power port 3001 in a wired or wireless manner for charging.

Optionally, the electronic device 300 is a mobile phone, and the power port 3001 is disposed at the bottom of the electronic device 300. The charging end 1001 can be plugged into the power port 3001 and electrically coupled with a battery in the electronic device 300 via a cable. The power port 3001 is a universal serial bus (USB) interface, and the charging end 1001 is a USB plug. The charging end 1001 is disposed at one end of the cable 1002. One end of the cable 1002 away from the charging end 1001 extends into the holder 10 and is electrically coupled with the prong elastic sheet 60. When the prong 20 is flipped relative to the holder 10 to extend out from the holder 10, and the prong 20 is plugged into the power socket, the power adapter 100 can acquire and process current, and transmit processed current to the electronic device 300 via the charging end 1001, so as to charge the electronic device 300.

The above are preferred embodiments of the present disclosure. It should be pointed out that for those of ordinary skill in the art, several improvements and modifications can be made without departing from the principle of the present disclosure, and these improvements and modifications are also regarded as the scope of protection of the present disclosure.

What is claimed is:

1. A power adapter, comprising:
a housing defining an inner cavity and a through groove communicating with the inner cavity;
a holder received in the inner cavity and provided with a boss fitting the through groove, wherein the boss defines a receiving groove at a side away from the inner cavity;
a moving part movably connected to the holder and partially exposed to an outside of the housing; and
a prong rotationally connected to the boss, wherein the prong is movable relative to the holder along with the moving part, so that the prong is flippable to extend out from or retract to the receiving groove;
wherein the power adapter further comprises a transmission part received in the inner cavity, wherein the transmission part is connected to the moving part and the prong to convert a motion torque of the moving part into a rotation torque and transmit the rotation torque to the prong, so that the prong is flippable relative to the housing.

2. The power adapter of claim 1, wherein
the receiving groove is implemented as two receiving grooves; and
the prong is provided with a rotating shaft and two pin posts fixed to the rotating shaft, wherein the rotating shaft is rotationally connected to the holder and passes through the two receiving grooves, and the two pin posts are flippable to extend out from or retract to the two receiving grooves, respectively.

3. The power adapter of claim 2, wherein
the holder comprises a first casing adjacent to the through groove and a second casing covered with the first casing, and the boss is disposed at a side of the first casing away from the second casing, wherein
the first casing is provided with a bearing boss at a side of the first casing facing the second casing, wherein the bearing boss corresponds to the receiving groove;
the second casing is provided with a bearing protrusion at a side of the second casing facing the first casing, wherein the bearing protrusion fits the bearing boss; and
the rotating shaft is rotationally connected between the bearing boss and the bearing protrusion.

4. The power adapter of claim 3, further comprising two prong elastic sheets, wherein each of the prong elastic sheets has a first end correspondingly sandwiched between the bearing boss and the second casing, and a second end elastically abutting against an end of the pin post during flipping of the pin post relative to the holder.

5. The power adapter of claim 4, wherein
the first casing further defines an elastic-sheet slot at a side of the first casing which is provided with the bearing boss;
the prong elastic sheet is provided with a conductive leg snapped into the elastic-sheet slot; and
an end of the rotating shaft extends into the elastic-sheet slot and abuts against the conductive leg, so that the pin post and the conductive leg are kept in a conducting state via the rotating shaft.

6. The power adapter of claim 1, wherein
the housing has two ends that are opposite to each other in a longitudinal direction of the housing and a peripheral portion between the two ends, and the through groove is defined on a position of the peripheral portion adjacent to one of the two ends; and
the housing defines an insertion hole at an end of the housing adjacent to the through groove, the insertion hole communicates with the inner cavity and the through groove, the holder is inserted into the inner cavity through the insertion hole, and the boss fits the through groove and is limited by the through groove.

7. The power adapter of claim 1, wherein
the boss has an abutting surface away from the inner cavity, wherein the receiving groove is defined on the abutting surface, and the abutting surface is flush with or exceeds an outer surface of the housing; and
extension of the prong is limited by a sidewall of the receiving groove, and retraction of the prong is limited by a bottom wall of the receiving groove.

8. The power adapter of claim 1, wherein
the moving part is slidably connected to the holder, and the transmission part is configured to convert a linear sliding torque of the moving part into the rotation torque and transmit the rotation torque to the prong.

9. The power adapter of claim 8, wherein
the moving part comprises a sliding cover, wherein the sliding cover covers the housing and is slidably arranged at a side of the housing away from the through groove, and the sliding cover penetrates the housing and is slidably connected to the holder;
the moving part is provided with a sliding button, wherein the sliding button is slidably connected to the holder and is slidably arranged at a side of the housing adjacent to the through groove; or
the moving part is provided with a pressing cover, wherein the pressing cover is slidably connected to the holder, and the pressing cover covers an end of the housing adjacent to the through groove and is pressable.

10. The power adapter of claim 8, wherein the transmission part is provided with a rack fixedly connected to the moving part, and a gear meshed with the rack and rotationally connected to the holder, and the gear is configured to transmit the rotation torque to the prong.

11. The power adapter of claim 8, wherein
the transmission part is provided with a push block and a rocker, wherein
the push block is fixedly connected to the moving part; and
the rocker has an end that rotationally and slidably fits the push block, and an end of the rocker away from the push block is fixedly arranged with a rotating shaft of the prong to drive the prong to rotate.

12. The power adapter of claim 1, wherein
the moving part is rotationally connected to the holder, and the transmission part is configured to transmit a rotation torque of the moving part to the prong, so that the prong is flippable relative to the holder.

13. The power adapter of claim 12, wherein the moving part is provided with a knob, wherein the knob is rotationally connected to the holder, and the knob penetrates the housing and is located at a side of the housing adjacent to the through groove.

14. The power adapter of claim 1, wherein
the power adapter comprises a first damping member disposed in the holder and a second damping member disposed on the prong, the transmission part, or the moving part, wherein the first damping member is configured to provide a damping force for hindering movement of the second damping member, so that flipping of the prong relative to the holder is hindered.

15. The power adapter of claim 1, wherein
the moving part is provided with a button, wherein the button penetrates the housing and is connected to the holder, the button is slidable relative to the holder when the button is pressed, and the prong is flippable to extend out from or retract to the receiving groove along with the button when the button is pressed; and
the power adapter further comprises a driving assembly connected to the button and the prong, wherein the button is configured to release a driving torque of the driving assembly to the prong when the button is in a pressed state, and configured to restrict the driving assembly from releasing the driving torque to the prong when the button is in a non-pressed state.

16. A power adapter comprising:
a holder;
a button arranged on the holder;
a prong flippably connected to the holder; and
a driving assembly connecting the prong and the button; wherein
the button is slidable relative to the holder when the button is pressed, and the button is configured to release a driving torque of the driving assembly to the prong or restrict the driving torque of the driving assembly from being transmitted to the prong;
wherein the driving assembly comprises a limiting member and a driving member, wherein
the limiting member is connected to the prong and the driving member, the limiting member is unlocked from the button and configured to transmit a driving torque of the driving member to the prong when the button is in a pressed state, and the limiting member is locked with the button and configured to restrict the driving torque of the driving member from being transmitted to the prong when the button is in a non-pressed state.

17. The power adapter of claim 16, wherein
the holder defines a button hole, wherein the button hole defines a sliding guide slot on an inner peripheral sidewall of the button hole, and the button is provided with a sliding guide protrusion on an outer peripheral sidewall of the button, wherein the sliding guide protrusion slidably fits the sliding guide slot; and
the limiting member is provided with a limiting protrusion on an outer peripheral sidewall at an end of the limiting member away from a transmission part, and the button defines an insertion hole at an end of the button adjacent to the limiting member, wherein the limiting member is slidably inserted into the insertion hole, the insertion hole is provided with a limiting slot on an inner peripheral sidewall of the insertion hole, and wherein when the button is in the non-pressed state, the limiting protrusion fits the limiting slot to limit rotation of the limiting member.

18. The power adapter of claim 16, wherein the driving member is provided with an elastic member, wherein the elastic member is connected to the button and the limiting member, and wherein the elastic member is configured to store a rotation torque when the button is in the non-pressed state, and configured to release the rotation torque to the limiting member when the button is in the pressed state.

19. A power adapter, comprising:
a housing defining an inner cavity and a through groove communicating with the inner cavity;
a holder received in the inner cavity and provided with a boss fitting the through groove, wherein the boss defines a receiving groove at a side away from the inner cavity;
a moving part movably connected to the holder and partially exposed to an outside of the housing; and
a prong rotationally connected to the boss, wherein the prong is movable relative to the holder along with the moving part, so that the prong is flippable to extend out from or retract to the receiving groove;
wherein the receiving groove is implemented as two receiving grooves;
wherein the prong is provided with a rotating shaft and two pin posts fixed to the rotating shaft, wherein the rotating shaft is rotationally connected to the holder and passes through the two receiving grooves, and the two pin posts are flippable to extend out from or retract to the two receiving grooves, respectively;
wherein the holder comprises a first casing adjacent to the through groove and a second casing covered with the first casing, and the boss is disposed at a side of the first casing away from the second casing, wherein the first casing is provided with a bearing boss at a side of the first casing facing the second casing, wherein the bearing boss corresponds to the receiving groove;

the second casing is provided with a bearing protrusion at a side of the second casing facing the first casing, wherein the bearing protrusion fits the bearing boss; and the rotating shaft is rotationally connected between the bearing boss and the bearing protrusion.

* * * * *